(12) United States Patent
Huang et al.

(10) Patent No.: US 12,148,672 B2
(45) Date of Patent: Nov. 19, 2024

(54) HYBRID FIN STRUCTURE OF SEMICONDUCTOR DEVICE AND METHOD OF FORMING SAME

(71) Applicant: Taiwan Semiconductor Manufacturing Co., Ltd., Hsinchu (TW)

(72) Inventors: Yen-Chun Huang, New Taipei (TW); Shu Ling Liao, Taichung (TW); Fang-Yi Liao, New Taipei (TW); Yu-Chang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 388 days.

(21) Appl. No.: 17/581,611

(22) Filed: Jan. 21, 2022

(65) Prior Publication Data
US 2023/0135509 A1    May 4, 2023

Related U.S. Application Data

(60) Provisional application No. 63/275,529, filed on Nov. 4, 2021.

(51) Int. Cl.
| | | |
|---|---|---|
| *H01L 21/00* | (2006.01) | |
| *H01L 21/3115* | (2006.01) | |
| *H01L 21/8234* | (2006.01) | |
| *H01L 27/088* | (2006.01) | |

(52) U.S. Cl.
CPC ........... *H01L 21/823481* (2013.01); *H01L 21/31155* (2013.01); *H01L 27/0886* (2013.01)

(58) Field of Classification Search
CPC ....... H01L 21/823481; H01L 21/31155; H01L 27/0886
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

FOREIGN PATENT DOCUMENTS

| | | |
|---|---|---|
| TW | 201729242 A | 8/2017 |
| TW | 202025297 A | 7/2020 |

*Primary Examiner* — Richard A Booth
(74) *Attorney, Agent, or Firm* — Slater Matsil, LLP

(57) ABSTRACT

A semiconductor device and a method of forming the same are provided. A device includes a substrate, a first isolation structure over the substrate, a first fin and a second fin over the substrate and extending through the first isolation structure, and a hybrid fin extending into the first isolation structure and interposed between the first fin and the second fin. A top surface of the first fin and a top surface of the second fin are above a top surface of the first isolation structure. A top surface of the hybrid fin is above the top surface of the first isolation structure. The hybrid fin includes an upper region, and a lower region under the upper region. The lower region includes a seam. A topmost portion of the seam is below the top surface of the first fin and the top surface of the second fin.

20 Claims, 71 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,577,036 B1 | 2/2017 | Chang et al. | |
| 9,608,116 B2 | 3/2017 | Ching et al. | |
| 9,647,071 B2 | 5/2017 | Peng et al. | |
| 11,948,840 B2 * | 4/2024 | Chen | H01L 29/1054 |
| 2021/0091075 A1 | 3/2021 | Liao et al. | |
| 2022/0359517 A1 * | 11/2022 | Ho | H01L 29/7851 |
| 2023/0282524 A1 * | 9/2023 | Lin | H01L 27/0924 |

* cited by examiner

HYBRID FIN STRUCTURE OF SEMICONDUCTOR DEVICE AND METHOD OF FORMING SAME

PRIORITY CLAIM AND CROSS-REFERENCE

This application claims the benefit of U.S. Provisional Application No. 63/275,529, filed on Nov. 4, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
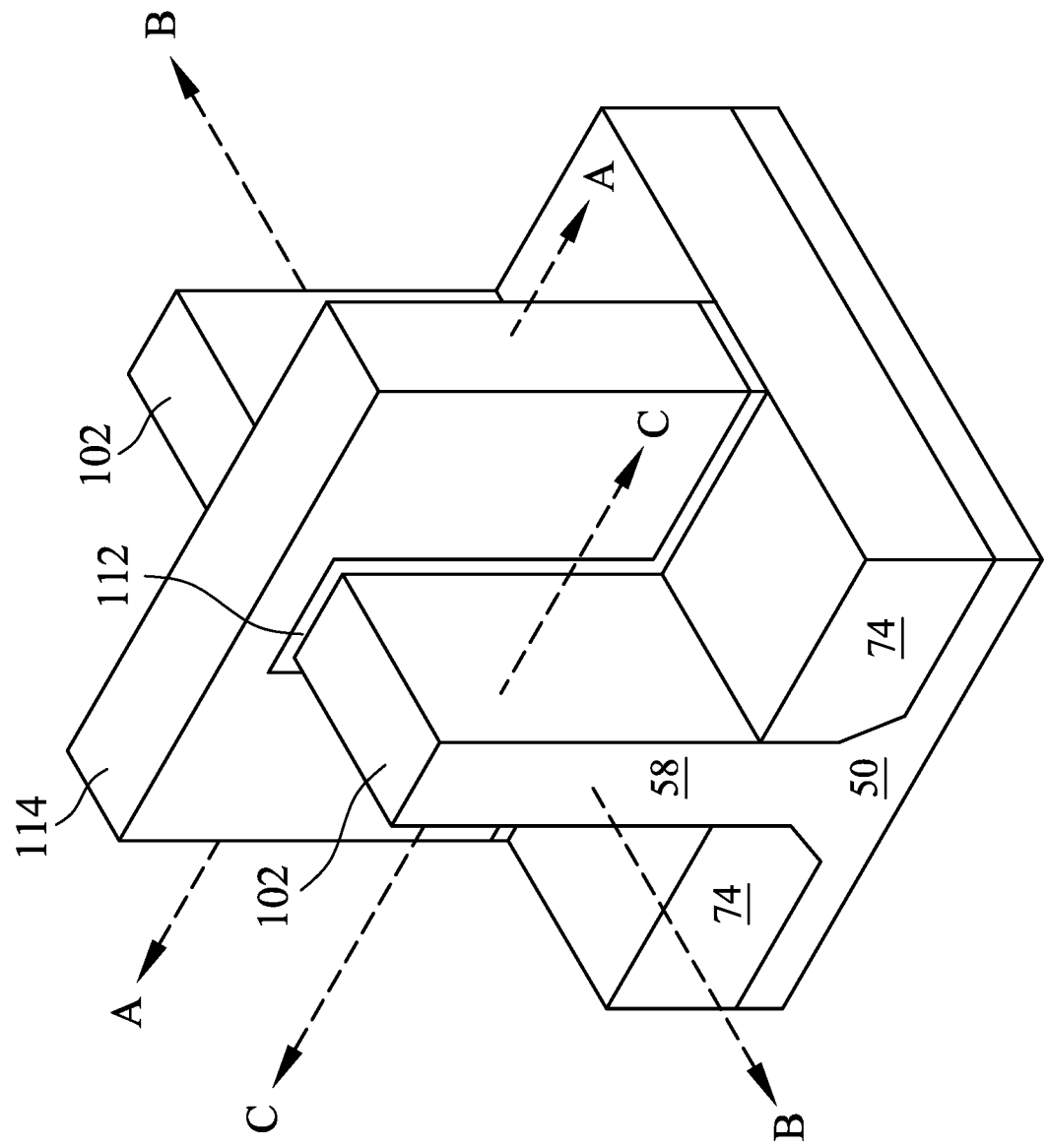
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a hybrid fin structure (also referred to as a dielectric fin structure) of a semiconductor device and a method of forming the same. Various embodiments presented herein are discussed in the context of a fin field-effect transistor (FinFET) device formed using a gate-last process. In other embodiments, a gate-first process may be used. Various embodiments may be applied, however, to dies comprising other types of transistors, such as gate-all-around (GAA) transistors (for example, nanostructure (e.g., nanosheet, nanowire, or the like) field-effect transistors (NSFETs)) in lieu of or in combination with the FinFETs. Various embodiments discussed herein allow for forming hybrid fins having seam-free top regions by performing an implantation process on the top regions of the hybrid fins. By forming hybrid fins having the seam-free top regions, nucleation sites for forming large particles during a sacrificial gate formation are reduced or eliminated, and formation of resulting voids are reduced or eliminated.

FIG. 1 illustrates an example of a FinFET in a three-dimensional view, in accordance with some embodiments. The FinFET comprises a fin 58 on a substrate 50 (e.g., a semiconductor substrate). Isolation regions 74 are disposed in the substrate 50, and the fin 58 protrudes above and from between neighboring STI regions 74. Although the STI regions 74 are described/illustrated as being separate from the substrate 50, as used herein the term "substrate" may be used to refer to just the semiconductor substrate or a semiconductor substrate inclusive of isolation regions. Additionally, although the fin 58 is illustrated as a single, continuous material as the substrate 50, the fin 58 and/or the substrate 50 may comprise a single material or a plurality of materials. In this context, the fin 58 refers to the portion extending between the neighboring STI regions 74.

A gate dielectric layer 112 is along sidewalls and over a top surface of the fin 58, and a gate electrode 114 is over the gate dielectric layer 112. Source/drain regions 102 are disposed in opposite sides of the fin 58 with respect to the gate dielectric layer 112 and the gate electrode 114. FIG. 1 further illustrates reference cross-sections that are used in later figures. Cross-section A-A is along a longitudinal axis of the gate electrode 114 and in a direction, for example, perpendicular to a direction of a current flow between the epitaxial source/drain regions 102 of the FinFET. Cross-section B-B is perpendicular to cross-section A-A and is along a longitudinal axis of the fin 58 and in a direction of, for example, the current flow between the epitaxial source/drain regions 102 of the FinFET. Cross-section C-C is parallel to cross-section A-A and extends through the source/drain region 102 of the FinFET. Subsequent figures refer to these reference cross-sections for clarity.

FIGS. 2-15, 16A-16C, 17A, 17B, 18A-18C, 19A, 19B, 20A, 20B, 21A, 21B, 22A, 22B, 23A-23D, 24A, 24B, 25A, and 25B are top and cross-sectional views of intermediate stages in the manufacturing of a FinFET device in accordance with some embodiments. FIG. 16C illustrates a top view. FIGS. 2-15 and 16A-25A illustrate cross-sectional views along the reference cross-section A-A illustrated in FIG. 1, except for multiple fins. FIGS. 16B-25B, 23C, and 23D illustrate cross-sectional views along the reference cross-section B-B illustrated in FIG. 1, except for multiple gate structures. FIG. 18C illustrates a cross-sectional view along the reference cross-section C-C illustrated in FIG. 1, except for multiple fins and multiple source/drain regions.

Figure 2:
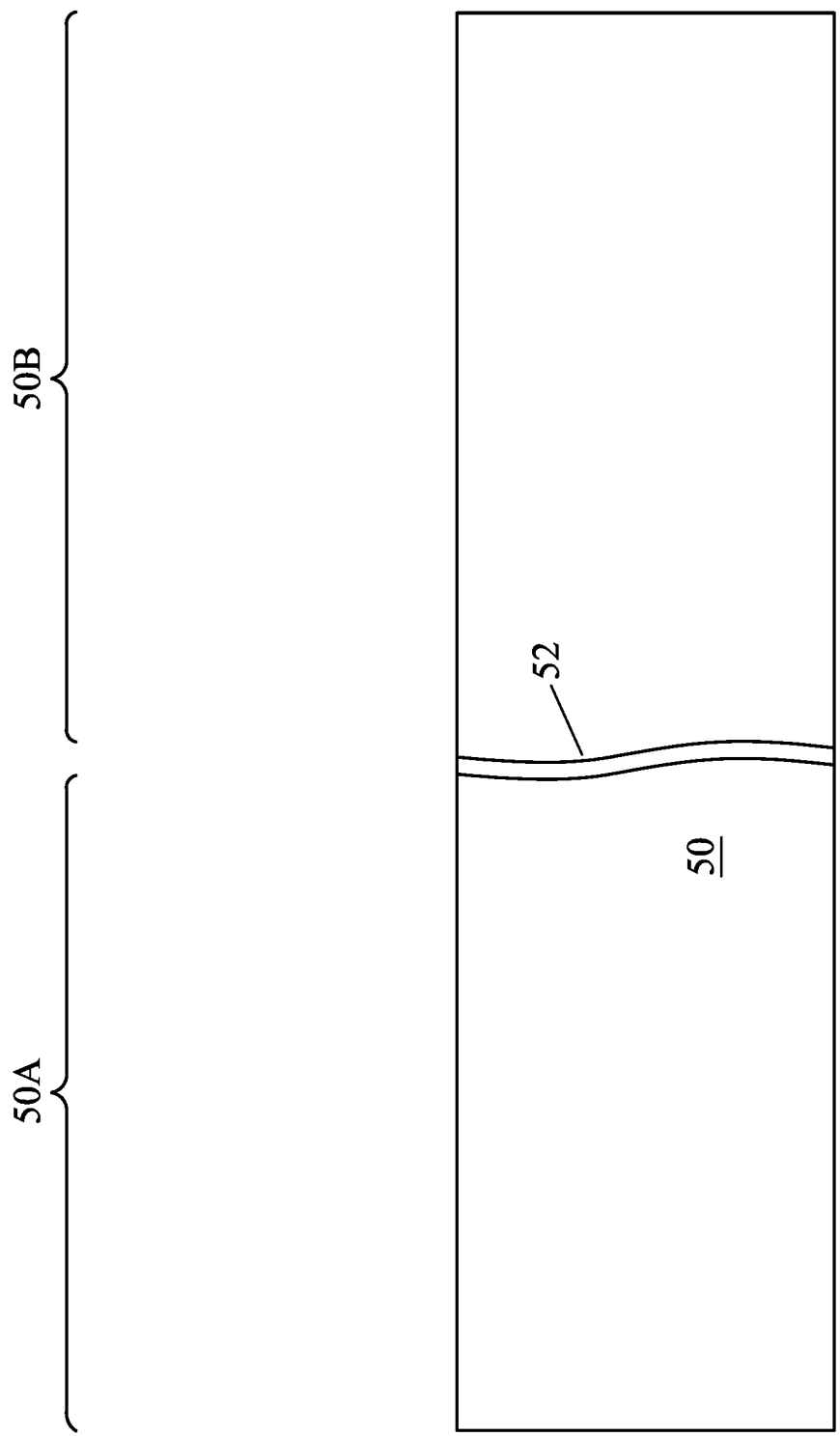
FIGS. 2-15, 16A-16C, 17A, 17B, 18A-18C, 19A, 19B, 20A, 20B, 21A, 21B, 22A, 22B, 23A-23D, 24A, 24B, 25A, and 25B are top and cross-sectional views of intermediate stages in the manufacturing of a FinFET device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 50 may have a first region 50A and a second region 50B. In some embodiments, the first region 50A is a memory region and a second region 50B is a logic region. The first region 50A may be physically separated from the second region 50B (as illustrated by a divider 52), and any number of other desired regions may be disposed between the first region 50A and the second region 50B based on design specifications of a resulting FinFET device.

Figure 3:
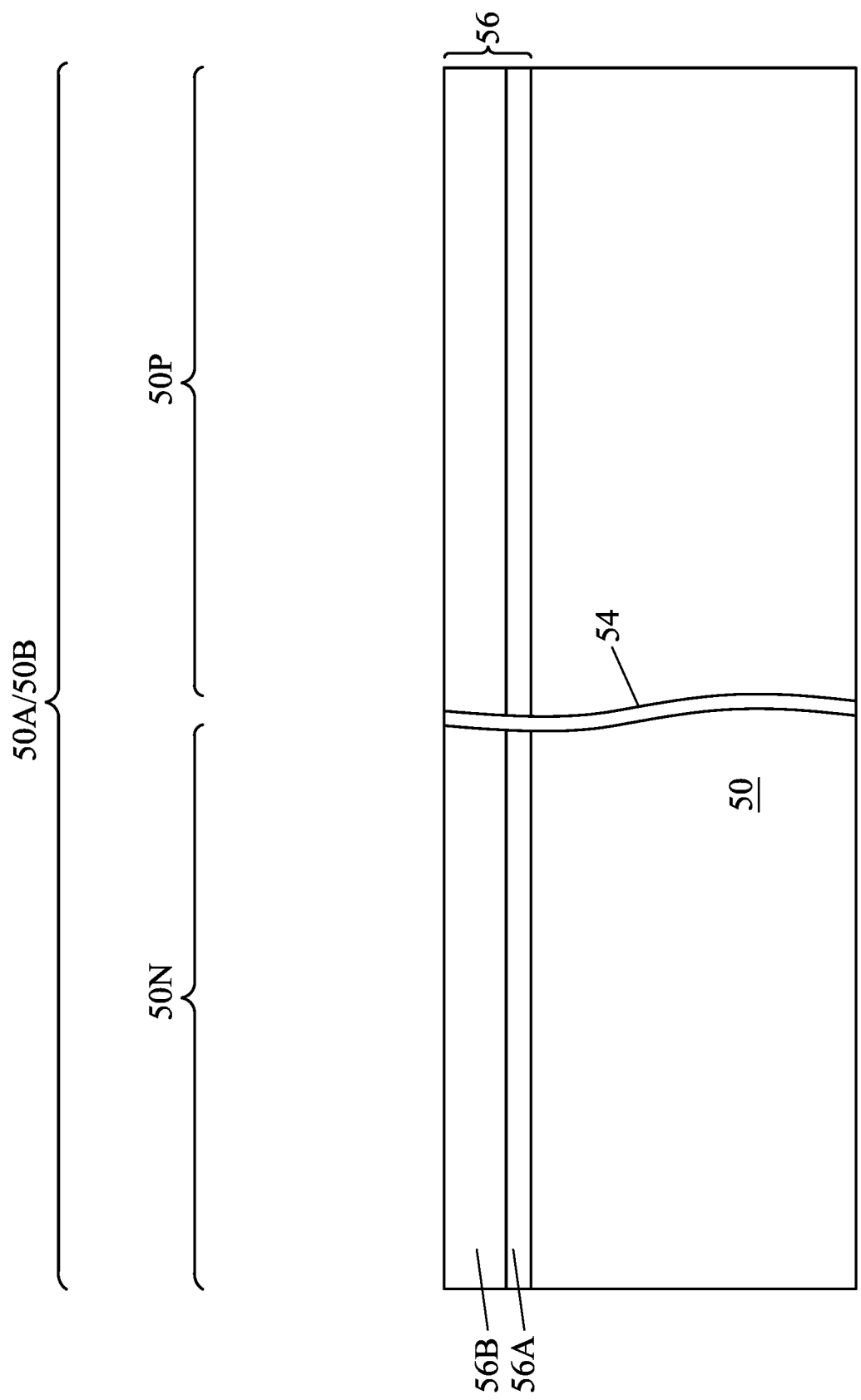

In FIG. 3, each of the first region 50A and the second region 50B may have an n-type region 50N and a p-type region 50P. The n-type region 50N is for forming n-type devices, such as NMOS transistors, e.g., n-type FinFETs. The p-type region 50P is for forming p-type devices, such as PMOS transistors, e.g., p-type FinFETs. The n-type region 50N may be physically separated from the p-type region 50P (as illustrated by a divider 54), and any number of device features (e.g., other active devices, doped regions, isolation structures, etc.) may be disposed between the n-type region 50N and the p-type region 50P.

Further in FIG. 3, a mask layer 56 is formed over the substrate 50 in both the first region 50A and the second region 50B. In some embodiments, the mask layer 56 is formed over both the n-type region 50N and the p-type region 50P in each of the first region 50A and the second region 50B. In some embodiments, the mask layer 56 is a multi-layer structure. In the illustrated embodiment, the mask layer 56 comprises a first layer 56A and a second layer 56B over the first layer 56A. In some embodiments, the first layer 56A comprises an oxide material, such as silicon oxide or the like, and may be formed using atomic layer deposition (ALD), chemical vapor deposition (CVD), a combination thereof, or the like. In some embodiments, the second layer 56B comprises a nitride material, such as silicon nitride or the like, and may be formed using ALD, CVD, a combination thereof, or the like. As described below for a greater detail, the mask layer 56 may be used to aid in patterning the substrate 50 to form fins (such as fins 58A and 58B illustrated in FIG. 4).

FIGS. 4-15, 16A-16C, 17A, 17B, 18A-18C, 19A, 19B, 20A, 20B, 21A, 21B, 22A, 22B, 23A-23D, 24A, 24B, 25A, and 25B illustrate various additional steps in the manufacturing of a FinFET device in accordance with some embodiments. FIGS. 4-15, 16A-16C, 17A, 17B, 18A-18C, 19A, 19B, 20A, 20B, 21A, 21B, 22A, 22B, 23A-23D, 24A, 24B, 25A, and 25B illustrate features in either of the n-type region 50N and the p-type region 50P within each of the first region 50A and the second region 50B of the substrate 50. For example, the structures illustrated in FIGS. 4-15, 16A-16C, 17A, 17B, 18A-18C, 19A, 19B, 20A, 20B, 21A, 21B, 22A, 22B, 23A-23D, 24A, 24B, 25A, and 25B may be applicable to both the n-type region 50N and the p-type region 50P within each of the first region 50A and the second region 50B of the substrate 50. Differences (if any) in the structures of the n-type region 50N and the p-type region 50P are described in the text accompanying each figure.

Figure 4:
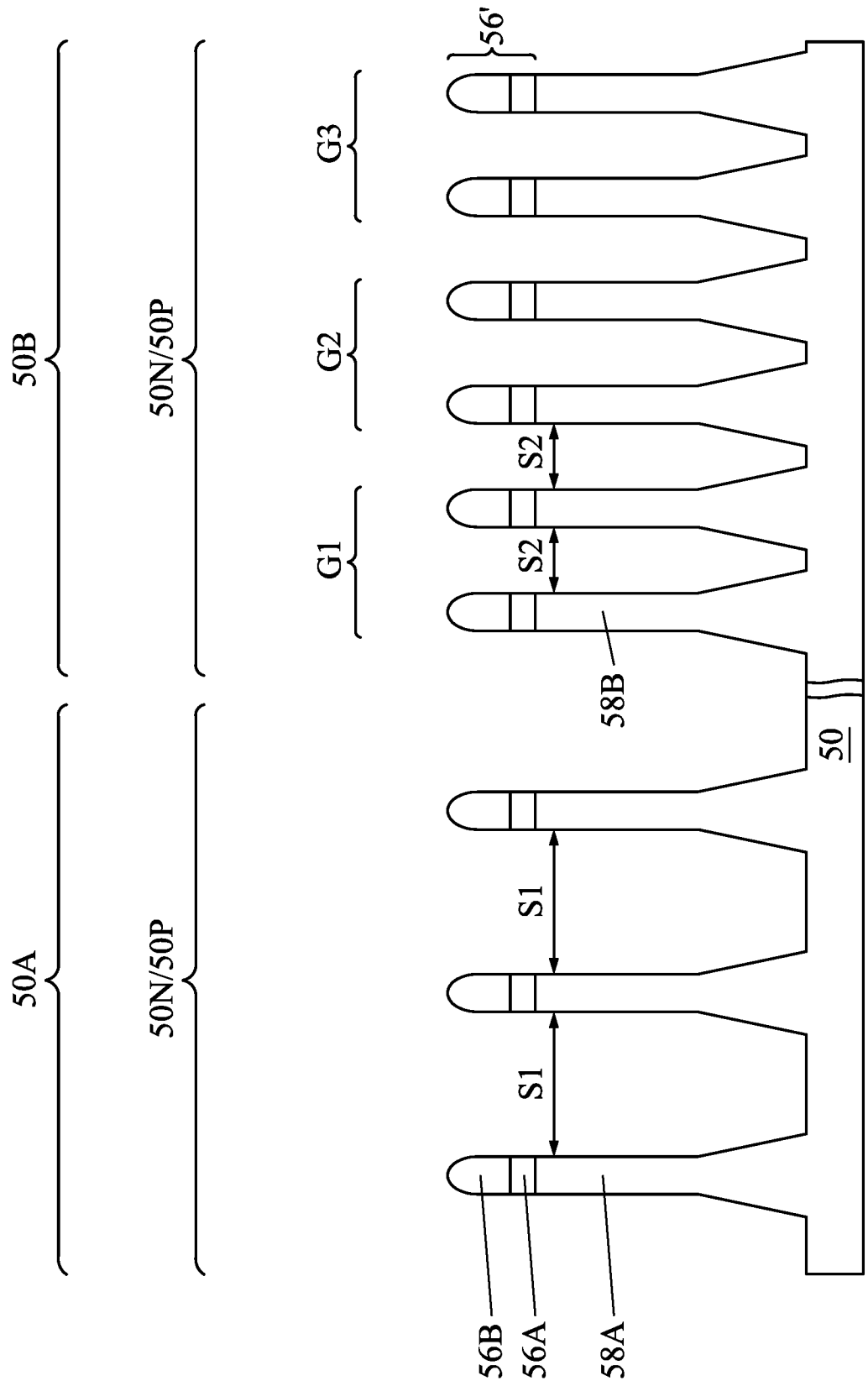

In FIG. 4, fins 58A and fins 58B are formed in the substrate 50 in the first region 50A and the second region 50B, respectively. The fins 58A and 58B are semiconductor strips. In some embodiments, the fins 58A and 58B are simultaneously formed. In such embodiments, the fins 58A and 58B may be formed by performing a same patterning process in the first region 50A and the second region 50B. The patterning process may comprise a first patterning process followed by a second patterning process. In some embodiments, the first patterning process is performed on the mask layer 56 to form a patterned mask layer 56' having a desired pattern. The first patterning process may comprise suitable photolithography and etch processes. The etch process may be any acceptable etch process, such as reactive ion etch (RIE), neutral beam etch (NBE), a combination thereof, or the like. The etch process may be anisotropic. Subsequently, the second patterning process is performed on the substrate 50 to transfer the pattern of the patterned mask layer 56' into the substrate 50. The second patterning process may comprise a suitable etch process, while using the patterned mask layer 56' as an etch mask. The etch process may be any acceptable etch process, such as RIE, NBE, a combination thereof, or the like. The etch process may be anisotropic.

In other embodiments, the fins 58A are formed in the first region 50A of the substrate 50 before or after forming the fins 58B in the second region 50B of the substrate 50. In such embodiments, the fins 58A and the fins 58B may be formed by performing a first patterning process in the first region 50A while protecting the second region 50B using a suitable mask, and performing a second patterning process in the second region 50B while protecting the first region 50A using a suitable mask. Each of the first patterning process and the second patterning process may be similar to the patterning process described above with respect to the embodiment when the fins 58A and 58B are simultaneously formed, and the description is not repeated herein.

Further in FIG. 4, the spacing S1 between adjacent ones of the fins 58A may be between about 15 nm and about 100 nm. The spacing S2 between adjacent ones of the fins 58B may be between about 15 nm and about 25 nm. In some embodiments, the spacing S1 is different from the spacing S2. In other embodiments, the spacing S1 is same as the spacing S2. In the illustrated embodiments, the spacing S1 is greater than the spacing S2. In some embodiments, the fins 58B may be grouped into fin groups (such as fin groups G1, G2, and G3 illustrated in FIG. 4), such that each of the fin groups comprises a pair of fins 58B. As described below in greater detail, some of the fin groups may be subsequently removed.

The above method for forming the fins 58A and 58B is merely an example method for forming the fins 58A and 58B. The fins 58A and 58B may be formed by any suitable method. For example, the fins 58A and 58B may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins 58A and 58B.

Figure 5:
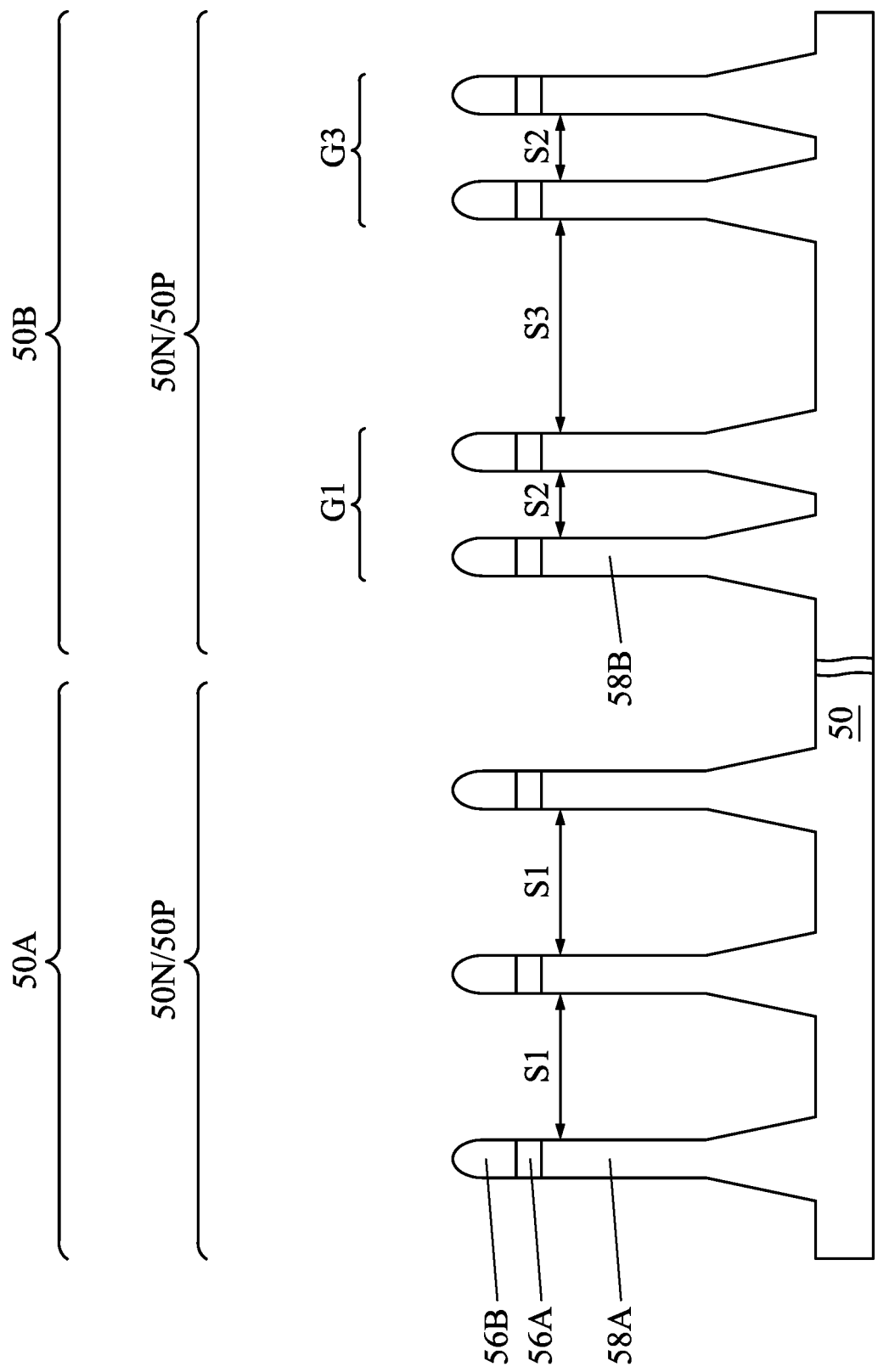

In FIG. 5, in some embodiments, some of the fin groups are removed in the second region 50B of the substrate 50. The removal process may comprise suitable photolithography and etch processes. The etch process may be selective to a material of the fins 58B. In the illustrated embodiment, every other fin group (such as, for example, the fin group G2 illustrated in FIG. 4) is removed. The spacing S3 between adjacent ones of the fin groups (such as, for example, the fin groups G1 and G3) may be between about 50 nm and about 100 nm. In the illustrated embodiment, the spacing S3 is greater than the spacing S1. In other embodiments, the spacing S3 may be less than or equal to the spacing S1.

Figure 6:
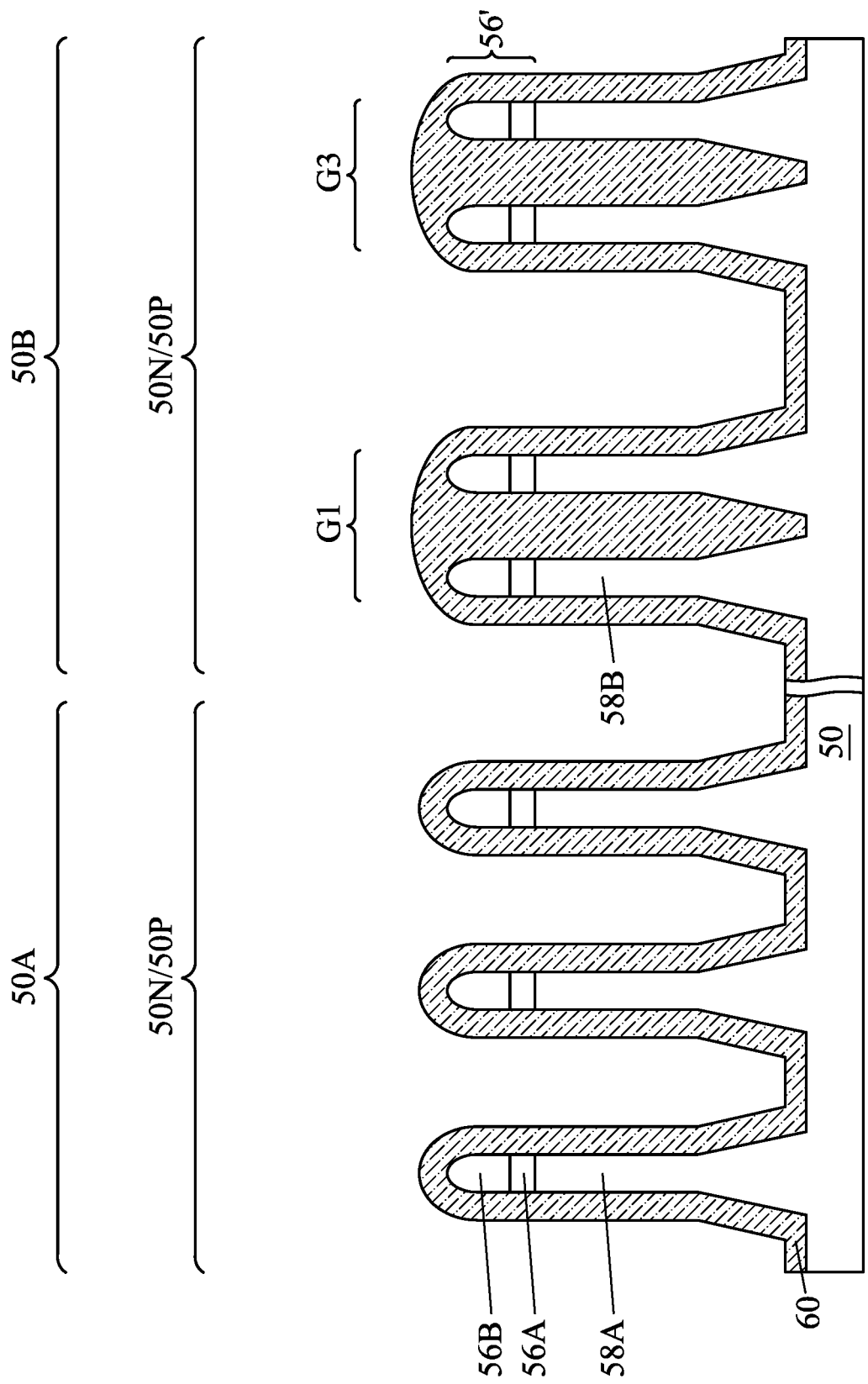

FIGS. 6-14 illustrate cross-sectional views of intermediate stages in the manufacturing of isolation regions 74 (see FIG. 13) and hybrid fins 72A and 72B (see FIG. 13) in accordance with some embodiments. In FIG. 6, an insulation material 60 is blanket formed over the substrate 50, and fins 58A and 58B. The insulation material 60 may be an oxide such as silicon oxide or the like, a nitride such as silicon nitride or the like, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 60 is silicon oxide formed by a FCVD process. An anneal process may be performed once the insulation material is formed. A thickness of the insulation material 60 may be between about 10 nm and about 20 nm. In some embodiments, the thickness of the insulation material 60 and the spacing S1, S2 and S3 are tuned such that the insulation material 60 fully fills trenches between adjacent fins 58B in each fin group (such as the fin groups G1 and G3), and partially fills trenches between adjacent fins 58A and trenches between adjacent fin groups.

Figure 7:
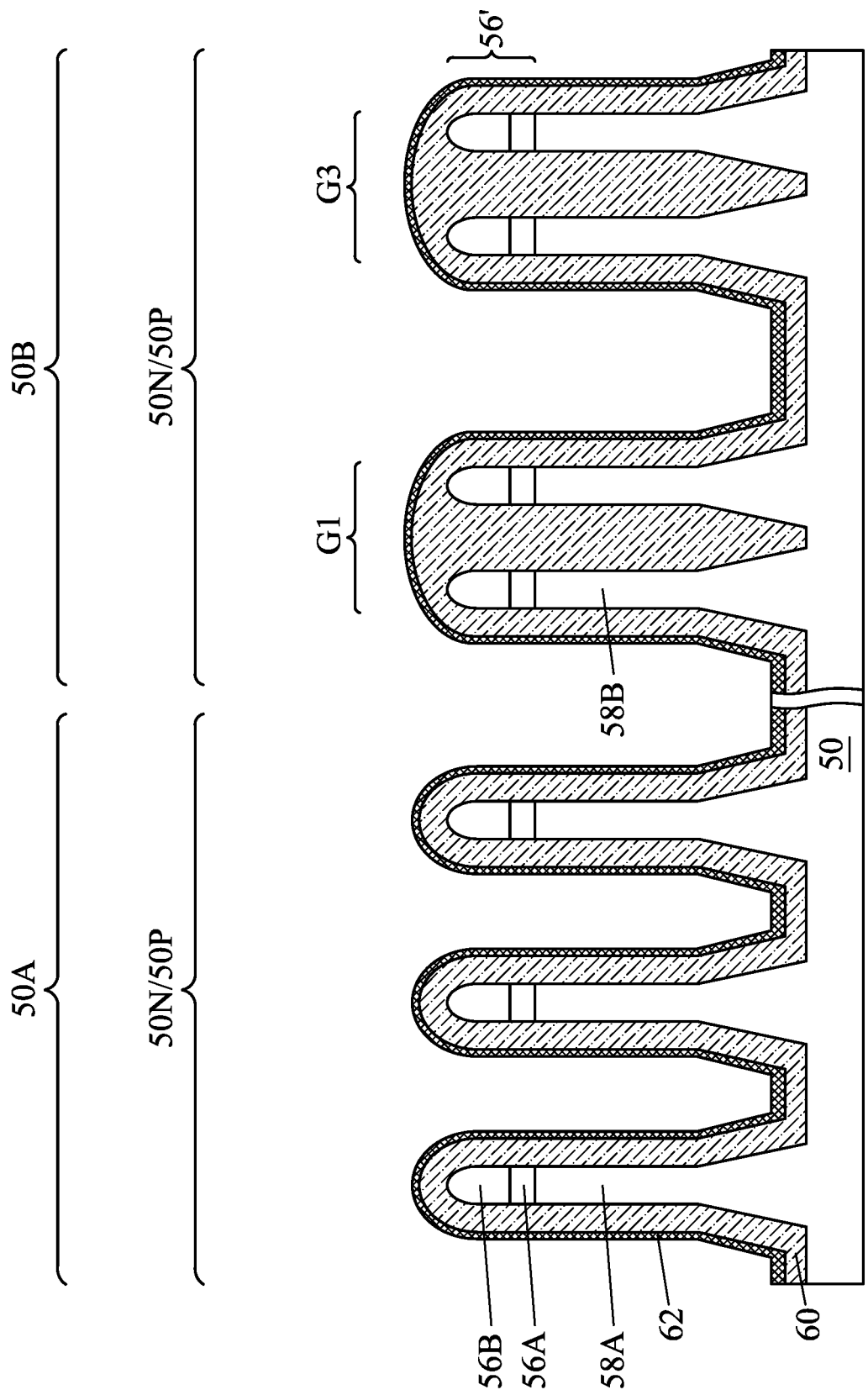

In FIG. 7, an insulation material 62 is blanket formed over the insulation material 60 in the first region 50A and the second region 50B. The insulation material 62 may be a nitride such as silicon carbonitride (SiCN) or the like, and may be formed by ALD, CVD, HDP-CVD, FCVD, a combination thereof, or the like. In embodiments when the insulation material 62 comprises SiCN, the insulation material 62 has a carbon concentration between about 5 at % and about 10 at %. A thickness of the insulation material 62 may be between about 2 nm and about 5 nm. In some embodiments, the thickness of the insulation material 62 and the spacing S1 and S3 are tuned such that the insulation material 62 partially fills trenches between adjacent fins 58A and trenches between adjacent fin groups (such as the fin groups G1 and G3). The insulation material 62 may be also referred to as a liner material.

Figure 8:
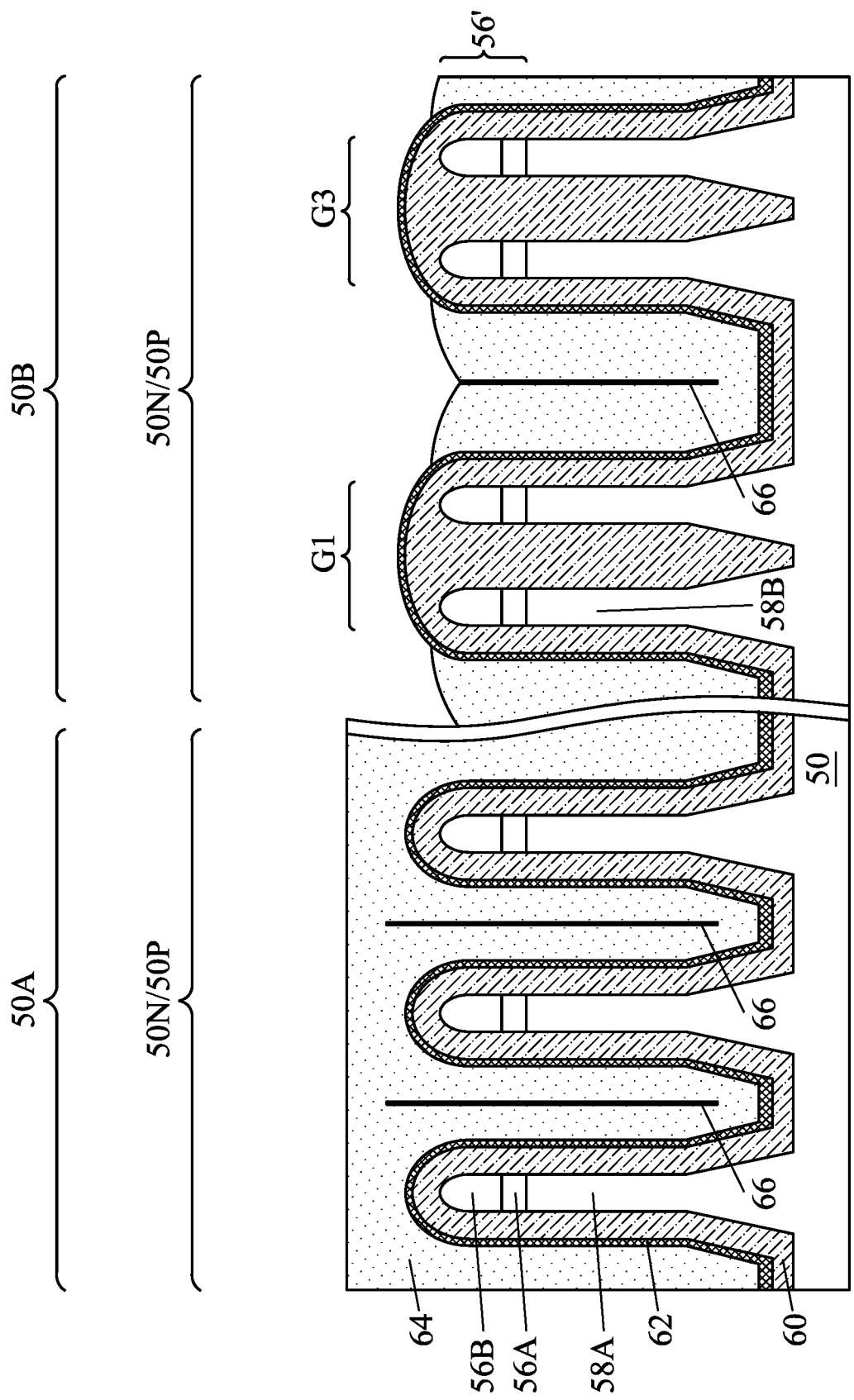

In FIG. 8, an insulation material 64 is blanket formed over the insulation material 62 in the first region 50A and the second region 50B. The insulation material 64 may be a nitride such as silicon carbonitride (SiCN) or the like, and may be formed by ALD, CVD, HDP-CVD, FCVD, a combination thereof, or the like. In embodiments when the insulation materials 62 and 64 comprise SiCN, a carbon concentration of the insulation material 64 is greater than a carbon concentration of the insulation material 62. In embodiments when the insulation material 64 comprises SiCN, the insulation material 64 has a carbon concentration between about 10 at % and about 18 at %. A thickness of the insulation material 64 may be between about 50 nm and about 70 nm. In some embodiments, the thickness of the insulation material 64 and the spacing S1 and S3 are tuned such that the insulation material 64 overfills trenches between adjacent fins 58A in the first region 50A, and partially fills trenches between adjacent fin groups (such as the fin groups G1 and G3) in the second region 50B due to difference in fin density. In some embodiments, after forming the insulation material 64, seams 66 are formed in trenches between adjacent fins 58A in the first region 50A and trenches between adjacent fin groups (such as the fin groups G1 and G3) in the second region 50B.

Figure 9:
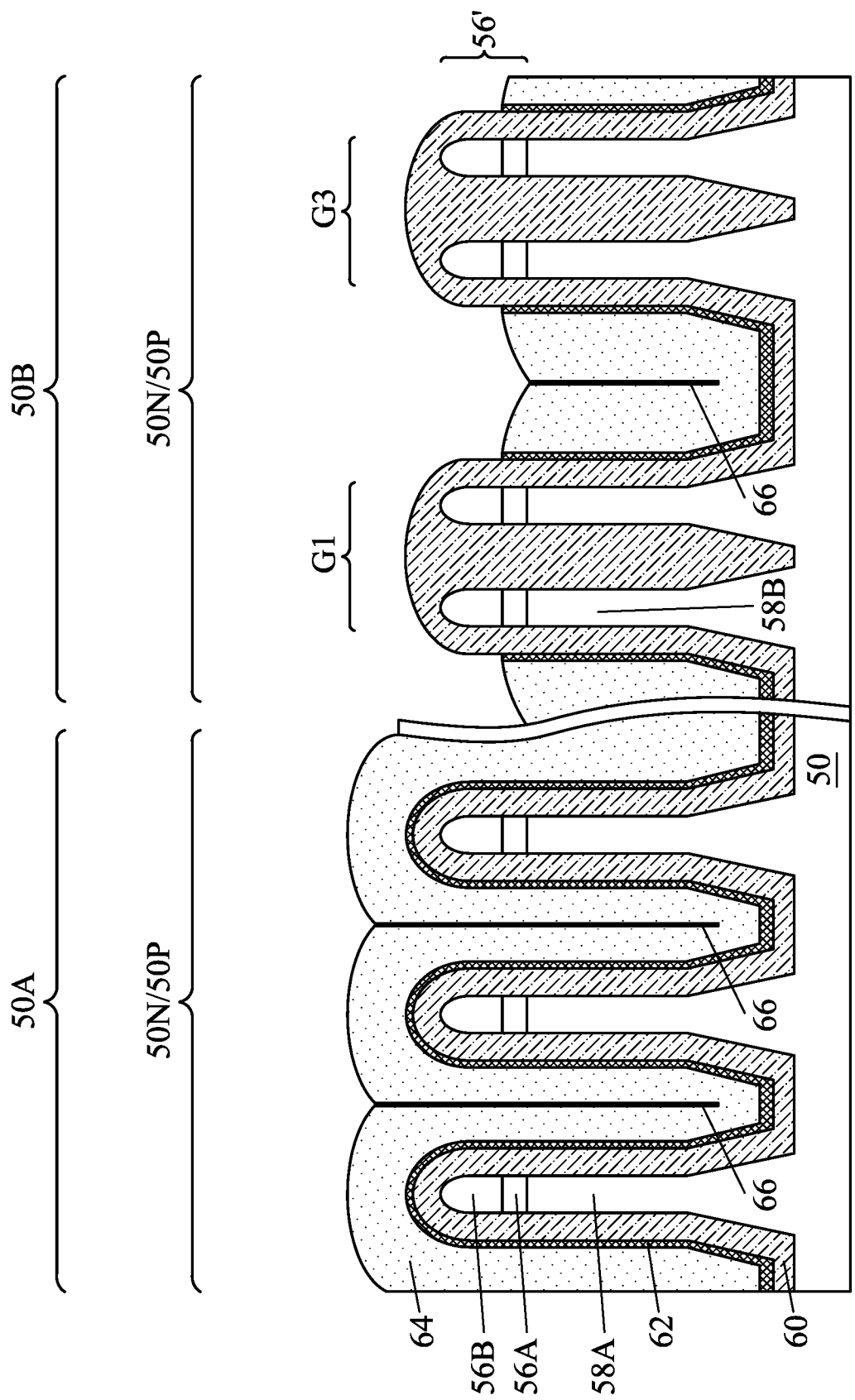

In FIG. 9, the insulation material 64 is etched back to tune heights of the insulation material 64 in the first region 50A and the second region 50B. As described below in greater detail, an implantation process is performed on the insulation material 64. By etching back the insulation material 64 to reduce heights of the insulation material 64, implants that are implanted by the implantation process may extend into the insulation material 64 to a desired depth. In some embodiments, the etch back process comprises an etch process that is selective to the insulation material 64. In embodiments when the insulation materials 62 and 64 comprise SiCN, the etch back process may also etch the insulation materials 62 in the second region 50B. In such embodiments, the etch back process etches the insulation material 62 faster than the insulation material 64, due to the insulation material 62 having a lower carbon concentration than the insulation material 64.

Figure 10:
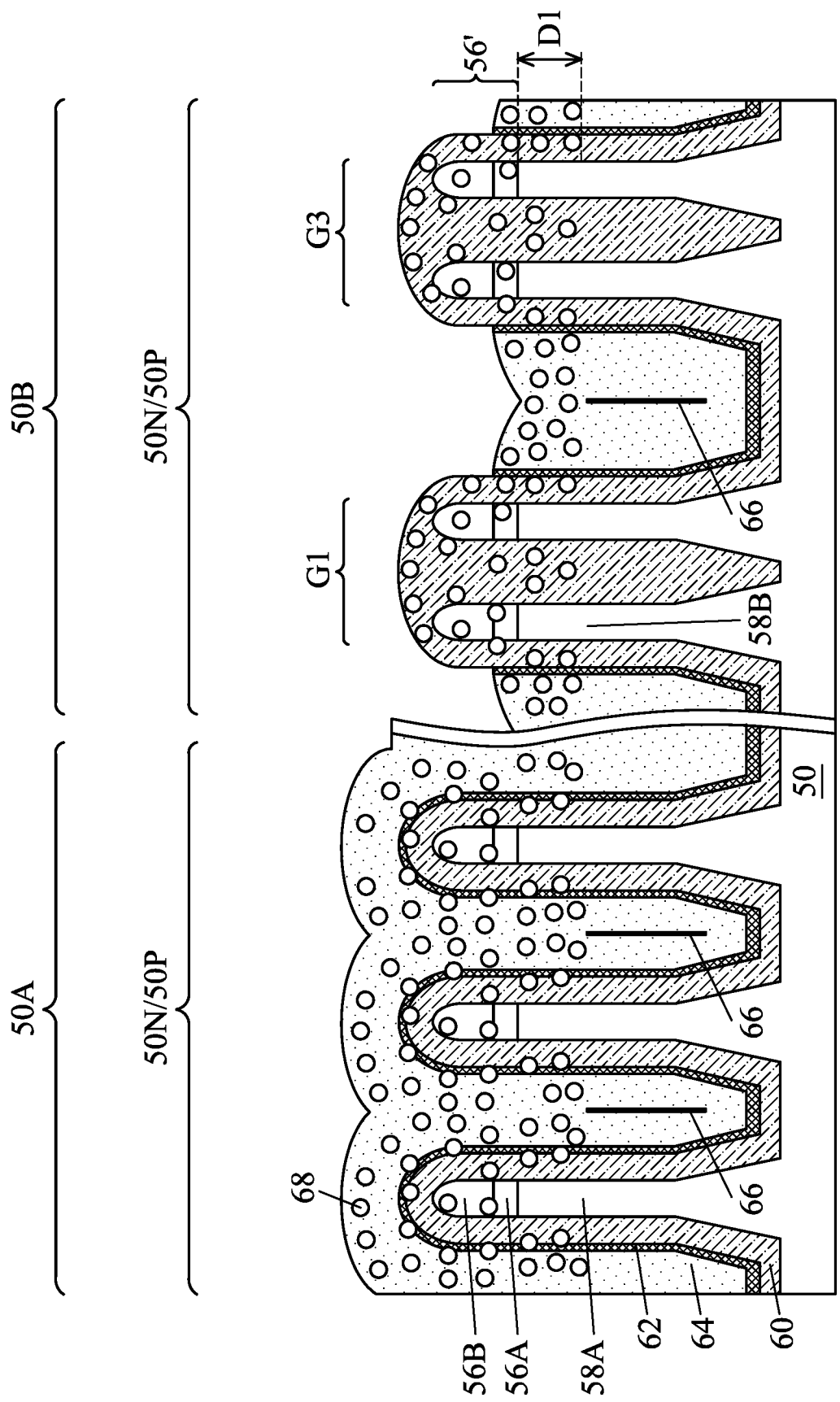

In FIG. 10, an implantation process is performed on the insulation material 64 to implant suitable implants 68 (also referred to as dopants) into the insulation material 64. In some embodiments, the implants 68 extend into the insulation material 64 and remove portions of the seams 66 within the implanted regions of the insulation material 64. In some embodiments, the implantation process further implants the implants 68 into the insulation material 62 and the patterned mask layer 56'. The patterned mask 56' protects the fins 58A and 58B from the implantation process, such that the implants 68 do not extend into the fins 58A and 58B. In some embodiments, the implants 68 comprise N atoms, Ar atoms, C atoms, Si atoms, a combination thereof, or the like. In some embodiments when the implants 68 comprise two or more different atom types, each atom type may be implanted separately and sequentially. In some embodiments when the implants 68 comprise two or more different atom types, all atom types may be implanted simultaneously. In some embodiments, the implantation process is performed with an implantation energy between about 5 KeV and about 15 KeV. For implantation energies less than 5 KeV, the implants 68 may not extend into the insulating material 64 to the desired depth and resulting seam-free regions may be too short. For implantation energies greater than 15 KeV, the implants 68 may extend into and may damage the fins 58A and 58B. In some embodiments, the implants 68 extend into the insulating material 64 to a depth D1 below the top surfaces of the fins 58A and 58B. In some embodiments, the depth D1 is between about 10 nm and about 25 nm. After performing the implantation process, in some embodiments, topmost portions of the seams 66 are below the top surfaces of the fins 58A and 58B.

Figure 11:
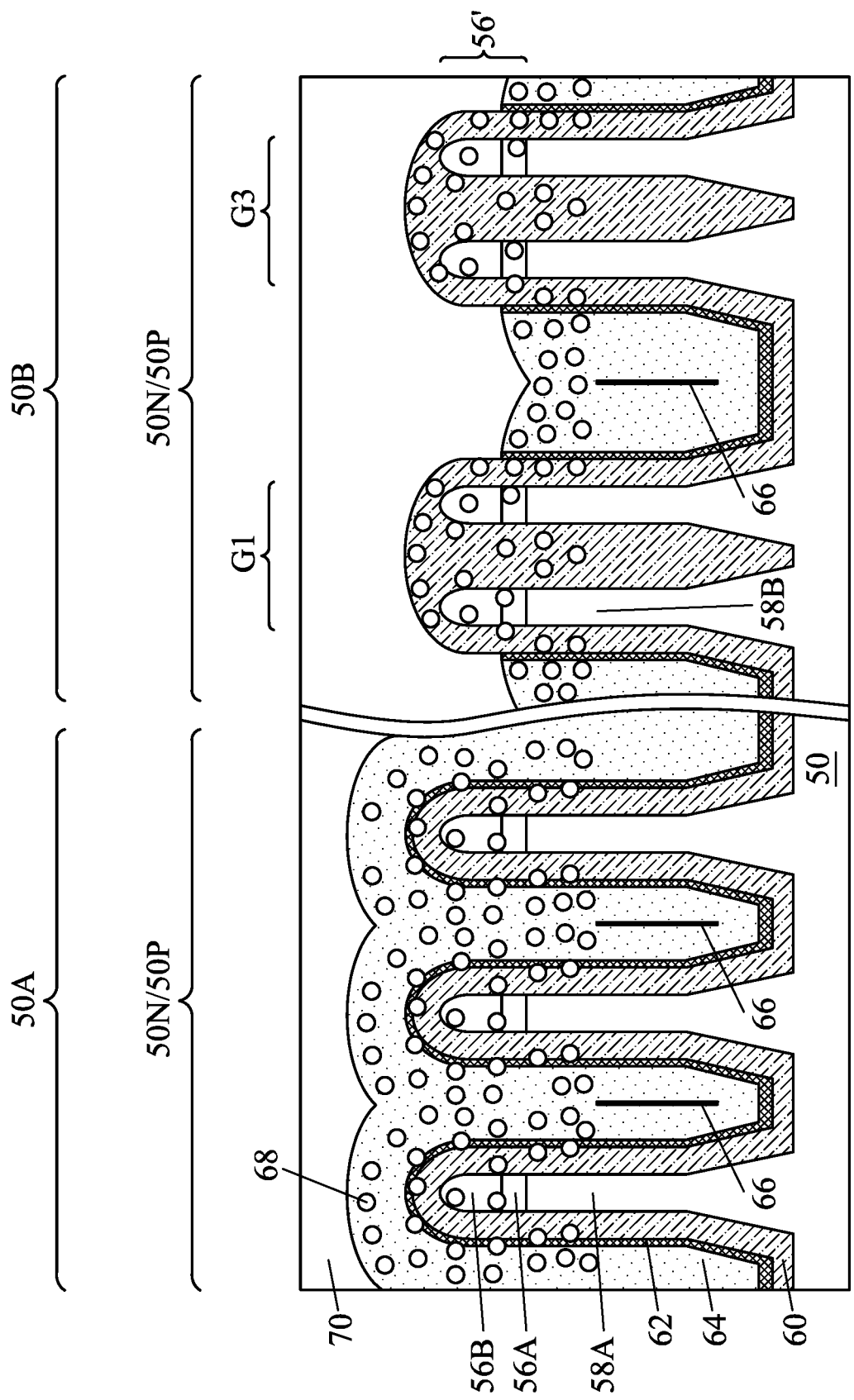

In FIG. 11, an insulation material 70 is blanket formed over the insulation material 64 in the first region 50A and over the insulation materials 60, 62 and 64 in the second region 50B. The insulation material 70 may be a nitride such as silicon carbonitride (SiCN) or the like, and may be formed by ALD, CVD, HDP-CVD, FCVD, a combination thereof, or the like. In embodiments when the insulation materials 64 and 70 comprise SiCN, the insulation materials 64 and 70 may have a same carbon concentration. In other embodiments, the insulation materials 64 and 70 may have different carbon concentrations. In some embodiments, the insulation material 70 overfills trenches between adjacent fin groups (such as the fin groups G1 and G3) in the second region 50B. In some embodiments, the insulation material 70 is formed to aid in a subsequent planarization process.

Figure 12:
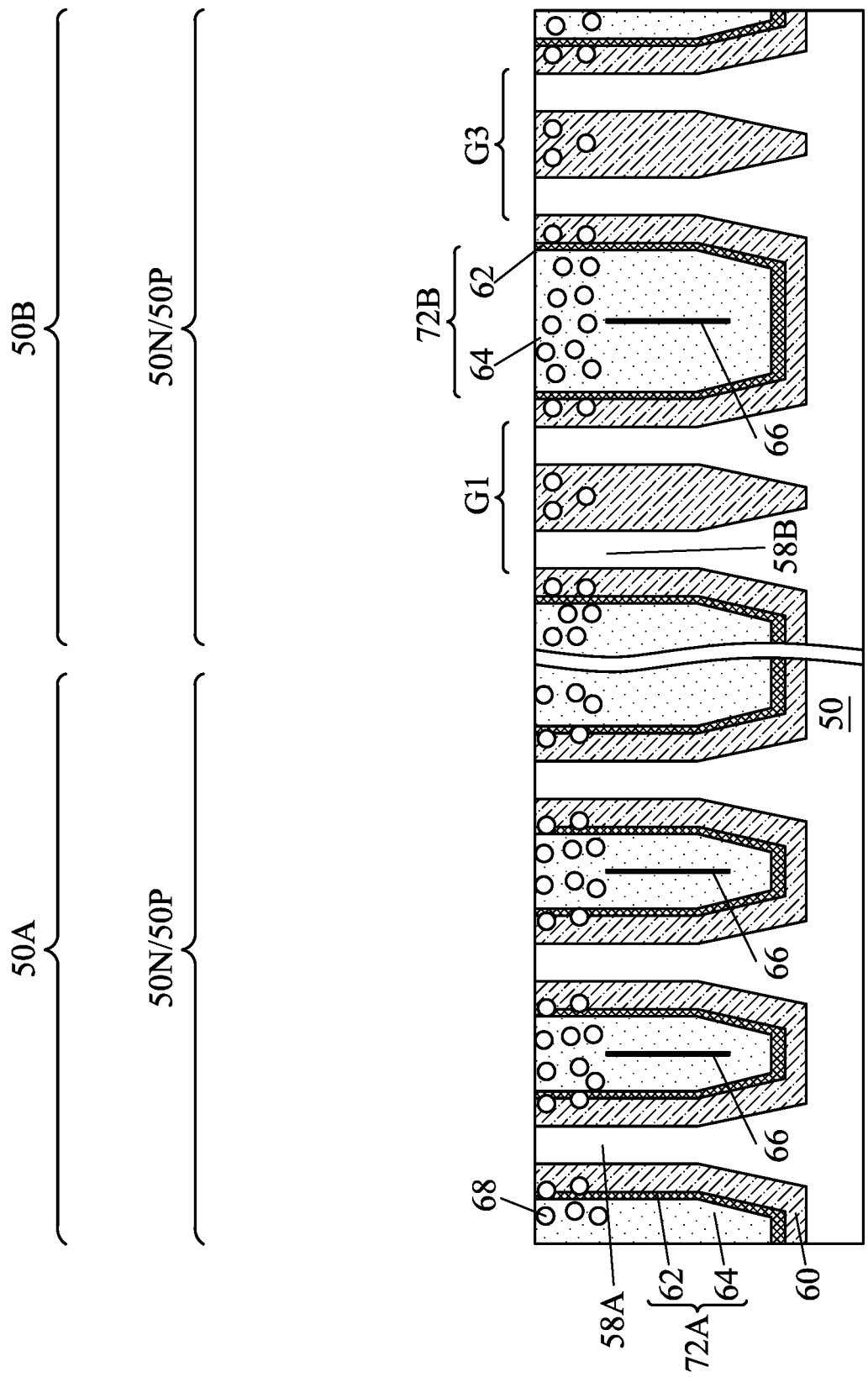

In FIG. 12, a planarization process is performed on the structure of FIG. 11 to expose top surfaces of the fins 58A and 58B. In some embodiments, a planarization process may comprise a chemical mechanical polishing (CMP) process, an etch back process, a combination thereof, or the like. The planarization process removes the insulation material 70 (see FIG. 11), removes the patterned mask layer 56' (see FIG. 11), and removes portions of the insulation materials 60, 62 and 64 over the top surfaces of the fins 58A and 58B. After performing the planarization process, the top surfaces of the fins 58A and 58B, and top surface of the insulation materials 60, 62 and 64 are substantially level or coplanar within process variations of the planarization process. The remaining portions of the insulation materials 62 and 64 form hybrid fins 72A in the first region 50A and hybrid fins 72B in the second region 50B. The hybrid fins 72A and 72B may be also referred to as dielectric fins. In some embodiments, a width of the hybrid fins 72B is greater than a width of the hybrid fins 72A.

Figure 13:
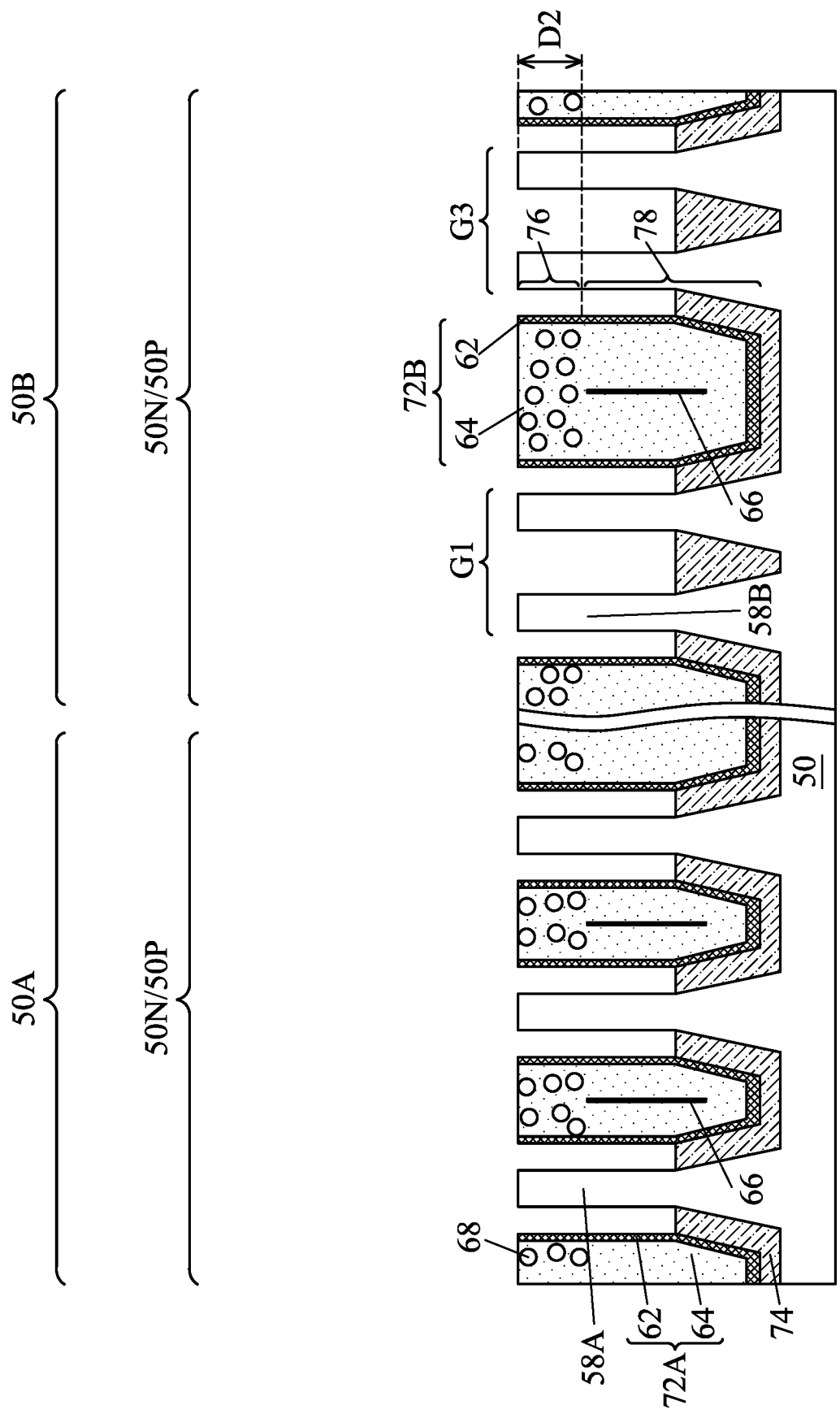

In FIG. 13, the insulation material 60 (see FIG. 12) is recessed to form shallow trench isolation (STI) regions 74. The insulation material 60 is recessed such that upper portions of fins 58A and 58B protrude from between neighboring STI regions 74, and upper portions of the hybrid fins 72A and 72B protrude from respective STI regions 74. The insulation material 60 may be recessed using an acceptable etch process, such as one that is selective to the material of the insulation material 60. For example, a chemical oxide removal with a suitable etch process using, for example, dilute hydrofluoric (dHF) acid may be used.

The process described with respect to FIGS. 2-13 is just one example of how the fins 58A and 58B may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 58A and 58B in FIG. 12 can be recessed, and a material different from the fins 58A and 58B may be epitaxially grown over the recessed fins 58A and 58B. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Further in FIG. 13, appropriate wells (not shown) may be formed in the fins 58A and 58B and/or the substrate 50. In some embodiments, P wells may be formed in the n-type regions 50N of the substrate 50, and N wells may be formed in the p-type regions 50P of the substrate 50. In some embodiments, P wells or N wells are formed in both the n-type regions 50N and the p-type regions 50P of the substrate 50. In the embodiments with different well types, the different implant steps for the n-type regions 50N and the p-type regions 50P of the substrate 50 may be achieved using a photoresist or other masks (not shown). For example, a first photoresist may be formed over the fins 58A and 58B and the STI regions 74 in both the n-type regions 50N and the p-type regions 50P of the substrate 50. The first photoresist is patterned to expose the p-type regions 50P of the substrate 50. The first photoresist can be formed by using a spin-on technique and can be patterned using acceptable photolithography techniques. Once the first photoresist is patterned, an n-type impurity implantation is performed in the p-type regions 50P of the substrate 50, while the remaining portion of the first photoresist acts as a mask to substantially prevent n-type impurities from being implanted into the n-type regions 50N of the substrate 50. The n-type impurities may be phosphorus, arsenic, antimony, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the n-type impurities may be implanted at an implantation energy of about 1 keV to about 10 keV. After the implantation, the first photoresist is removed, such as by an acceptable ashing process followed by a wet clean process.

Following the implantation of the p-type regions 50P of the substrate 50, a second photoresist is formed over the fins 58A and 58B and the STI regions 74 in both the p-type regions 50P and the n-type regions 50N of the substrate 50. The second photoresist is patterned to expose the n-type regions 50N of the substrate 50. The second photoresist can be formed by using a spin-on technique and can be patterned using acceptable photolithography techniques. Once the second photoresist is patterned, a p-type impurity implantation may be performed in the n-type regions 50N of the substrate 50, while the remaining portion of the second photoresist acts as a mask to substantially prevent p-type impurities from being implanted into the p-type regions 50P of the substrate 50. The p-type impurities may be boron, BF$_2$, indium, or the like, implanted in the region to a dose of equal to or less than $10^{15}$ cm$^{-2}$, such as between about $10^{12}$ cm$^{-2}$ and about $10^{15}$ cm$^{-2}$. In some embodiments, the p-type impurities may be implanted at an implantation energy of about 1 keV to about 10 keV. After the implantation, the second photoresist may be removed, such as by an acceptable ashing process followed by a wet clean process.

After performing the implantations of the n-type regions 50N and the p-type regions 50P of the substrate 50, an anneal process may be performed to activate the p-type and/or n-type impurities that were implanted. In some embodiments, the grown materials of epitaxial fins may be in situ doped during growth, which may obviate the implantations, although in situ doping and implantation doping may be used together.

Figure 14:
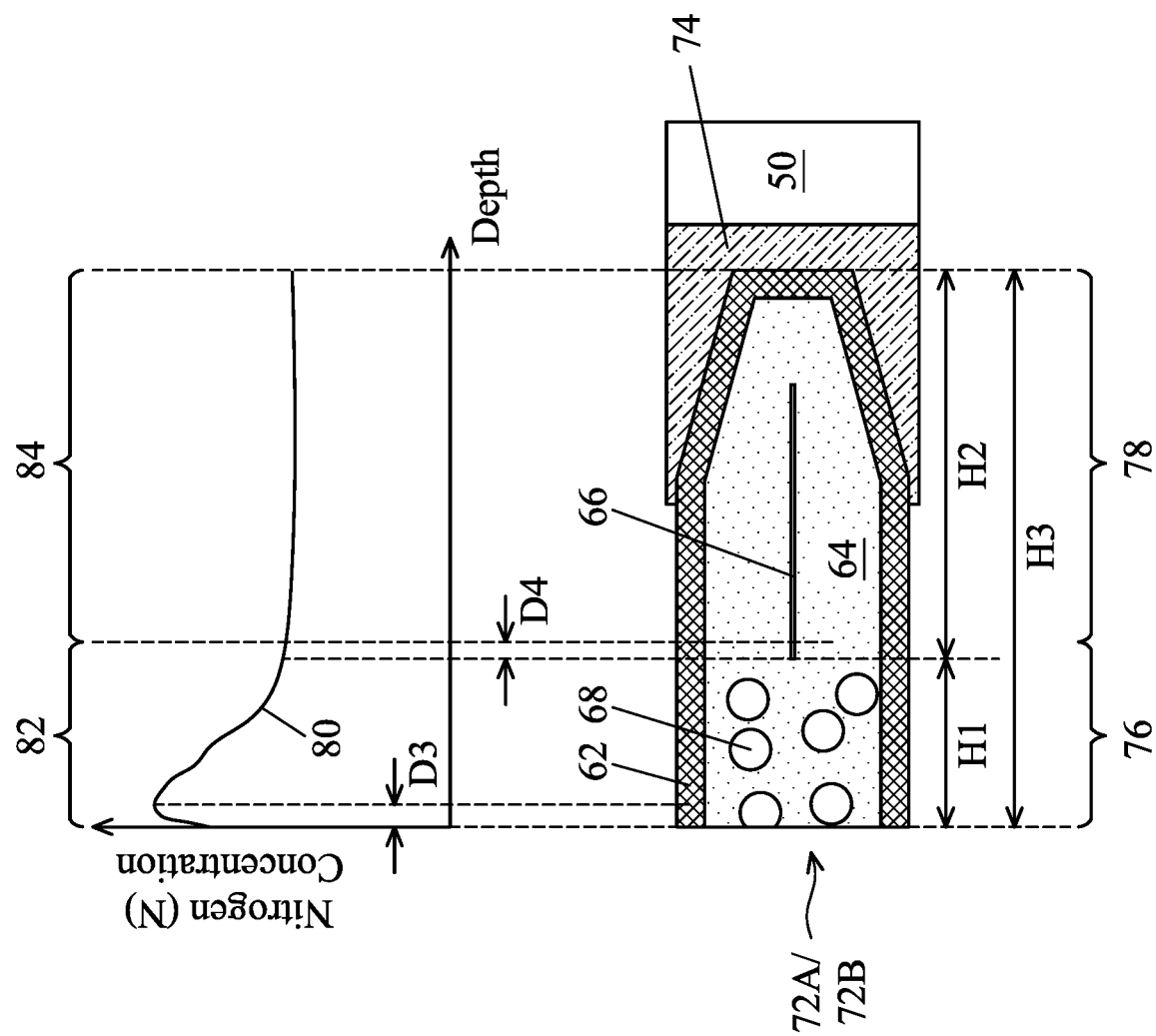

FIG. 14 illustrate a cross-sectional view of a hybrid fin 72A/72B in accordance with some embodiments. FIG. 14 further illustrates a dependence of a nitrogen (N) concentration on a depth as measured from a top surface of the hybrid fin 72A/72B for an embodiment when the hybrid fin 72A/72B comprises SiCN and the implants 68 comprise nitrogen (N) atoms. The hybrid fin 72A/72B comprises a seam-free region 76 and a seam region 78. In some embodiments, the seam-free region 76 has a height H1 between about 5 nm and about 10 nm. In some embodiments, the seam region 78 has a height H2 between about 65 nm and about 75 nm. In some embodiments, the hybrid fin 72A/72B has a height H3 between about 80 nm and about 90 nm. In some embodiments, a ratio of the height H1 to the height H3 (H1/H3) is between about 0.25 and about 0.33. In some embodiments, a ratio of the height H2 to the height H3 (H2/H3) is between about 0.66 and about 0.75. In some embodiments, a bottom of the hybrid fin 72A/72B extends below the tops surfaces of the fins 58A and 58B to a depth D2 (see FIG. 13). The depth D2 is between about 10 nm and about 15 nm.

Further in FIG. 14, the curve 80 illustrates the dependence of the nitrogen (N) concentration on the depth as measured from the top surface of the hybrid fin 72A/72B for an embodiment when the hybrid fin 72A/72B comprises SiCN and the implants 68 comprise nitrogen (N) atoms. In some embodiments, the hybrid fin 72A/72B comprises a non-uniform concentration region 82 and a uniform concentration region 84. In some embodiments, the non-uniform concentration region 82 extends slightly below a topmost portion of the seam 66. Accordingly, a height of the non-uniform concentration region 82 is greater than the height H1 of the seam-free region 76 and a height of the uniform concentration region 84 is less than the height H2 of the seam region 78. In some embodiments, a bottom surface of the seam-free region 76 is above a bottom surface of the non-uniform concentration region 82 and is spaced apart from the bottom surface of the non-uniform concentration region 82 by a distance D4. In some embodiments, the distance D4 is between about 2 nm and about 5 nm. In some embodiments when the insulation materials 62 and 64 comprise SiCN, the nitrogen (N) concentration within the non-uniform concentration region 82 is greater than as deposited nitrogen (N) concentration within the insulation materials 62 and 64. In some embodiments, the nitrogen (N) concentration has a Gaussian-like profile in the non-uniform concentration region 82, such that the nitrogen (N) concentration continuously increases with depth, reaches a maximum value at a depth D3, and then continuously decreases until a bottom of the non-uniform concentration region 82. In some embodiments, the depth D3 is between about 2 nm and about 5 nm. In some embodiments, in the uniform concentration region 84, the nitrogen (N) concentration is unchanged as the depth increases. In some embodiments when the insulation materials 62 and 64 comprise SiCN, the uniform nitrogen (N) concentration in the uniform concentration region 84 equals to as deposited nitrogen (N) concentration within the insulation materials 62 and 64.

Figure 15:
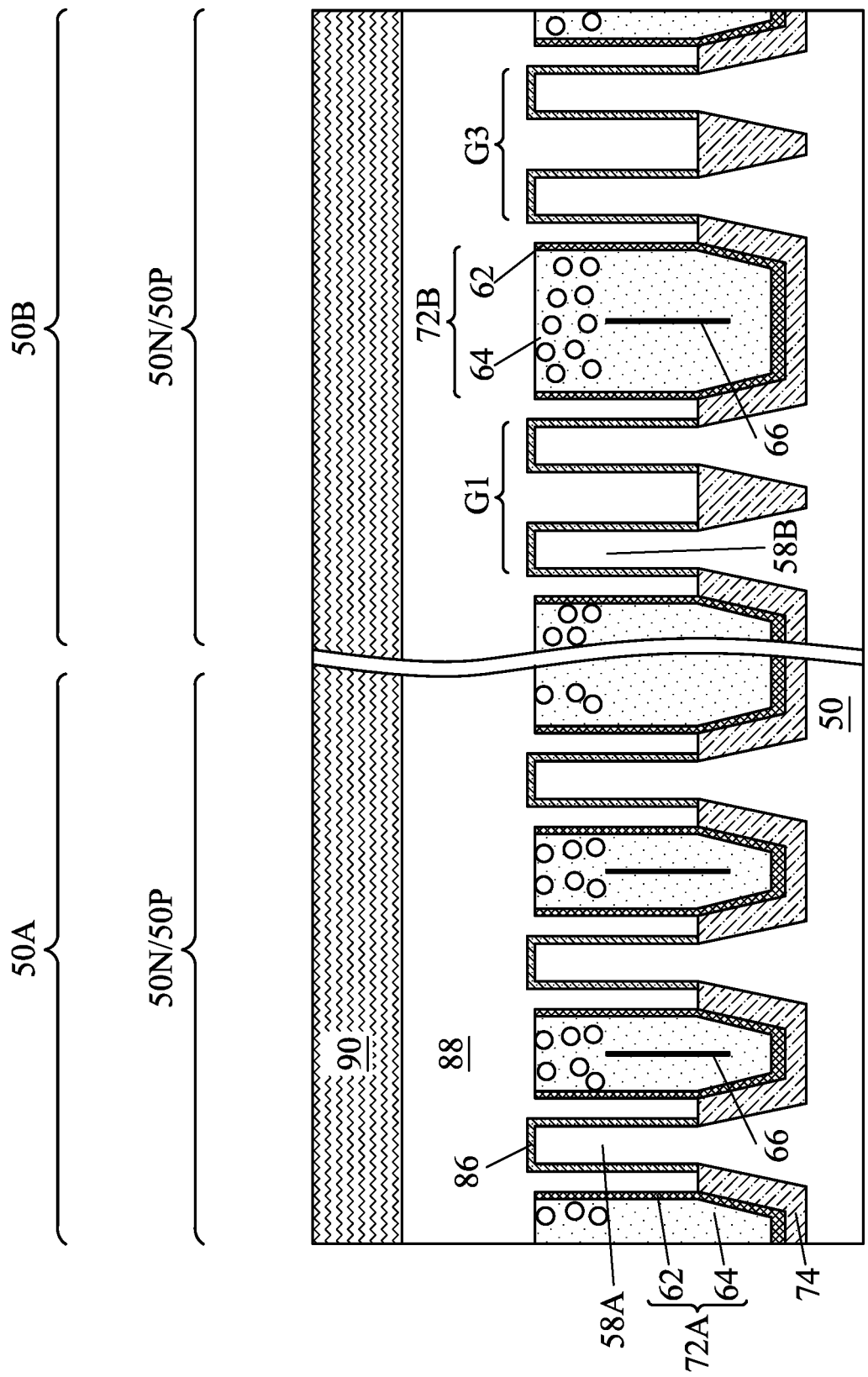

In FIG. 15, a dummy dielectric layer 86 is formed on the fins 58A and 58B. The dummy dielectric layer 86 may be, for example, silicon oxide, silicon nitride, a combination thereof, or the like, and may be deposited or thermally grown according to acceptable techniques. Subsequently, a dummy gate layer 88 is formed over the dummy dielectric layer 86. The dummy gate layer 88 may be deposited over the dummy dielectric layer 86 and then planarized using, for example, a CMP process. The dummy gate layer 88 may be a conductive material and may be selected from a group including amorphous silicon, polycrystalline-silicon (poly-silicon), poly-crystalline silicon-germanium (poly-SiGe), metallic nitrides, metallic silicides, metallic oxides, metals, combinations thereof, and the like. The dummy gate layer 88 may be deposited by physical vapor deposition (PVD), CVD, sputter deposition, or other techniques known and used in the art for depositing conductive materials. The dummy gate layer 88 may be made of other materials that have a high etching selectivity than materials of the STI regions 74, the fins 58A and 58B, and the hybrid fins 72A and 72B. In some embodiments, the mask layer 90 may be deposited over the dummy gate layer 88. The mask layer 90 may include one or more layers of, for example, silicon nitride, silicon oxynitride, or the like. In this example, a single dummy gate layer 88 and a single mask layer 90 are formed across the first region 50A and the second region 50B. It is noted that the dummy dielectric layer 86 is shown covering only the fins 58A and 58B for illustrative purposes only. In some embodiments, the dummy dielectric layer 86 may be deposited such that the dummy dielectric layer 86 covers the STI regions 74 and the hybrid fins 72A and 72B, extending between the dummy gate layer 88 and the STI regions 74 and between the dummy gate layer 88 and the hybrid fins 72A and 72B. By forming the hybrid fins 72A and 72B having the seam-free top regions 76 (see FIG. 14), nucleation sites for forming large particles during the dummy gate layer 88 are reduced or eliminated, and formation of resulting voids is reduced or eliminated.

Figure 16A:
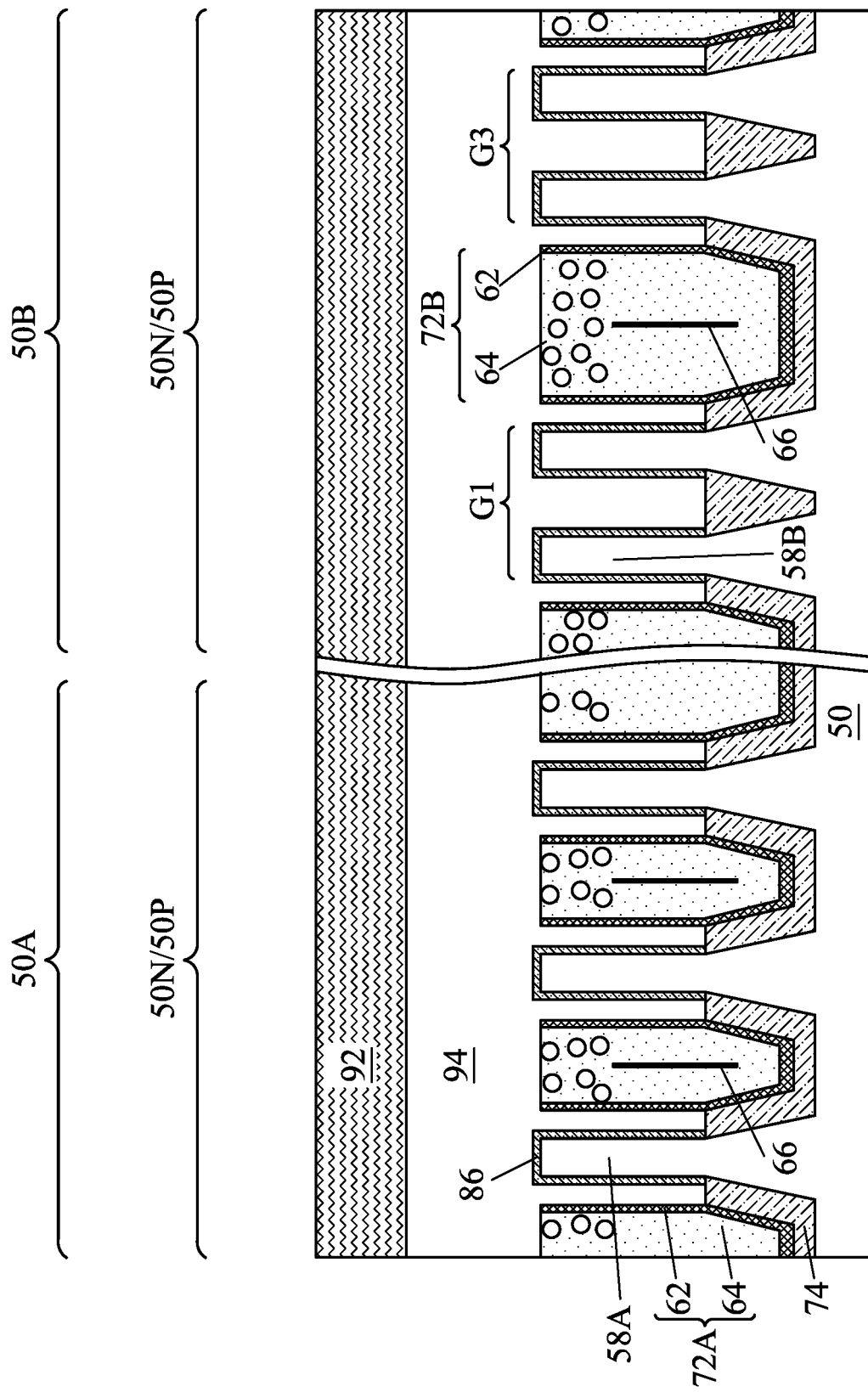
Figure 16B:
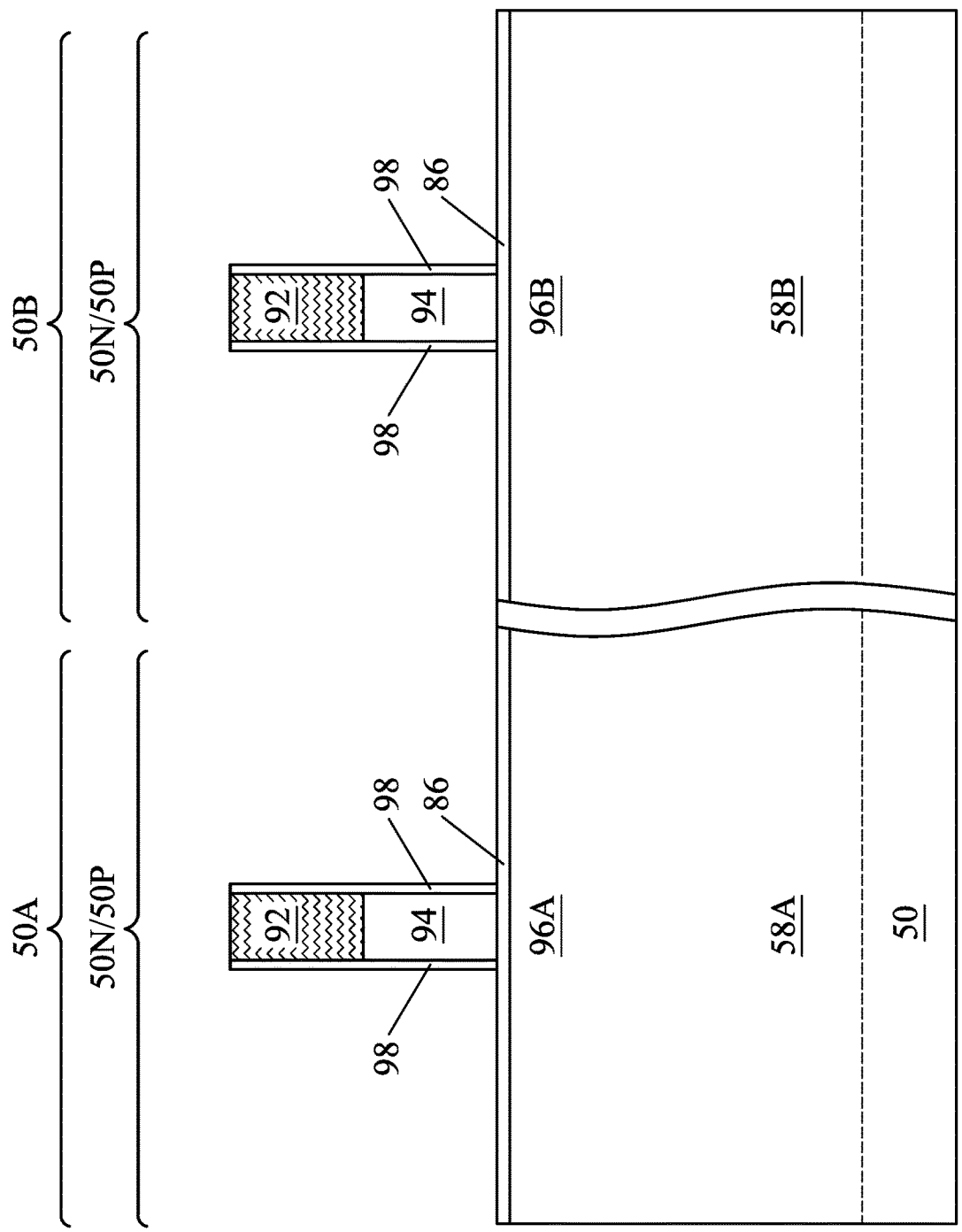
Figure 16C:
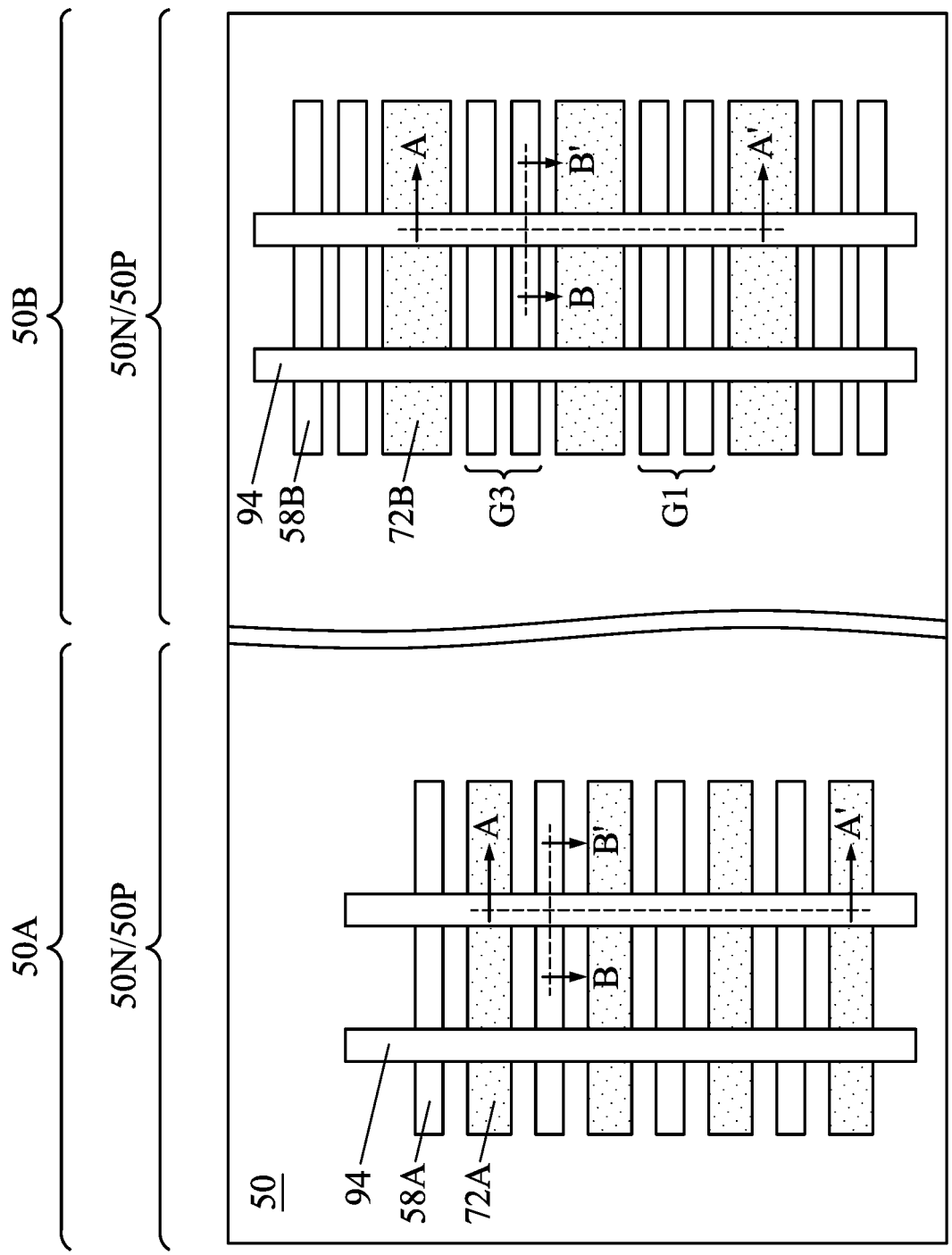

FIGS. 16A-16C illustrate the formation of dummy gates 94 in accordance with some embodiments. FIG. 16C illustrates a top view showing only the dummy gates 94, the fins 58A and 58B, and the hybrid fins 72A and 72B, with other features being omitted for clarity. FIG. 16A illustrates a cross-section view along a section AA' in FIG. 16C. FIG. 16B illustrates a cross-section view along a section BB' in FIG. 16C. In some embodiments, the mask layer 90 (see FIG. 15) may be patterned using acceptable photolithography and etch techniques to form masks 92. The pattern of the masks 92 then may be transferred to the dummy gate layer 88 (see FIG. 15) to form dummy gates 94. In some embodiments (not illustrated), the pattern of the masks 92 may also be transferred to the dummy dielectric layer 86 by an acceptable etching technique. The dummy gates 94 cover respective channel regions 96A and 96B of the fins 58A and 58B, respectively. The pattern of the masks 92 may be used to physically separate each of the dummy gates 94 from adjacent dummy gates. The dummy gates 94 may also have a lengthwise direction substantially perpendicular to the lengthwise direction of respective fins 58A and 58B (see FIG. 16C). As described below in greater detail, some or all of the dummy gates 94 may be replaced by replacement gates. Accordingly, the dummy gates 94 may be also referred to as sacrificial gates.

Further in FIGS. 16A-16C, gate seal spacers 98 may be formed on exposed surfaces of the dummy gates 94, the masks 92, and/or the fins 58A and 58B. A thermal oxidation or a deposition followed by an anisotropic etch may form the gate seal spacers 98. The gate seal spacers 98 may be formed of silicon oxide, silicon nitride, silicon oxynitride, or the like.

After the formation of the gate seal spacers 98, implants for lightly doped source/drain (LDD) regions (not explicitly illustrated) may be performed. In the embodiments with different device types, similar to the implants discussed above in FIG. 13, a mask, such as a photoresist, may be formed over the n-type regions 50N, while exposing the p-type regions 50P, and appropriate type (e.g., p-type) impurities may be implanted into the exposed fins 58A and 58B in the p-type regions 50P. The mask may then be removed. Subsequently, a mask, such as a photoresist, may be formed over the p-type regions 50P while exposing the n-type regions 50N, and appropriate type impurities (e.g., n-type) may be implanted into the exposed fins 58A and 58B in the n-type regions 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 17A:
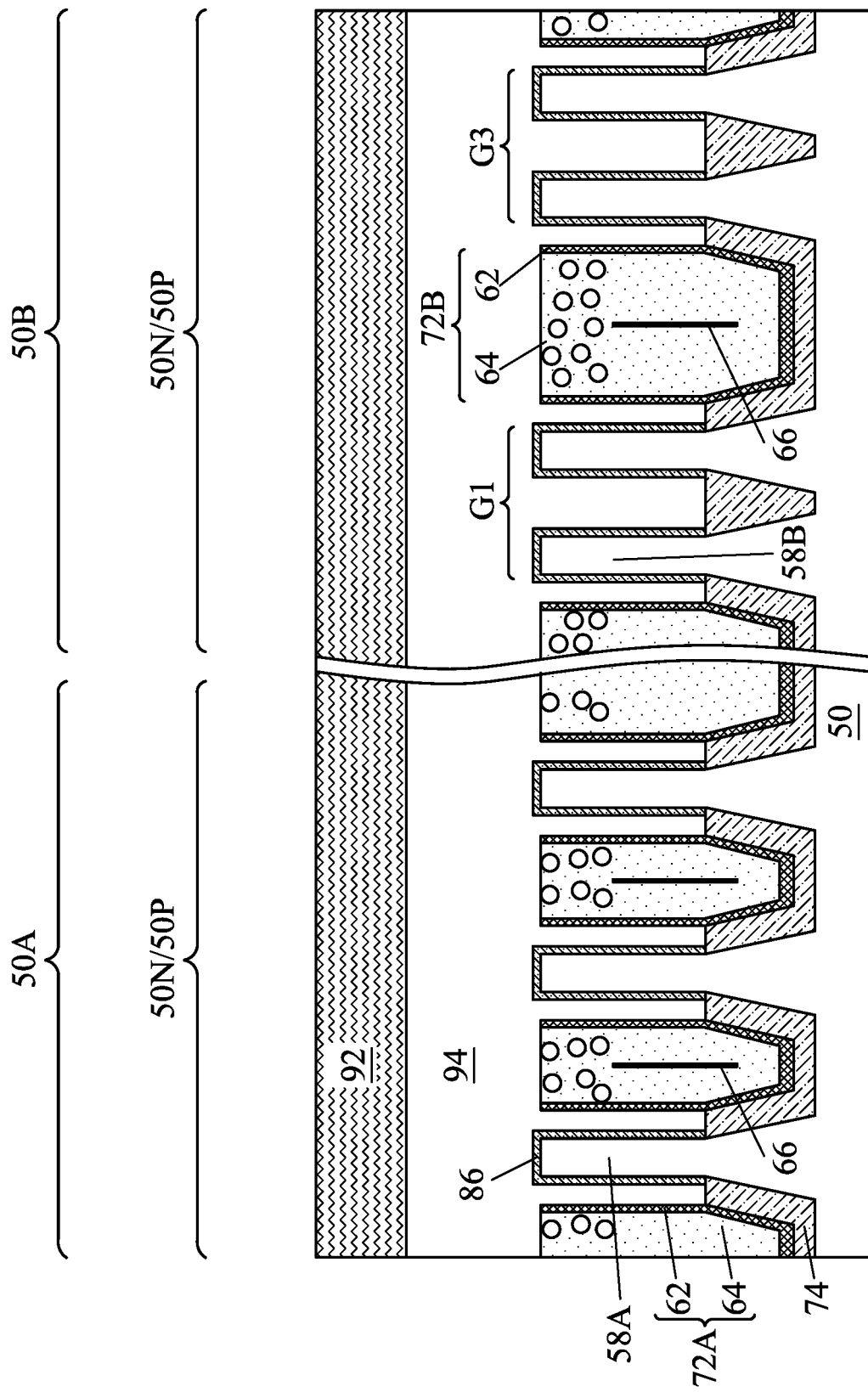
Figure 17B:
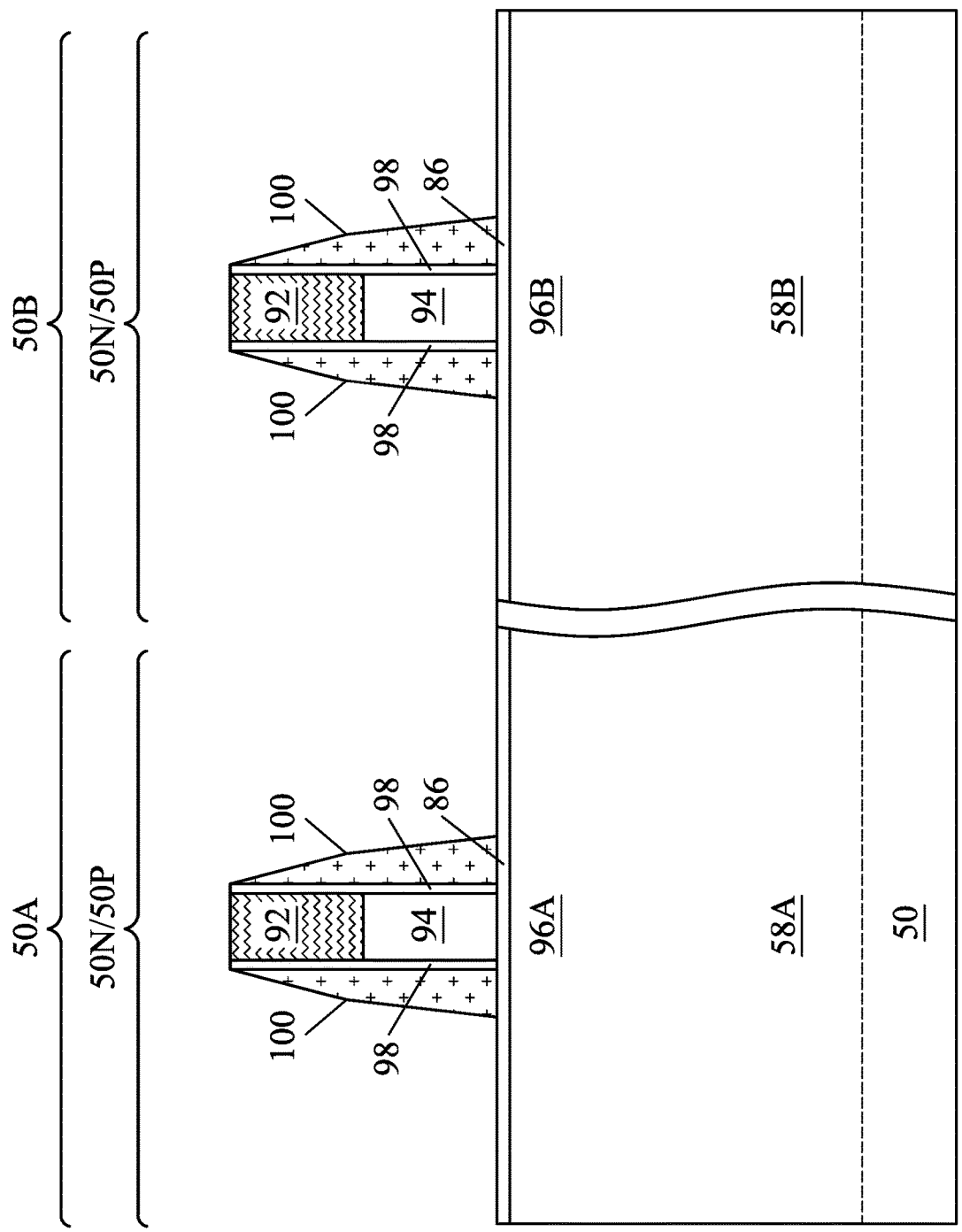

In FIGS. 17A and 17B, gate spacers 100 are formed on the gate seal spacers 98 along sidewalls of the dummy gates 94 and the masks 92. The gate spacers 100 may be formed by conformally depositing an insulating material and subsequently anisotropically etching the insulating material. The insulating material of the gate spacers 100 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 98 may not be etched prior to forming the gate spacers 100, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 98 while the LDD regions for p-type devices may be formed after forming the gate seal spacers 98.

Figure 18A:
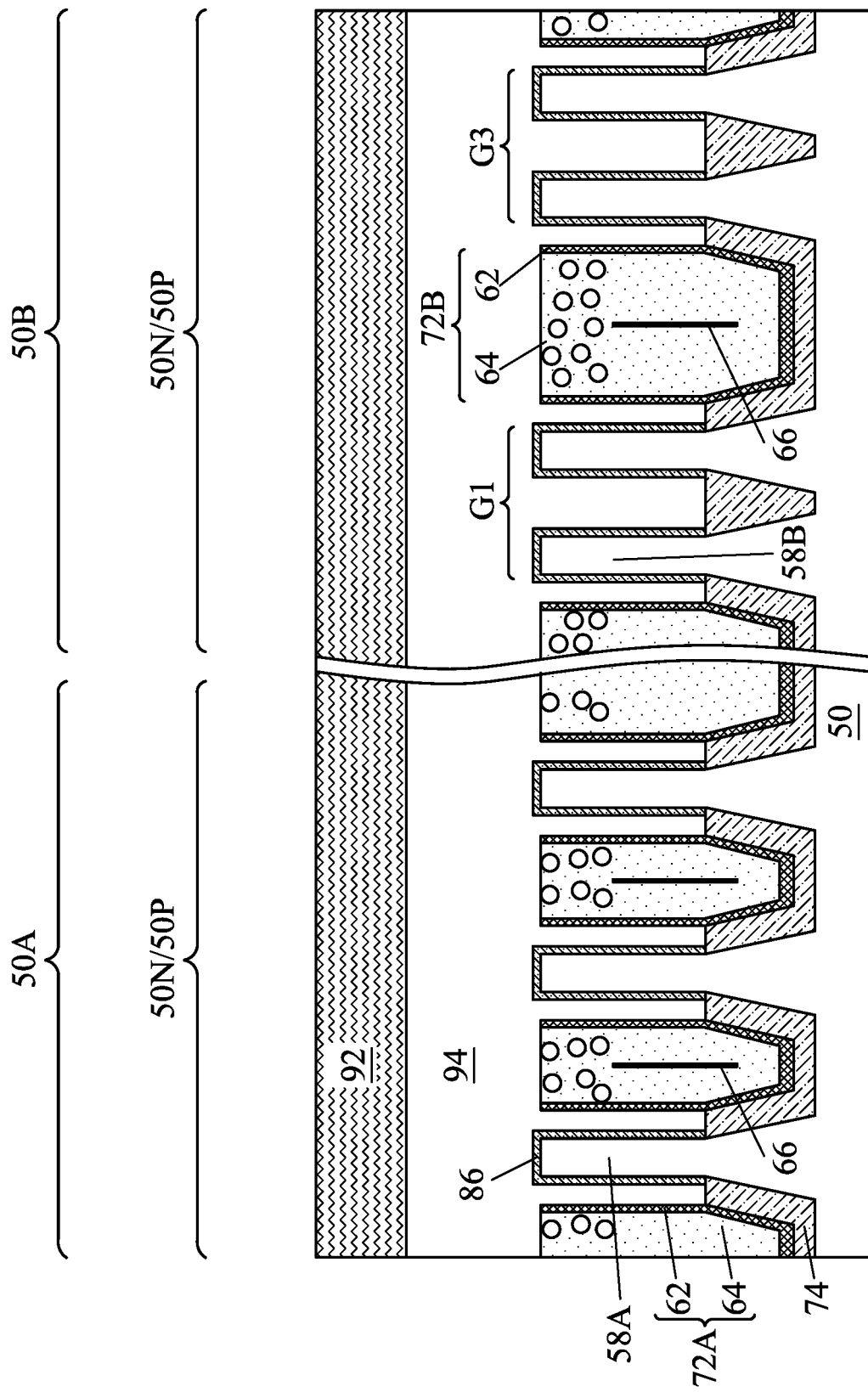
Figure 18B:
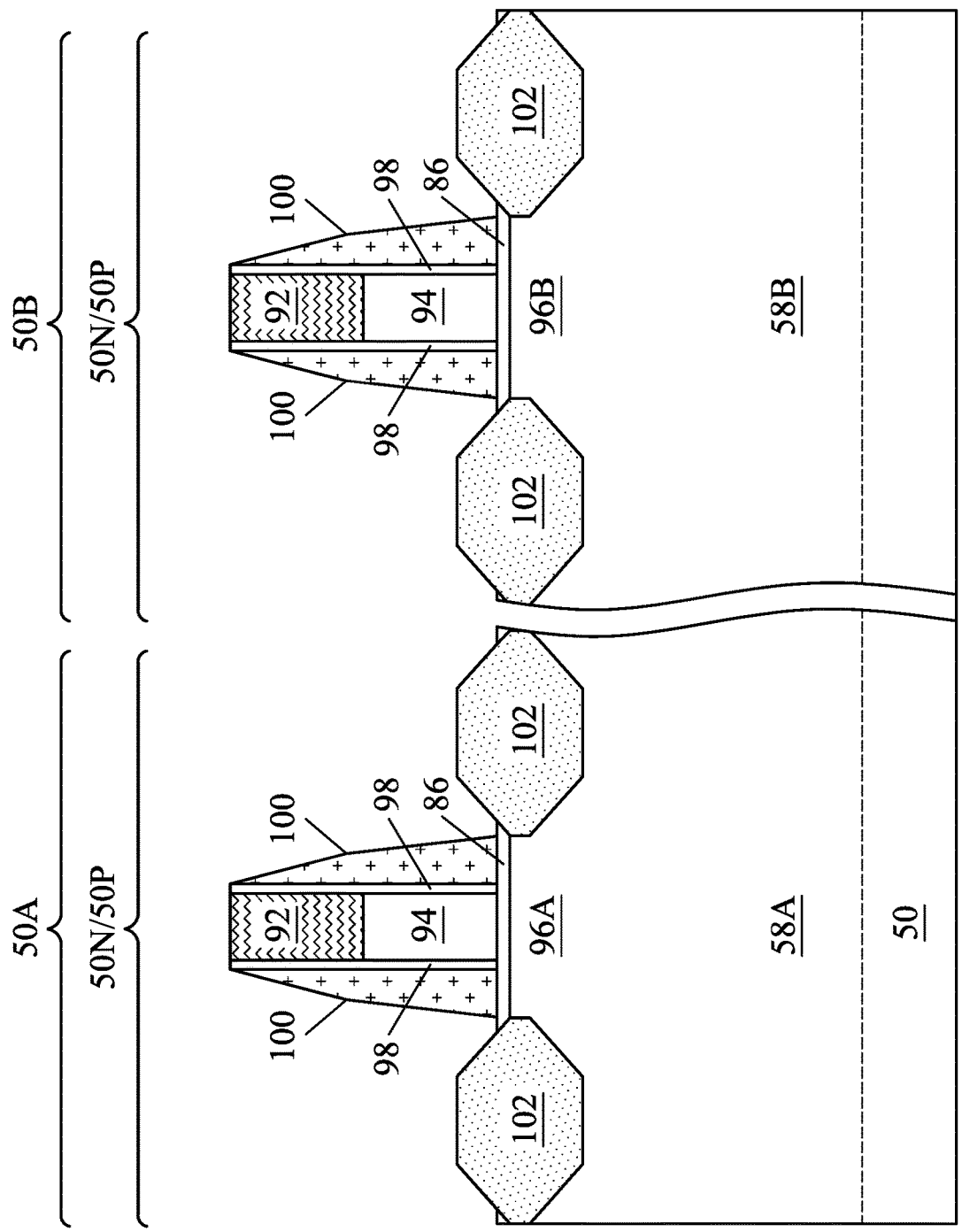
Figure 18C:
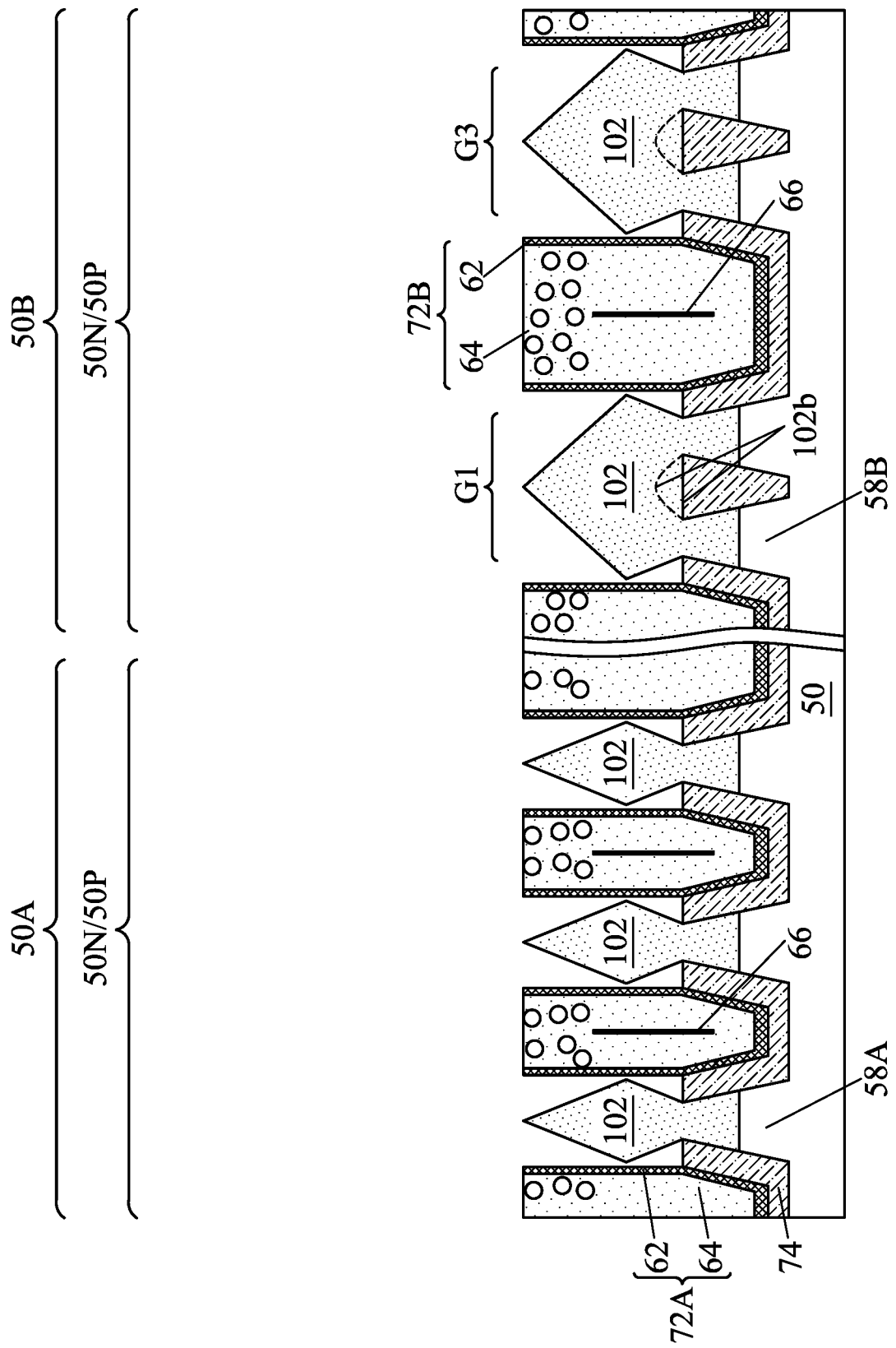

In FIGS. 18A-18C, epitaxial source/drain regions 102 are formed in the fins 58A and 58B. The epitaxial source/drain regions 102 are formed in the fins 58A and 58B such that each dummy gate 94 is disposed between respective neighboring pairs of the epitaxial source/drain regions 102. In some embodiments, the epitaxial source/drain regions 102 may extend into, and may also penetrate through, the fins 58A and 58B. In some embodiments, the gate spacers 100 are used to separate the epitaxial source/drain regions 102 from the dummy gates 94 by an appropriate lateral distance so that the epitaxial source/drain regions 102 do not short out subsequently formed gates of the resulting FinFETs. A material of the epitaxial source/drain regions 102 may be selected to exert stress in the respective channel regions 96A and 96B, thereby improving performance.

The epitaxial source/drain regions 102 in the n-type regions 50N may be formed by masking the p-type regions 50P and etching source/drain regions of the fins 58A and 58B in the n-type regions 50N to form recesses in the fins 58A and 58B. Then, the epitaxial source/drain regions 102 in the n-type regions 50N are epitaxially grown in the recesses. The epitaxial source/drain regions 102 may include any acceptable material, such as appropriate for n-type FinFETs. For example, if the fins 58A and 58B are made of silicon, the epitaxial source/drain regions 102 in the n-type regions 50N may include materials exerting a tensile strain in the channel regions 96A and 96B, such as silicon, silicon carbide, phosphorous doped silicon carbide, silicon phosphide, or the like. The epitaxial source/drain regions 102 in the n-type regions 50N may have surfaces raised from respective surfaces of the fins 58A and 58B and may have facets.

The epitaxial source/drain regions 102 in the p-type regions 50P may be formed by masking the n-type regions 50N and etching source/drain regions of the fins 58A and 58B in the p-type regions 50P to form recesses in the fins 58A and 58B. Then, the epitaxial source/drain regions 102 in the p-type regions 50P are epitaxially grown in the recesses. The epitaxial source/drain regions 102 may include any acceptable material, such as appropriate for p-type FinFETs. For example, if the fins 58A and 58B are made of silicon, the epitaxial source/drain regions 102 in the p-type regions 50P may comprise materials exerting a compressive strain in the channel regions 96A and 96B, such as silicon-germanium, boron doped silicon-germanium, germanium, germanium tin, or the like. The epitaxial source/drain regions 102 in the p-type regions 50P may have surfaces raised from respective surfaces of the fins 58A and 58B and may have facets.

The epitaxial source/drain regions 102 and/or the fins 58A and 58B may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 102 may be in situ doped during growth.

Further in FIG. 18C, as a result of the epitaxy processes used to form the epitaxial source/drain regions 102, upper surfaces of the epitaxial source/drain regions have facets which expand laterally outward beyond sidewalls of the fins 58A and 58B. In some embodiments, in the second region 50B, this lateral expansion causes adjacent source/drain regions 102 formed in the fins 58B within each of the fin groups (such as the fin groups G1 and G3) to merge. In the second region 50B, the merged source/drain regions 102 formed over respective fin groups remain unmerged due the hybrid fins 72B formed between adjacent fin groups. In some embodiments, bottom surfaces 102b of the merged source/drain regions 102 in the second region 50B are in physical contact with the STI regions 74. In other embodiments, bottom surfaces 102b (illustrated by dashed lines in FIG. 18C) of the merged source/drain regions 102 in the second region 50B are spaced apart from the STI regions 74. In some embodiments, in the first region 50A, the source/drain regions 102 formed in respective fins 58A remain unmerged due the hybrid fins 72A formed between adjacent fins 58A. In some embodiments, topmost portions of the seams 66 are below the topmost portions of the source/drain regions 102.

Figure 19A:
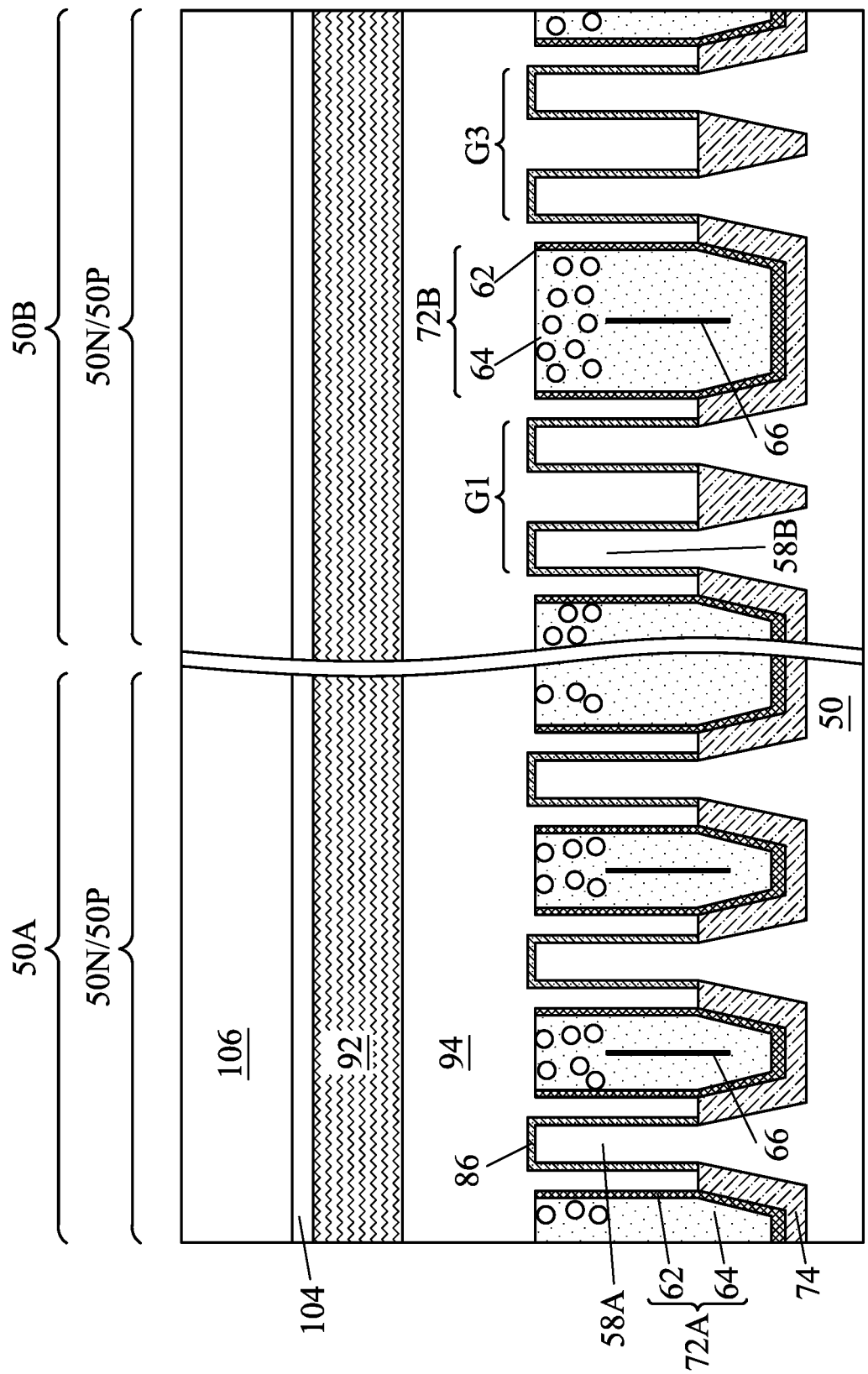
Figure 19B:
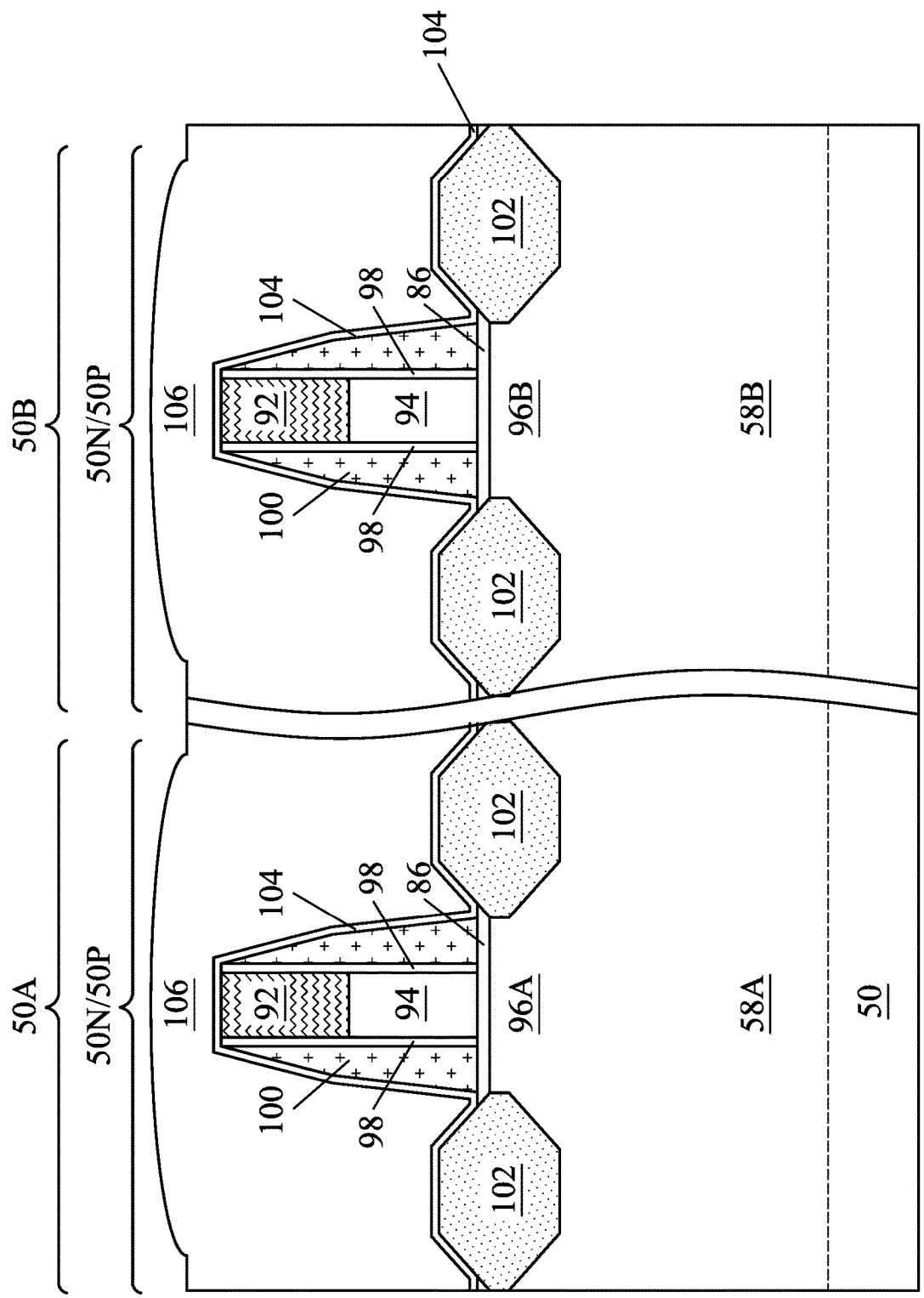

In FIGS. 19A and 19B, a first interlayer dielectric (ILD) 106 is deposited over the structure illustrated in FIGS. 18A-18C. The first ILD 106 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 104 is disposed between the first ILD 106 and the epitaxial source/drain regions 102, the masks 92, and the gate spacers 100. The CESL 104 may comprise a dielectric material, such as, silicon nitride, silicon oxide, silicon oxynitride, a combination thereof, or the like, having a lower etch rate than the material of the overlying first ILD 106.

Figure 20A:
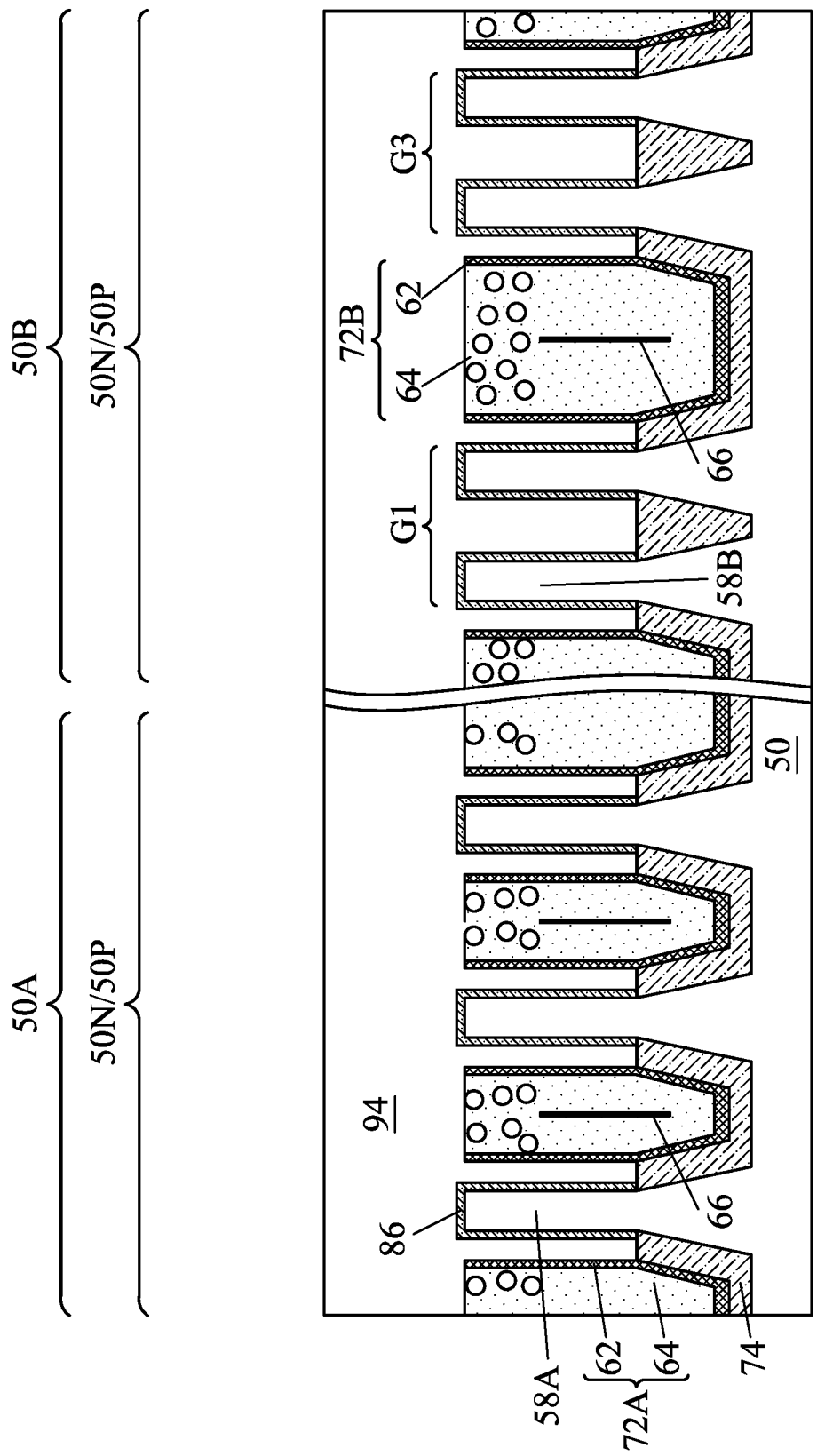
Figure 20B:
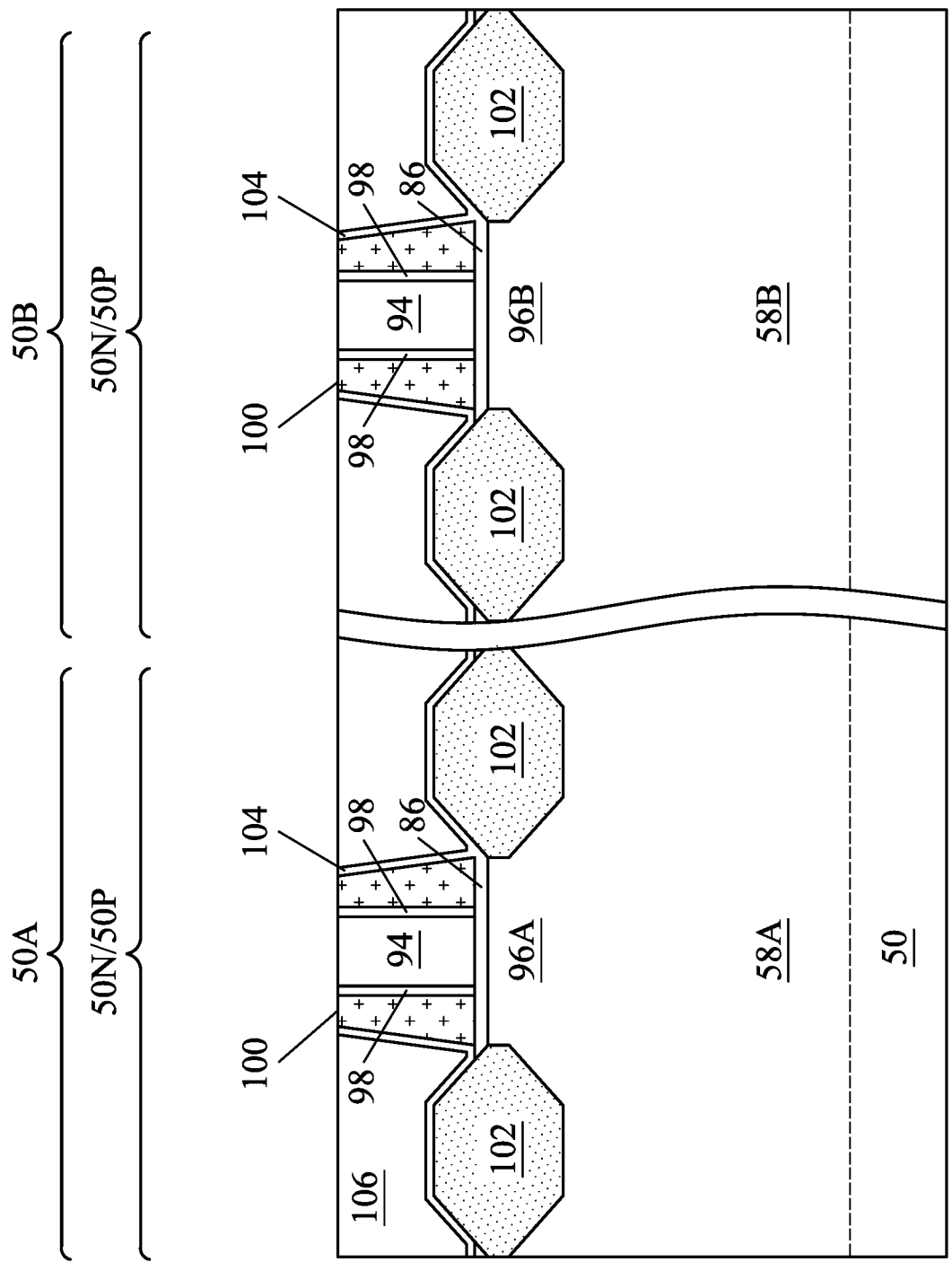

In FIGS. 20A and 20B, a planarization process, such as a CMP, may be performed to level a top surface of the first ILD 106 with top surfaces of the dummy gates 94 or the masks 92 (see FIGS. 19A and 19B). The planarization process may also remove the masks 92 on the dummy gates 94, and portions of the CESL 104, the gate seal spacers 98, and the gate spacers 100 along sidewalls of the masks 92. After the planarization process, top surfaces of the dummy gates 94, the gate seal spacers 98, the gate spacers 100, the CESL 104, and the first ILD 106 are substantially level or coplanar within process variations of the planarization process. Accordingly, the top surfaces of the dummy gates 94 are exposed through the first ILD 106. In some embodiments, the masks 92 may remain, in which case the planarization process levels the top surface of the first ILD 106 with the top surfaces of the masks 92.

Figure 21A:
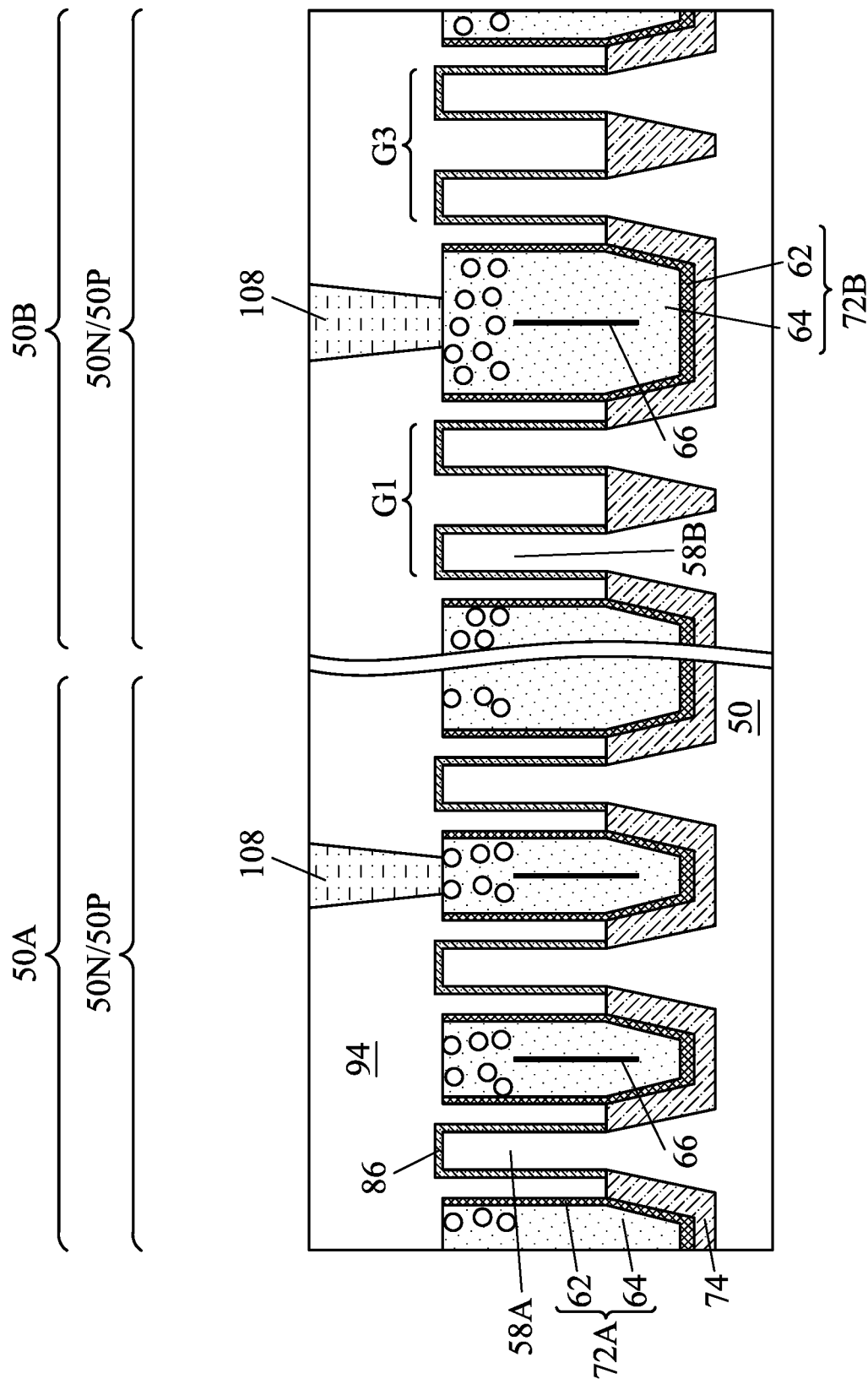
Figure 21B:
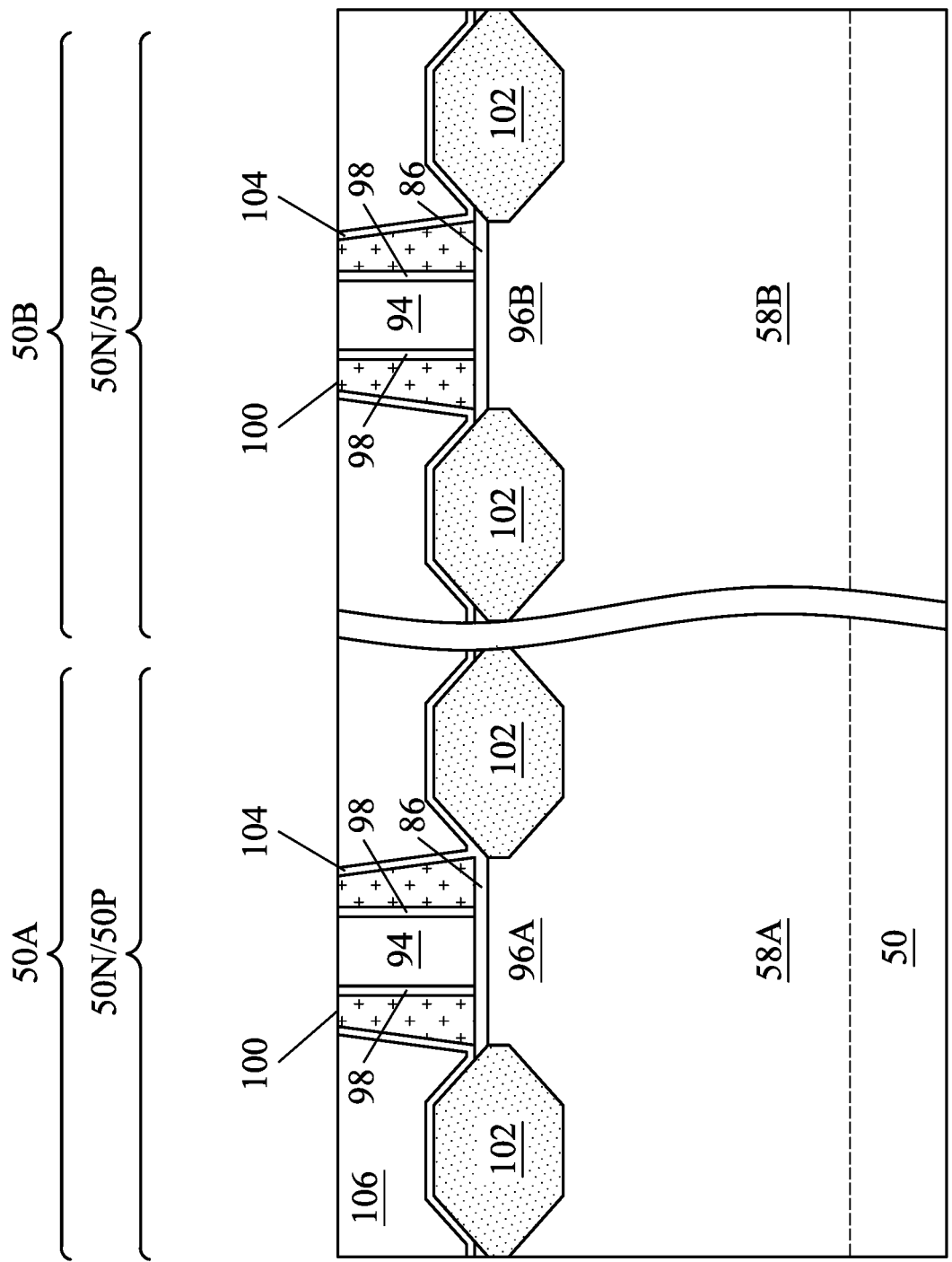

In FIGS. 21A and 21B, a gate cut process is performed on the dummy gates 94. In some embodiments, the dummy gates 94 are patterned to form openings therein, with the openings cutting the dummy gates 94 into disconnected portions. The patterning process may comprise suitable photolithography and etch processes. The etch process may comprise an anisotropic dry etch process, or the like. In some embodiment, the openings formed in the first region 50A expose respective hybrid fins 72A and the openings formed in the second region 50B expose respective hybrid fins 72B. Subsequently, the isolation regions 108 are formed in the openings. The isolation regions 108 may comprise an insulating material, such as silicon nitride, silicon oxide, silicon oxynitride, a combination thereof, or the like. In some embodiments, the material of the isolation regions 108 is deposited in the openings and over the dummy gates 94 using ALD, CVD, a combination thereof, or the like. Subsequently, a planarization process, such as a CMP, may be performed on the material of the isolation regions 108 to level top surfaces of the isolation regions 108 with the top surfaces of the dummy gates 94. After the planarization process, the top surfaces of the isolation regions 108 and the top surfaces of the dummy gates 94 are substantially level or coplanar within process variations of the planarization process.

Figure 22A:
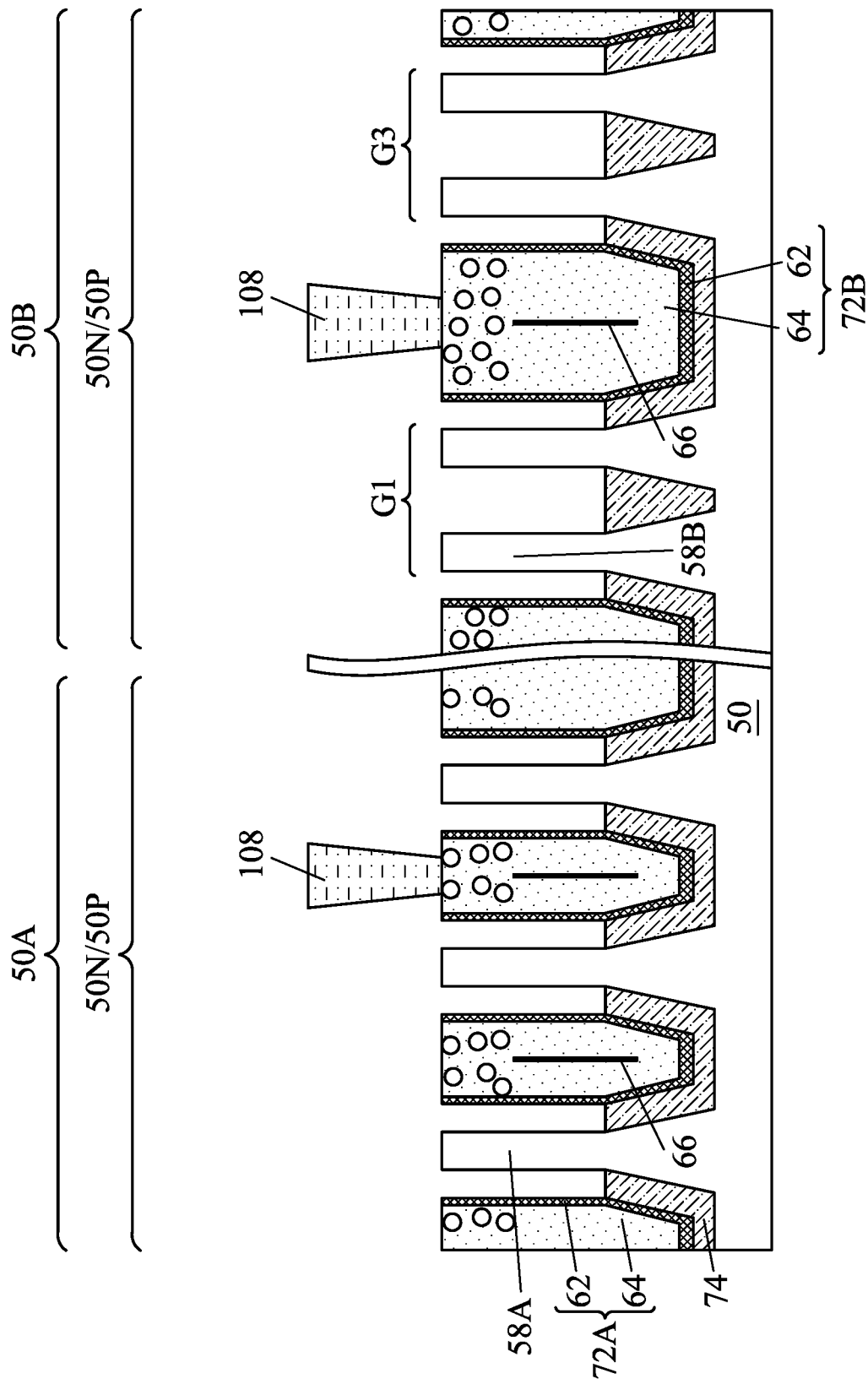
Figure 22B:
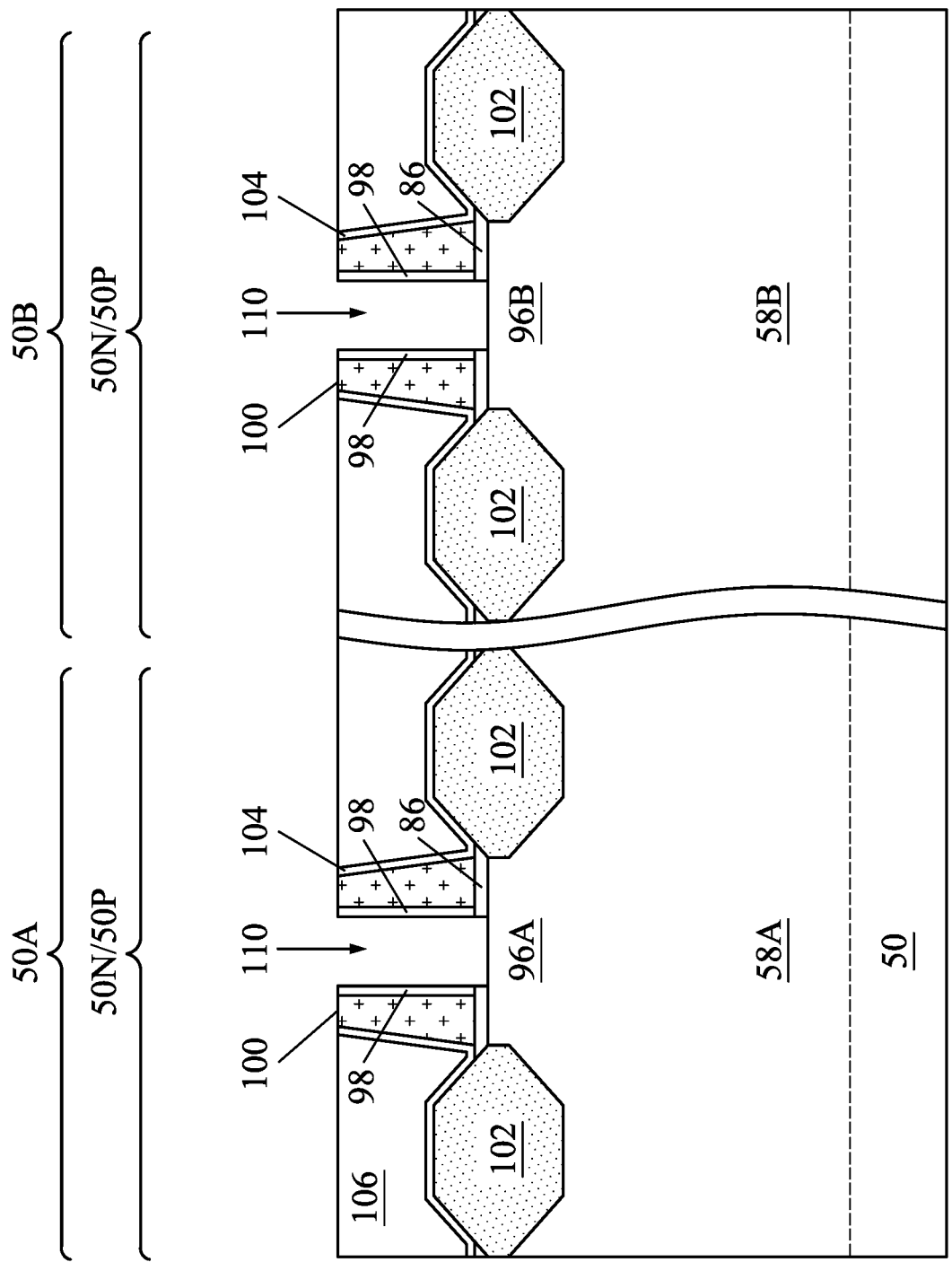

In FIGS. 22A and 22B, the dummy gates 94, and the masks 92 (if present), are removed in an etching step(s), so that recesses 110 are formed. Portions of the dummy dielectric layer 86 in the recesses 110 may also be removed. In some embodiments, only the dummy gates 94 are removed and the dummy dielectric layer 86 remains and is exposed by the recesses 110. In some embodiments, the dummy gates 94 are removed by an anisotropic dry etch process. For example, the etching process may include a dry etch process using reaction gas(es) that selectively etch the dummy gates 94 with little or no etching of the first ILD 106, the CESL 104, the gate seal spacers 98, or the gate spacers 100. Each recess 110 in the first region 50A exposes and/or overlies a channel region 96A of a respective fin 58A. Each recess 110 in the second region 50B exposes and/or overlies a channel region 96B of a respective fin 58B. During the removal, the dummy dielectric layer 86 may be used as an etch stop layer when the dummy gates 94 are etched. The dummy dielectric layer 86 may then be optionally removed after the removal of the dummy gates 94.

Figure 23A:
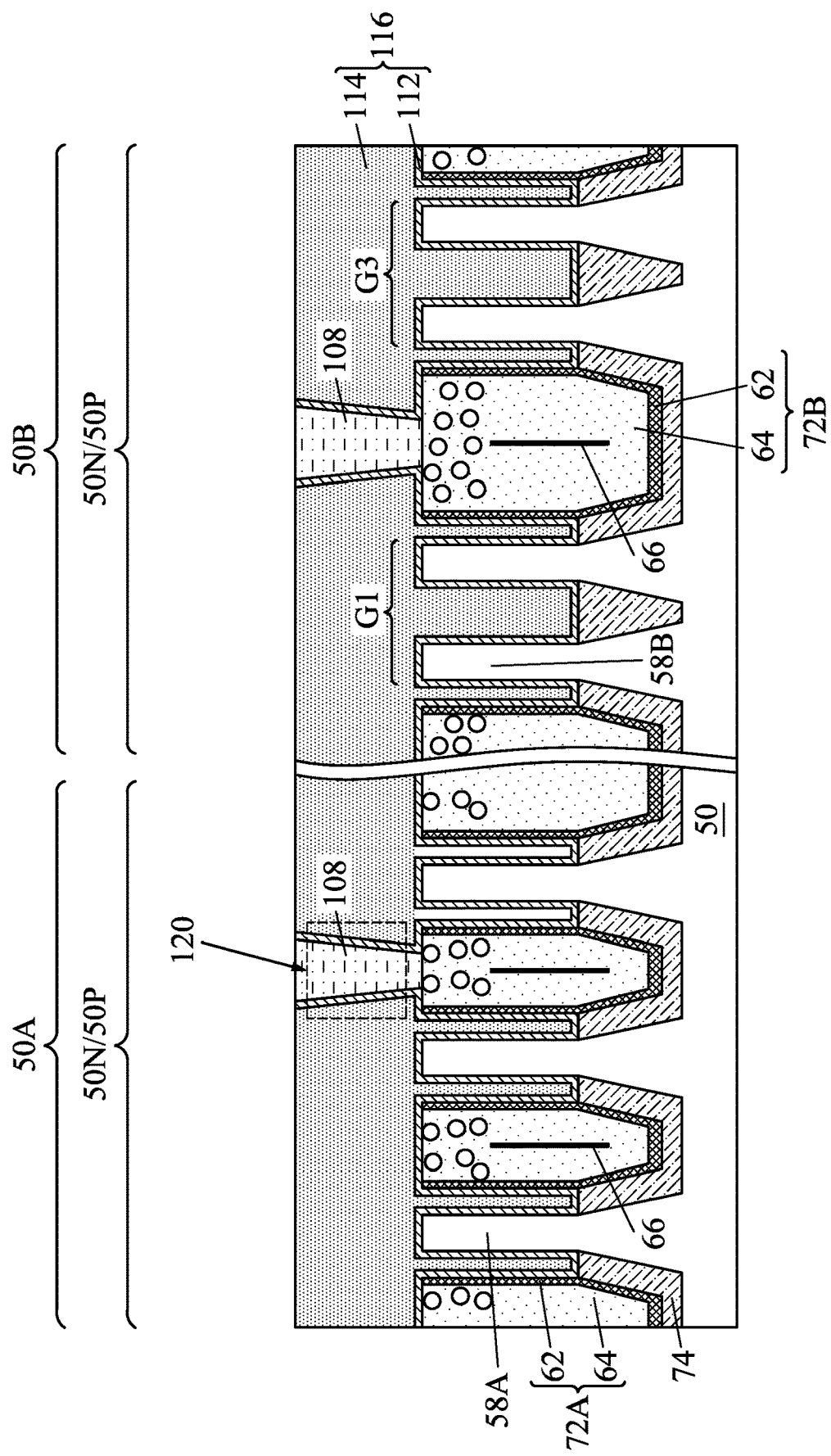
Figure 23B:
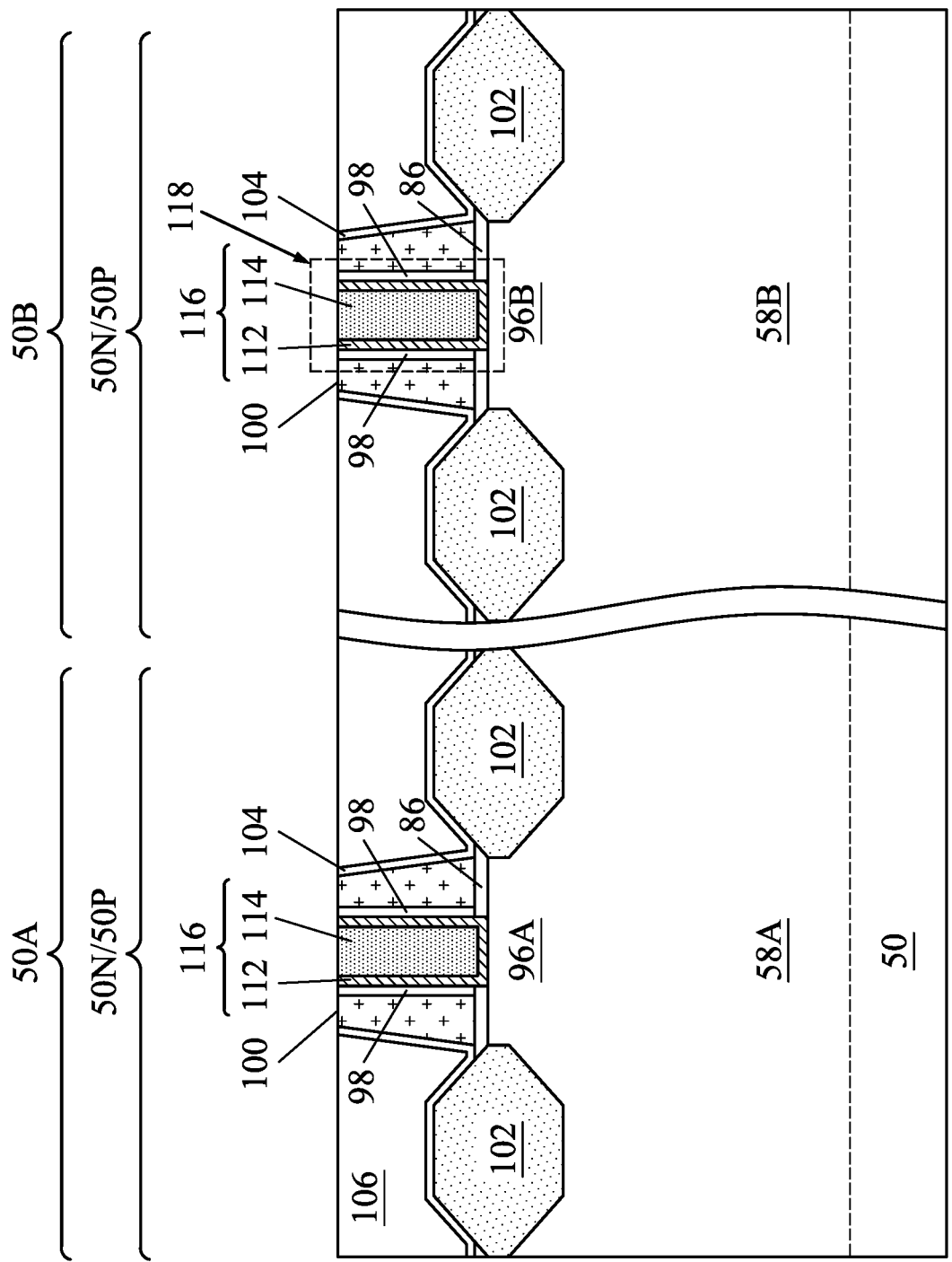
Figure 23C:
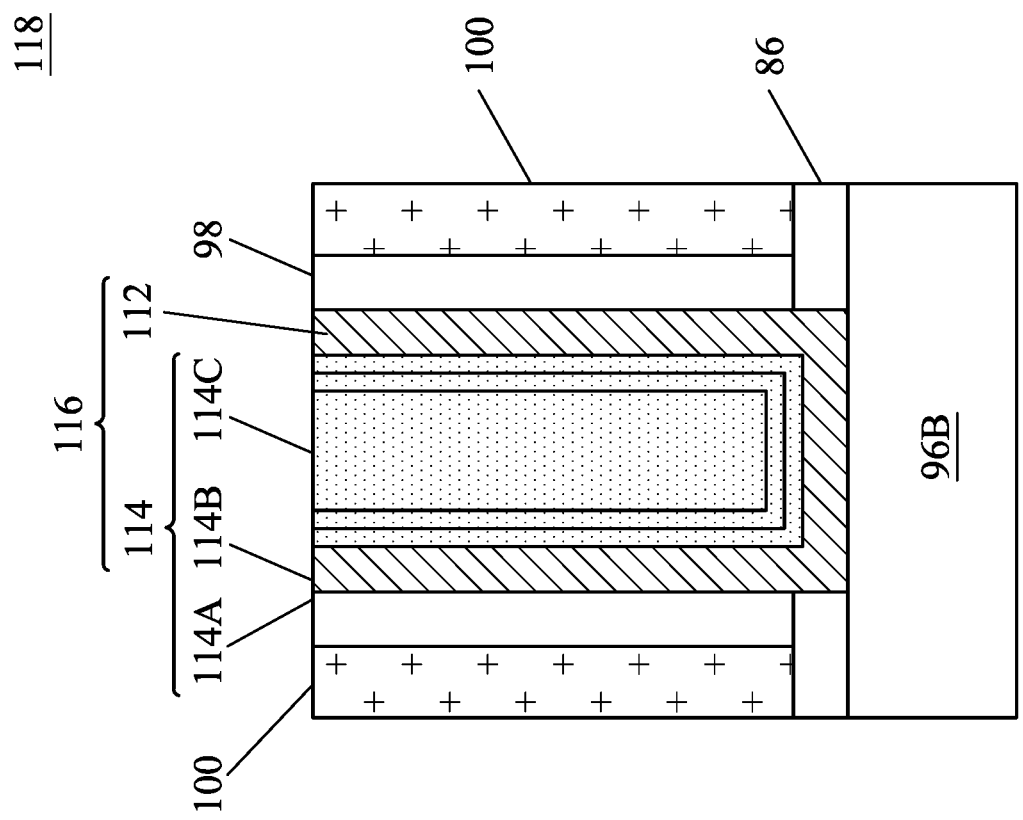
Figure 23D:
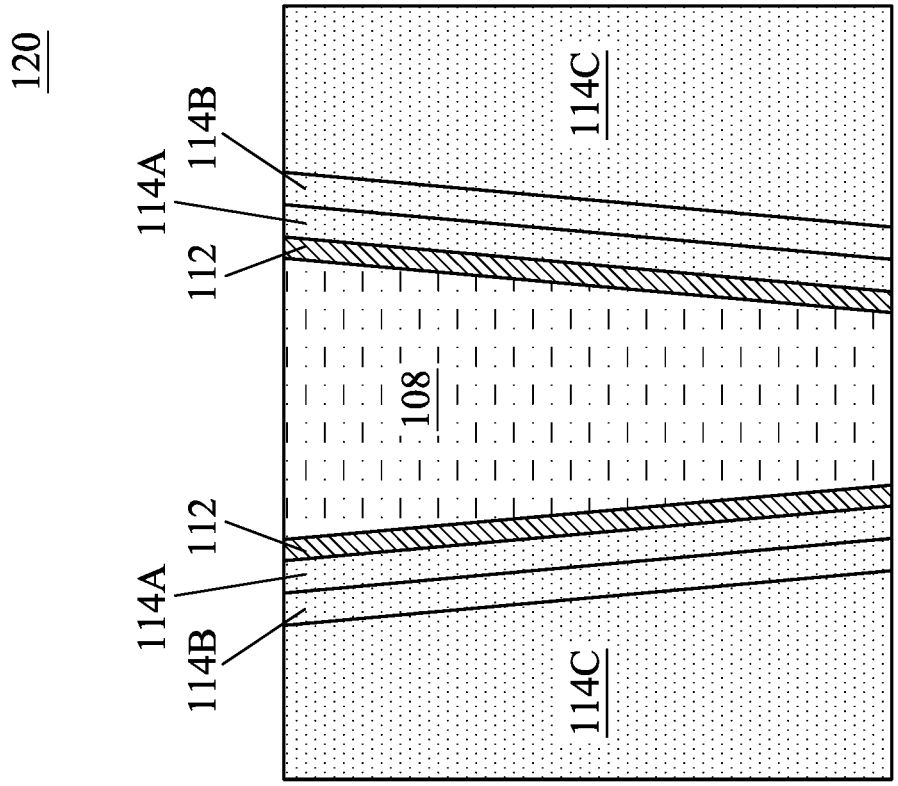

In FIGS. 23A and 23B, gate dielectric layers 112 and gate electrodes 114 are formed in the recesses 110 (see FIGS. 22A and 22B) to form replacement gate stacks 116. FIG. 23C illustrates a detailed view of a region 118 of FIG. 23B. FIG. 23D illustrates a detailed view of a region 120 of FIG. 23A. The replacement gate stacks 116 may also be referred to as gate stacks or metal gate stacks. In some embodiments, all of the dummy gates 94 (FIGS. 21A and 21B) are replaced with the replacement gate stacks 116. In other embodiments, some of the dummy gates 94 are not replaced by the replacement gate stacks 116 and remain in the final structure of the resulting FinFET device.

In some embodiments, the gate dielectric layers 112 are formed in the recesses 110 (see FIGS. 22A and 22B). In some embodiments, the gate dielectric layers 112 may comprise silicon oxide, silicon nitride, or multilayers thereof, or the like. In some embodiments, the gate dielectric layers 112 may include a high-k dielectric material, and in these embodiments, the gate dielectric layers 112 may have a k value greater than about 7.0, and may include a metal oxide or a silicate of hafnium, aluminum, zirconium, lanthanum, manganese, barium, titanium, lead, and combinations thereof, or the like. The gate dielectric layers 112 may be formed using ALD, CVD, or the like. In some embodiments, the gate dielectric layers 112 extend along exposed surfaces of the fins 58A and 58B, the STI regions 74, the hybrid fins 72A and 72B, the isolation regions 108, and the gate seal spacers 98. In other embodiments, the gate dielectric layers 112 extend only along exposed surfaces of the fins 58A and 58B.

Further in FIGS. 23A and 23B, the gate electrodes 114 are deposited over the gate dielectric layers 112 and fill the remaining portions of the recesses 110 (see FIGS. 22A and 22B). Although single layer gate electrodes 114 are illustrated in FIG. 23B, each of the gate electrodes 114 may comprise any number of liner layers 114A, any number of work function tuning layers 114B, and a conductive fill layer 114C as illustrated by FIG. 23C. Furthermore, since the replacement gate stacks 116 are formed after performing the gate cut process (described above with reference to FIGS. 21A and 21B), the gate dielectric layers 112, the liner layers 114A, and the work function tuning layers 114B extend along sidewalls of the isolation regions 108 as illustrated by FIG. 23D.

The liner layers 114A may include TiN, TiO, TaN, TaC, combinations thereof, multi-layers thereof, or the like, and may be formed using PVD, CVD, ALD, a combination thereof, or the like. In the n-type regions 50N of the substrate 50, the work function tuning layers 114B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In the p-type regions 50P of the substrate 50, the work function tuning layers 114B may include TiN, WN, TaN, Ru, Co, combinations thereof, multi-layers thereof, or the like, and may be formed using PVD, CVD, ALD, a combination thereof, or the like. In some embodiments, the conductive fill layer 114C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, a combination thereof, or the like.

After the filling of the recesses 110 (see FIGS. 22A and 22B), a planarization process, such as a CMP process, may be performed to remove the excess portions of the gate dielectric layers 112 and the gate electrodes 114, which excess portions are over the top surface of the first ILD 106. The remaining portions of the gate electrodes 114 and the gate dielectric layers 112 thus form replacement gate stacks 116 of the resulting FinFETs. After the planarization process, top surfaces of the replacement gate stacks 116 are substantially level or coplanar with the top surface of the first ILD 106 within process variations of the planarization process.

The formation of the gate dielectric layers 112 in the n-type regions 50N and the p-type regions 50P of the substrate 50 may occur simultaneously such that the gate dielectric layers 112 in each region are formed of the same materials. In other embodiments, the gate dielectric layers 112 in each region may be formed by distinct processes such that the gate dielectric layers 112 in different regions may be formed of different materials. The formation of the conductive fill layers 114C in the n-type regions 50N and the p-type regions 50P of the substrate 50 may occur simultaneously such that the conductive fill layers 114C in each region are formed of the same materials. In other embodiments, the conductive fill layers 114C in each region may be formed by distinct processes such that the conductive fill layers 114C in different regions may be formed of different materials. Various masking steps may be used to mask and expose appropriate regions when using distinct processes.

Figure 24A:
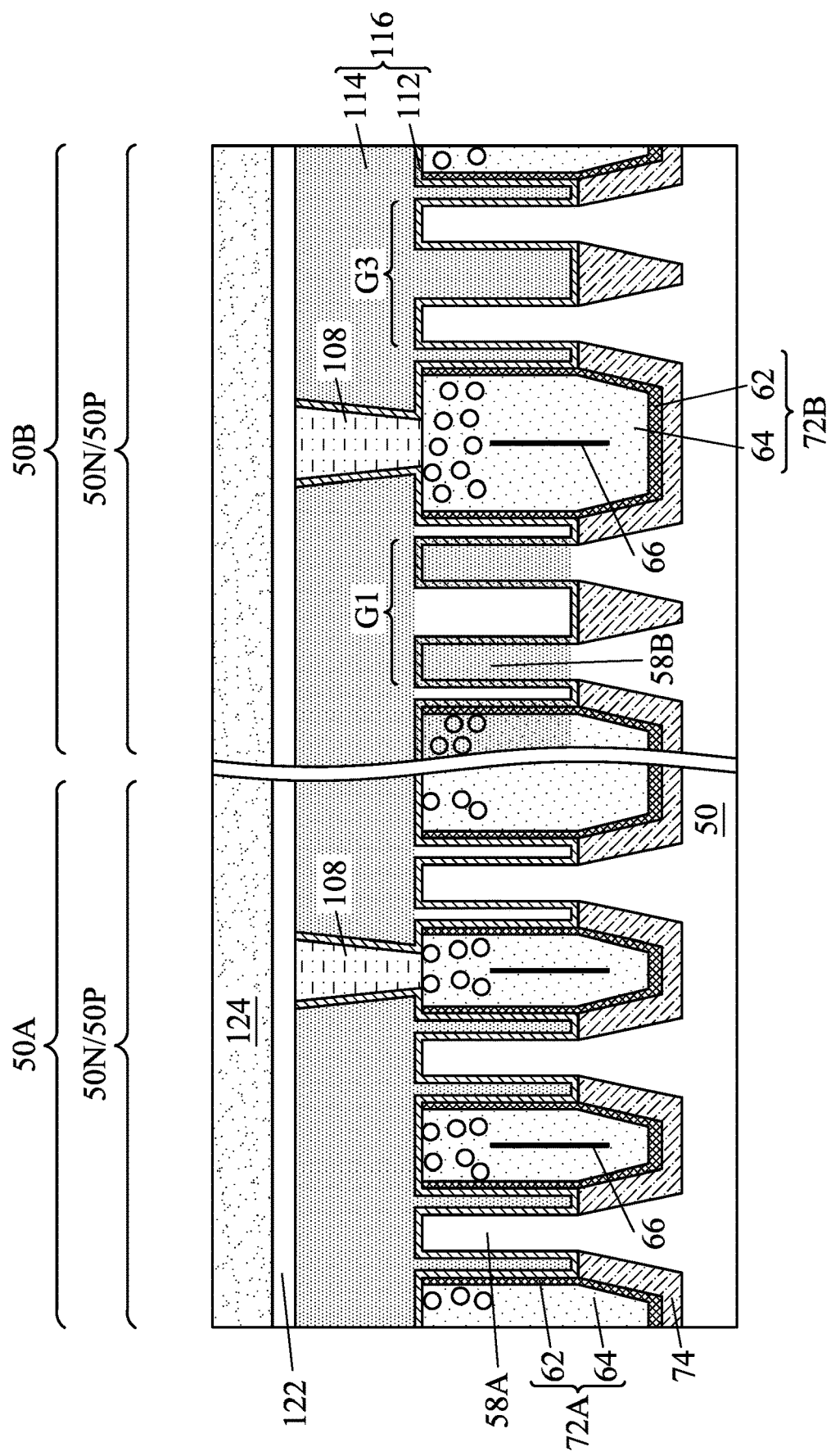
Figure 24B:
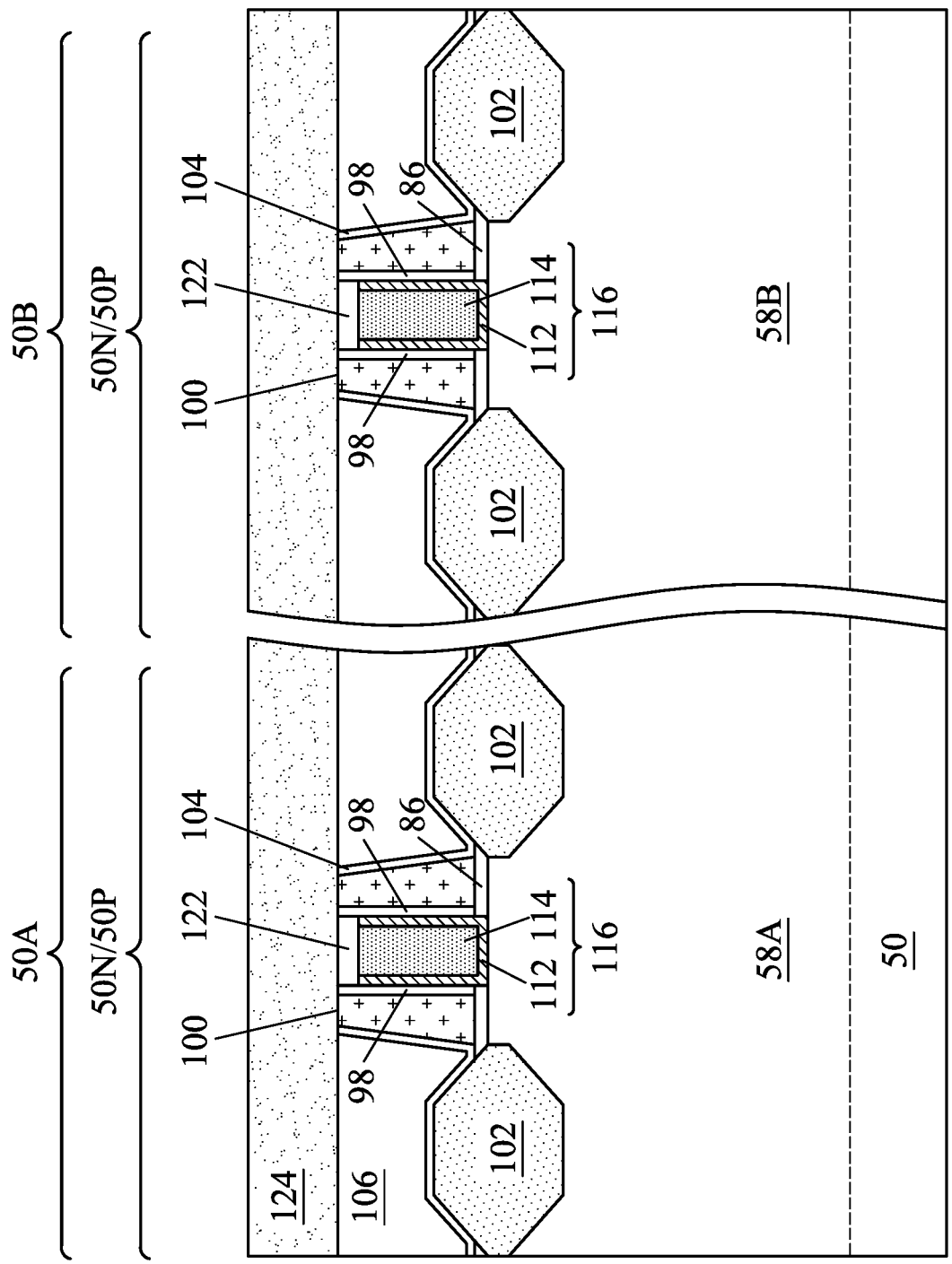

In FIGS. 24A and 24B, gate masks 122 are formed over the gate stacks 116, such that the gate masks 122 are disposed between opposing portions of the gate seal spacers 98 and the gate spacers 100. In some embodiments, forming a gate mask 122 includes recessing a respective gate stack 116 so that a recess is formed directly over the gate stack 116 and between opposing portions of the gate seal spacers 98 and the gate spacers 100. The gate mask 122 comprising one or more layers of dielectric material, such as silicon nitride, silicon oxynitride, or the like, is filled in the recess, followed by a planarization process to remove excess portions of the dielectric material extending over the first ILD 106. The gate masks 122 are optional and may be omitted in some embodiments. In such embodiments, the gate stacks 116 may remain level with the top surface of the first ILD 106.

Further in FIGS. 24A and 24B, a second ILD 124 is deposited over the first ILD 106. In some embodiments, the second ILD 124 may be formed using similar materials and methods as the first ILD 106 described above with reference to FIGS. 19A and 19B, and the description is not repeated herein. In some embodiments, the first ILD 106 and the second ILD 124 comprise a same material. In other embodiments, the first ILD 106 and the second ILD 124 comprise different materials.

Figure 25A:
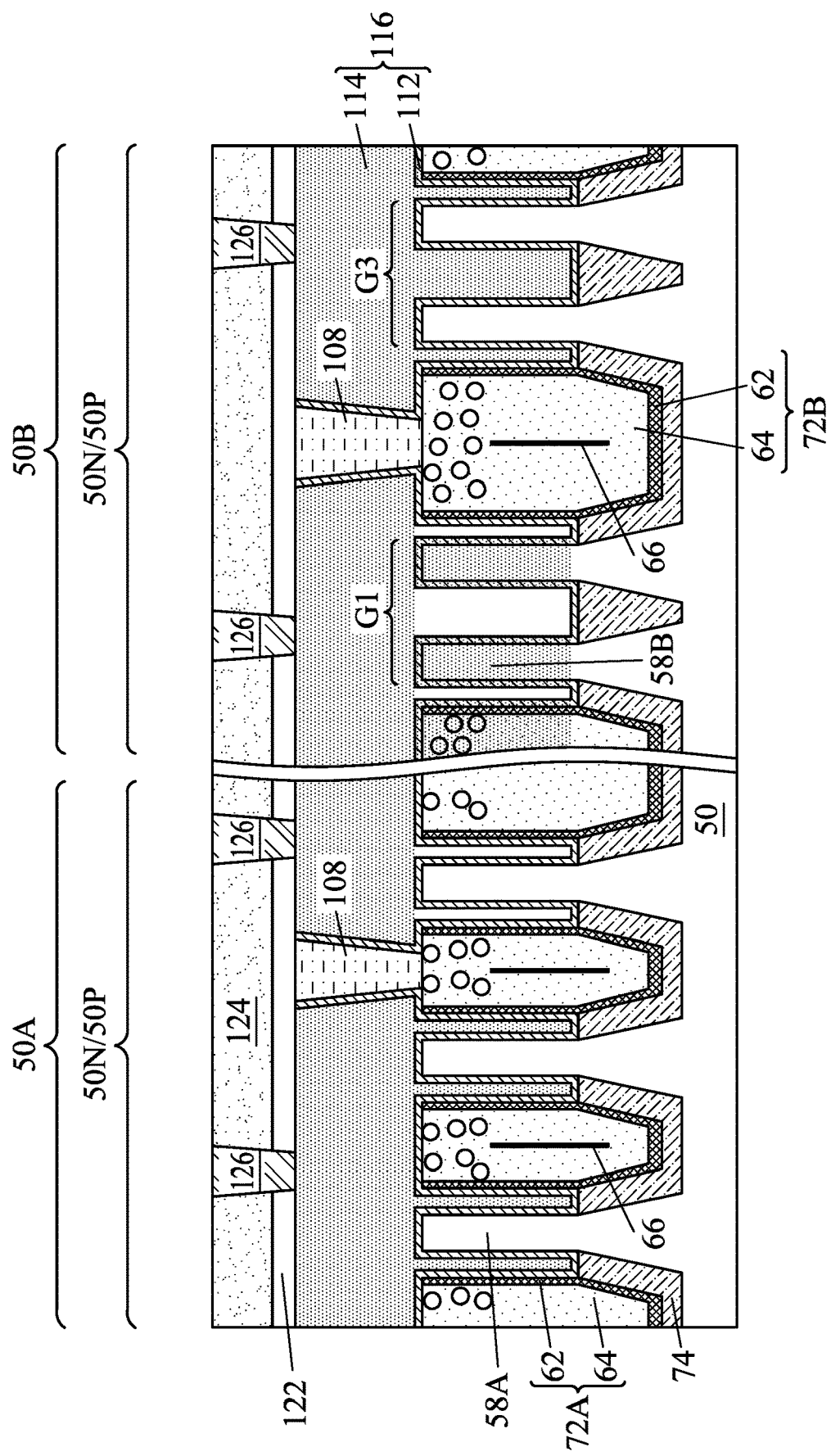
Figure 25B:
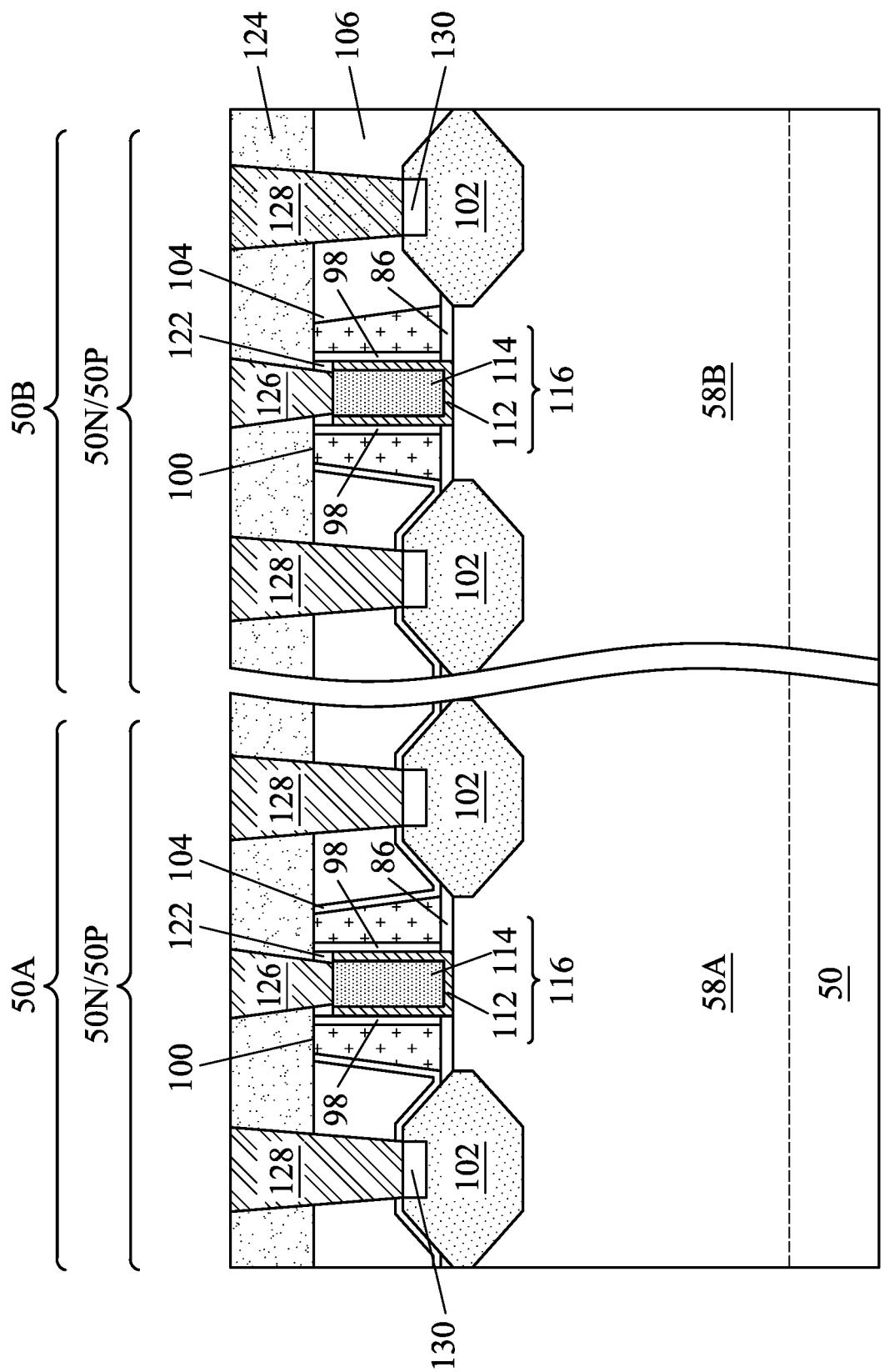

In FIGS. 25A and 25B, gate contacts 126 and source/drain contacts 128 are formed through the second ILD 124 and the first ILD 106 in accordance with some embodiments. Openings for the source/drain contacts 128 are formed through the CESL 104 and the first and second ILDs 106 and 124. Openings for the gate contacts 126 are formed through the second ILD 124 and the gate masks 122. The openings may be formed using acceptable photolithography and etch techniques.

After forming the openings for the source/drain contacts 128, silicide layers 130 are formed through the openings. In some embodiments, a metallic material is deposited in the openings for the source/drain contacts 128. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 130. In some embodiments, the annealing process causes the metallic material to react with semiconductor materials of the epitaxial source/drain regions 102 and form the silicide layers 130. After forming the silicide layers 130, unreacted portions of the metallic material are removed using a suitable removal process, such as a suitable etch process, for example.

Subsequently, a liner, such as a diffusion barrier layer, an adhesion layer, or the like, and a conductive material are formed in the openings for the source/drain contacts 128, and in the openings for the gate contacts 126. The liner may include titanium, titanium nitride, tantalum, tantalum nitride, a combination thereof, or the like. The conductive material may include copper, a copper alloy, silver, gold, tungsten, cobalt, aluminum, nickel, a combination thereof, or the like. A planarization process, such as a CMP process, may be performed to remove excess material from a top surface of the second ILD 124. The remaining portions of the liner and the conductive material form the source/drain contacts 128 and the gate contacts 126 in the respective openings. The source/drain contacts 128 are electrically coupled to the epitaxial source/drain regions 102. The gate contacts 126 are electrically coupled to the gate stacks 116. The source/drain contacts 128 and gate contacts 126 may be formed in different processes, or may be formed in the same process. Although shown as being formed in the same cross-sections, it should be appreciated that each of the source/drain contacts 128 and the gate contacts 126 may be formed in different cross-sections, which may avoid shorting of the contacts.

Figure 26A:
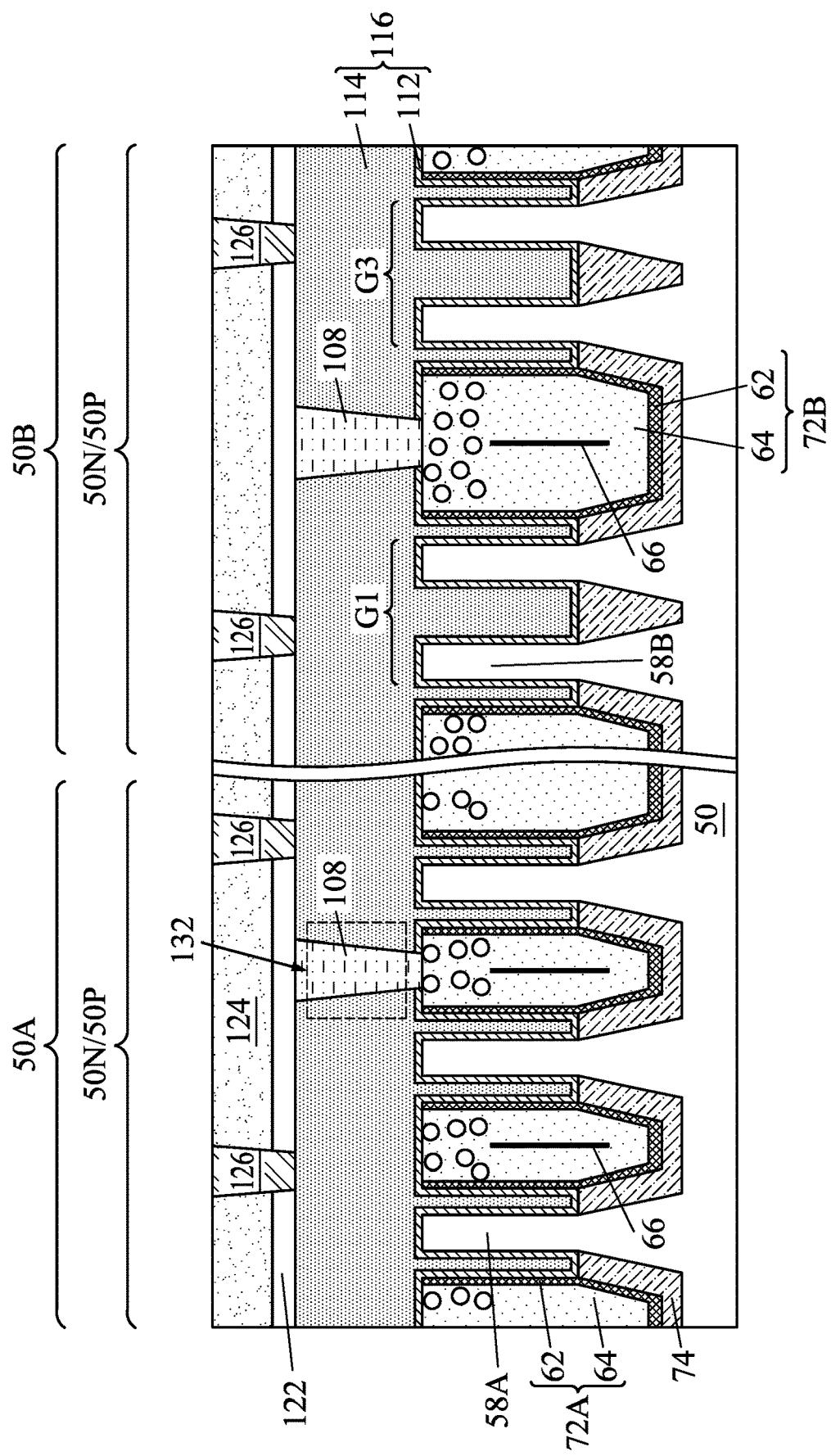
FIGS. 26A-26C are cross-sectional views of a FinFET device in accordance with some embodiments.
Figure 26B:
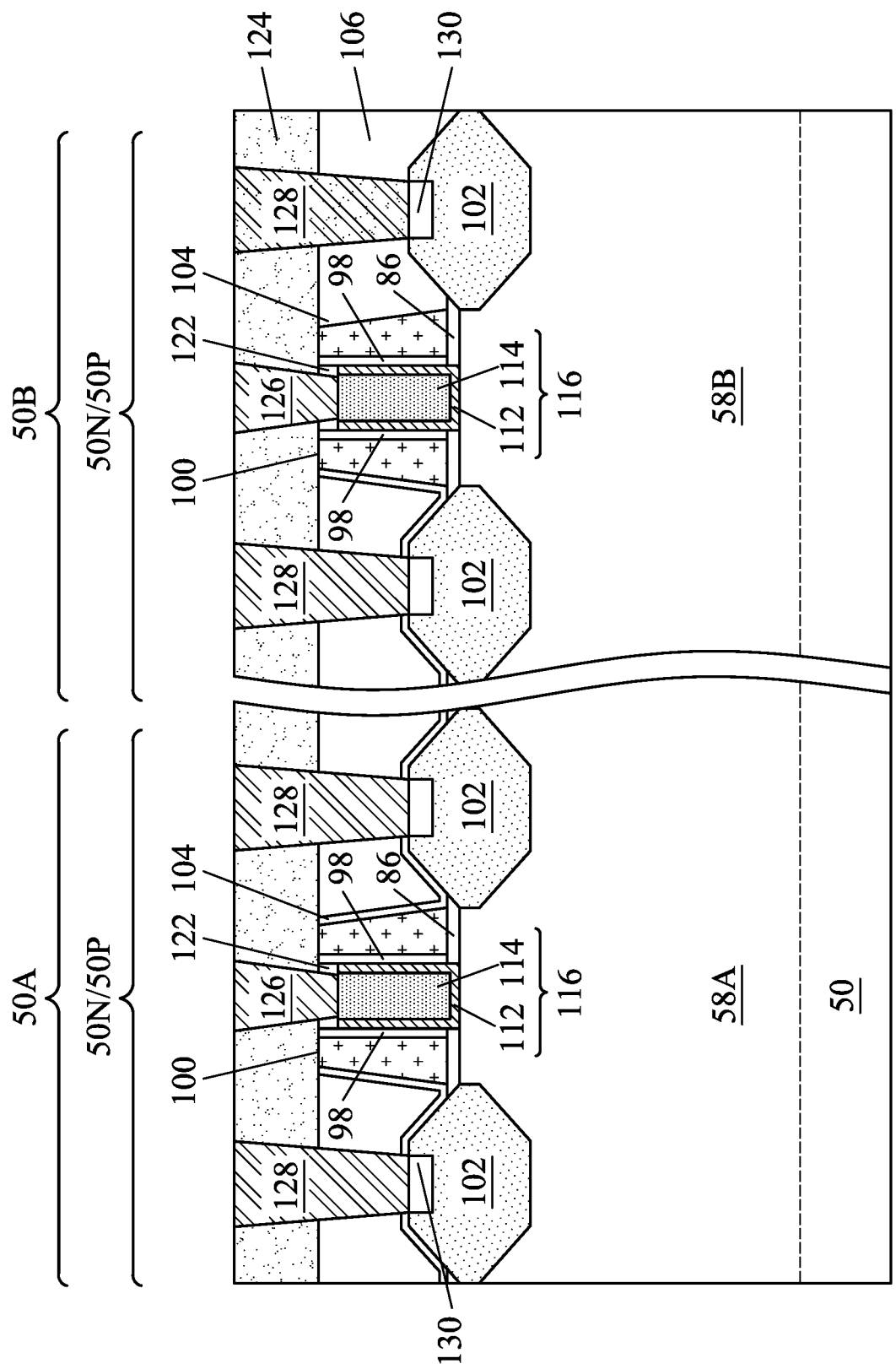
Figure 26C:
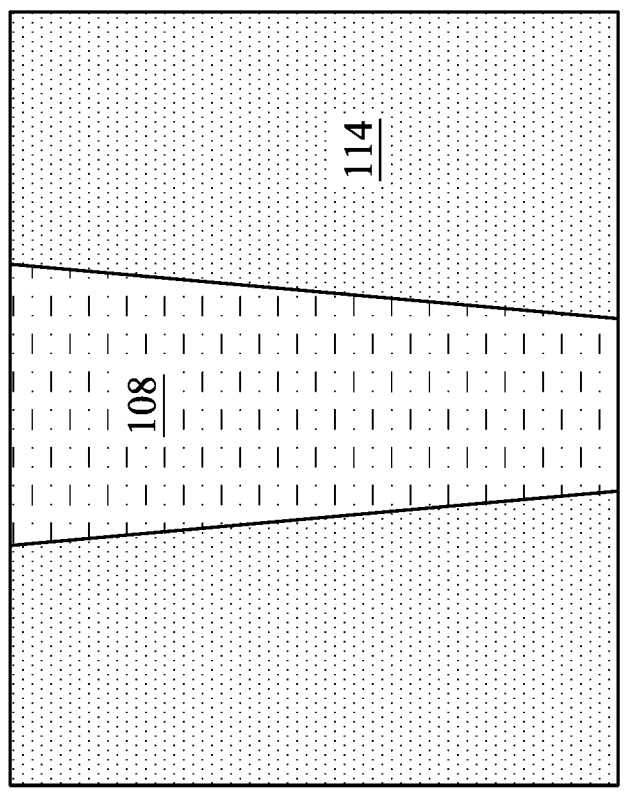

FIGS. 26A-26C illustrate cross-sectional views of a FinFET device in accordance with some embodiments. FIG. 26A illustrates a cross-sectional view along the reference cross-section A-A illustrated in FIG. 1, except for multiple fins. FIG. 26B illustrates a cross-sectional view along the reference cross-section B-B illustrated in FIG. 1, except for multiple gate structures. FIG. 26C illustrates a detailed view of a region 132 of FIG. 26A. The structure illustrated in FIGS. 26A and 26B is similar to the structure illustrated in FIGS. 25A and 25B, with like features being labeled by like numerical references, and descriptions of the like features are not repeated herein. In some embodiments, the structure illustrated in FIGS. 26A and 26B may be form using process steps that are similar to the process steps described above with reference to FIGS. 2-15, 16A-16C, 17A, 17B, 18A-18C, 19A, 19B, 20A, 20B, 21A, 21B, 22A, 22B, 23A-23D, 24A, 24B, 25A, and 25B, with a distinction that while forming the structure illustrated in FIGS. 26A and 26B, the gate cut process (described above with reference to FIGS. 21A and 21B) is performed after replacing the dummy gates 94 (see, for example, FIGS. 16A-16C) with replacement gate stacks 116 (as described above with reference to FIGS. 23A-23D) in both the first region 50A and the second region 50B. Accordingly, in the embodiment illustrated in FIGS. 26A and 26B, the gate dielectric layers 112, the liner layers 114A, and the work function tuning layers 114B of the replacement gate stacks 116 (see FIG. 23D) do not extend along sidewalls of the isolation regions 108 in both the first region 50A and the second region 50B. Instead, in the embodiment illustrated in FIGS. 26A and 26B, the conductive fill layers 114C of the replacement gate stacks 116 extend along and are in physical contact with sidewalls of the isolation regions 108 in both the first region 50A and the second region 50B as illustrated in FIG. 26C.

Figure 27A:
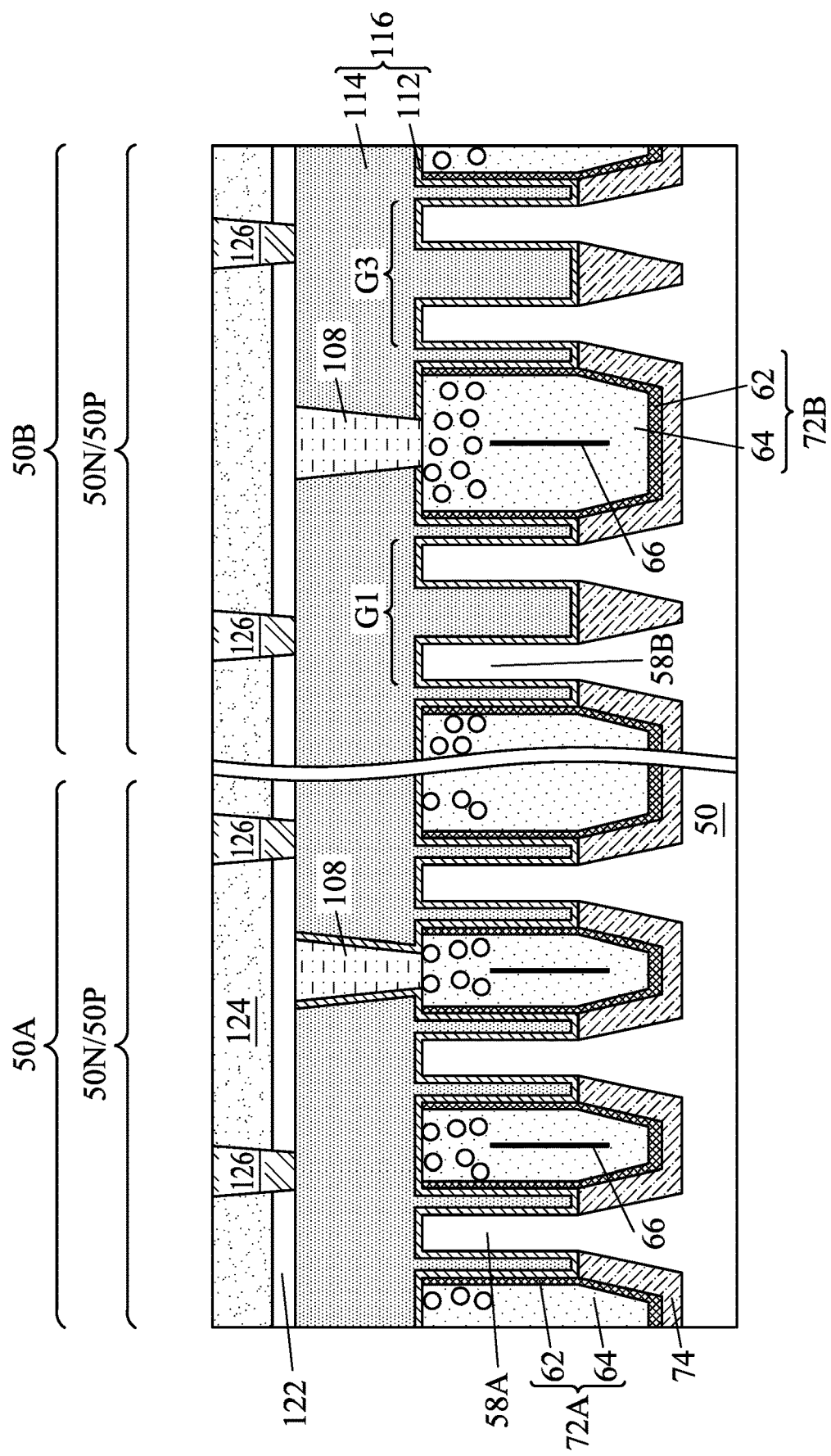
FIGS. 27A and 27B are cross-sectional views of a FinFET device in accordance with some embodiments.
Figure 27B:
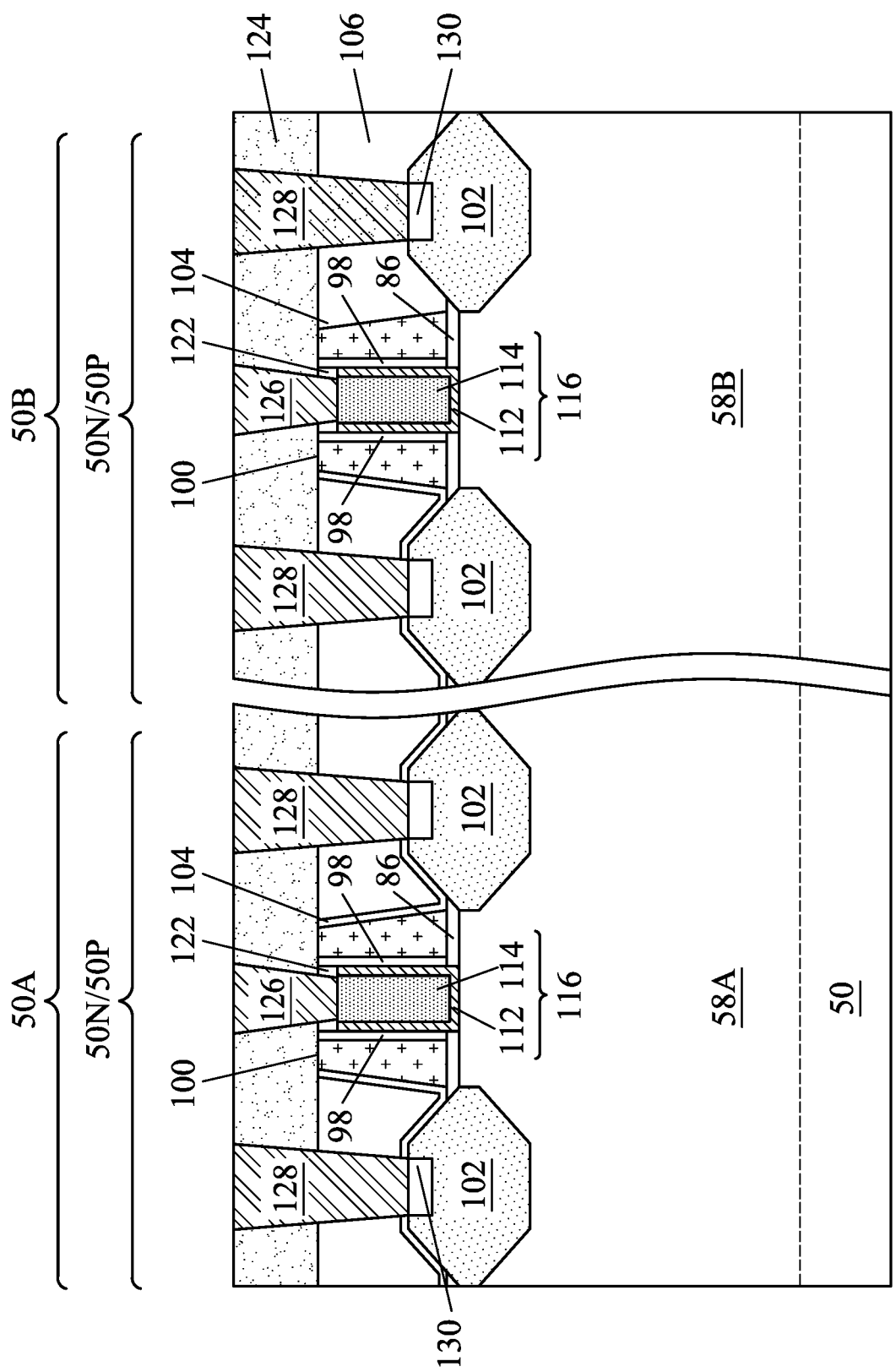

FIGS. 27A and 27B illustrate cross-sectional views of a FinFET device in accordance with some embodiments. FIG. 27A illustrates a cross-sectional view along the reference cross-section A-A illustrated in FIG. 1, except for multiple fins. FIG. 27B illustrates a cross-sectional view along the reference cross-section B-B illustrated in FIG. 1, except for multiple gate structures. The structure illustrated in FIGS. 27A and 27B is similar to the structure illustrated in FIGS. 25A and 25B, with like features being labeled by like numerical references, and descriptions of the like features are not repeated herein. In some embodiments, the structure illustrated in FIGS. 27A and 27B may be form using process steps that are similar to the process steps described above with reference to FIGS. 2-15, 16A-16C, 17A, 17B, 18A-18C, 19A, 19B, 20A, 20B, 21A, 21B, 22A, 22B, 23A-23D, 24A, 24B, 25A, and 25B, with a distinction that while forming the structure illustrated in FIGS. 27A and 27B, the gate cut process (described above with reference to FIGS. 21A and 21B) is performed after replacing the dummy gates 94 (see, for example, FIGS. 16A-16C) with replacement gate stacks 116 (as described above with reference to FIGS. 23A-23D) in the second region 50B. Accordingly, in the embodiment illustrated in FIGS. 27A and 27B, the gate dielectric layers 112, the liner layers 114A, and the work function tuning layers 114B of the replacement gate stacks 116 extend along sidewalls of the isolation regions 108 in the first region 50A (see FIG. 23D), and the conductive fill layers 114C of the replacement gate stacks 116 extend along and are in physical contact with sidewalls of the isolation regions 108 in the second region 50B (see FIG. 26C).

Figure 28A:
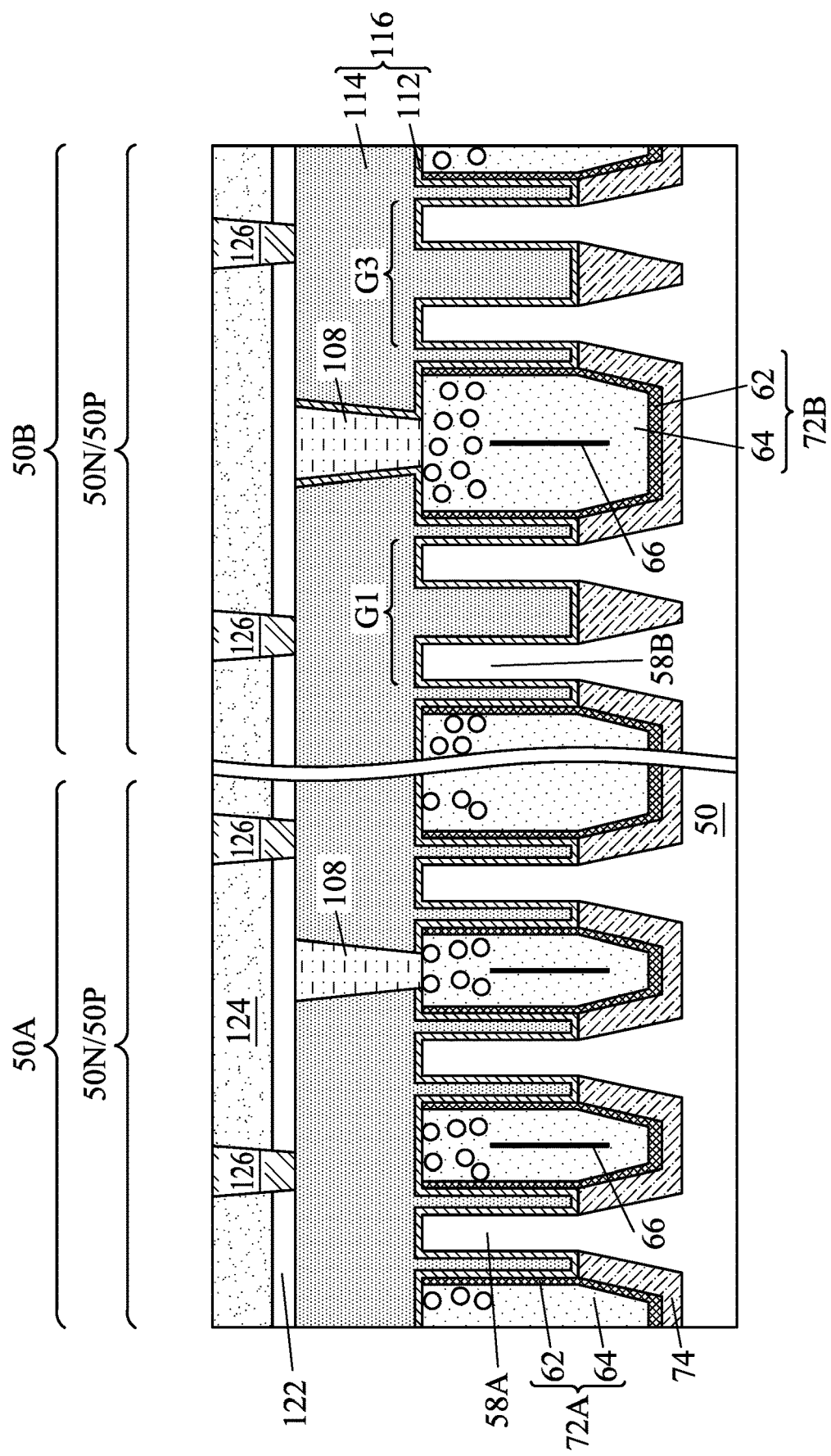
FIGS. 28A and 28B are cross-sectional views of a FinFET device in accordance with some embodiments.
Figure 28B:
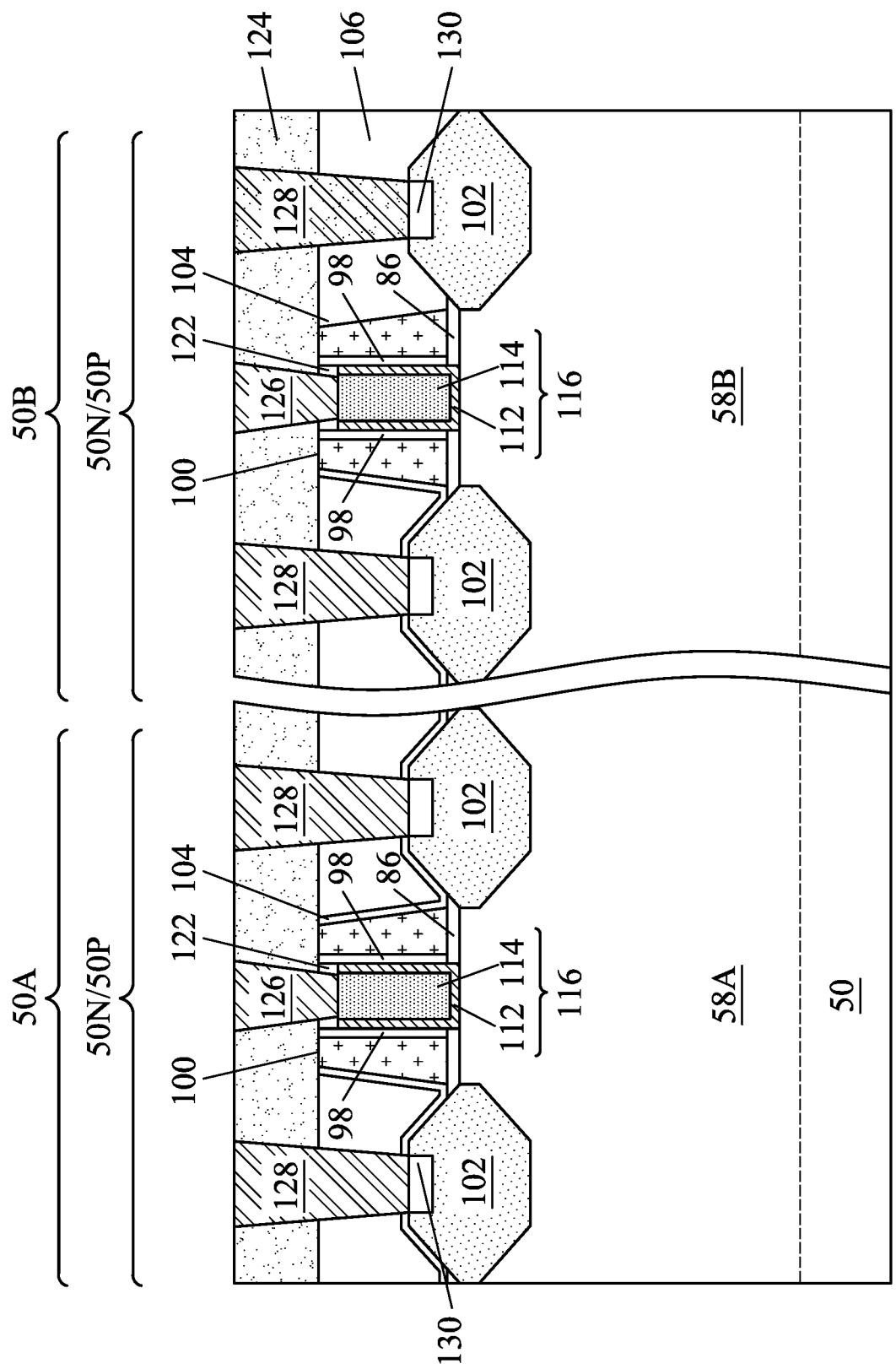

FIGS. 28A and 28B illustrate cross-sectional views of a FinFET device in accordance with some embodiments. FIG. 28A illustrates a cross-sectional view along the reference cross-section A-A illustrated in FIG. 1, except for multiple fins. FIG. 28B illustrates a cross-sectional view along the reference cross-section B-B illustrated in FIG. 1, except for multiple gate structures. The structure illustrated in FIGS. 28A and 28B is similar to the structure illustrated in FIGS. 25A and 25B, with like features being labeled by like numerical references, and descriptions of the like features are not repeated herein. In some embodiments, the structure illustrated in FIGS. 28A and 28B may be form using process steps that are similar to the process steps described above with reference to FIGS. 2-15, 16A-16C, 17A, 17B, 18A-18C, 19A, 19B, 20A, 20B, 21A, 21B, 22A, 22B, 23A-23D, 24A, 24B, 25A, and 25B, with a distinction that while forming the structure illustrated in FIGS. 28A and 28B, the gate cut process (described above with reference to FIGS. 21A and 21B) is performed after replacing the dummy gates 94 (see, for example, FIGS. 16A-16C) with replacement gate stacks 116 (as described above with reference to FIGS. 23A-23D) in the first region 50A. Accordingly, in the embodiment illustrated in FIGS. 28A and 28B, the gate dielectric layers 112, the liner layers 114A, and the work function tuning layers 114B of the replacement gate stacks 116 extend along sidewalls of the isolation regions 108 in the second region 50B (see FIG. 23D), and the conductive fill layers 114C of the replacement gate stacks 116 extend along and are in physical contact with sidewalls of the isolation regions 108 in the first region 50A (see FIG. 26C).

Figure 29A:
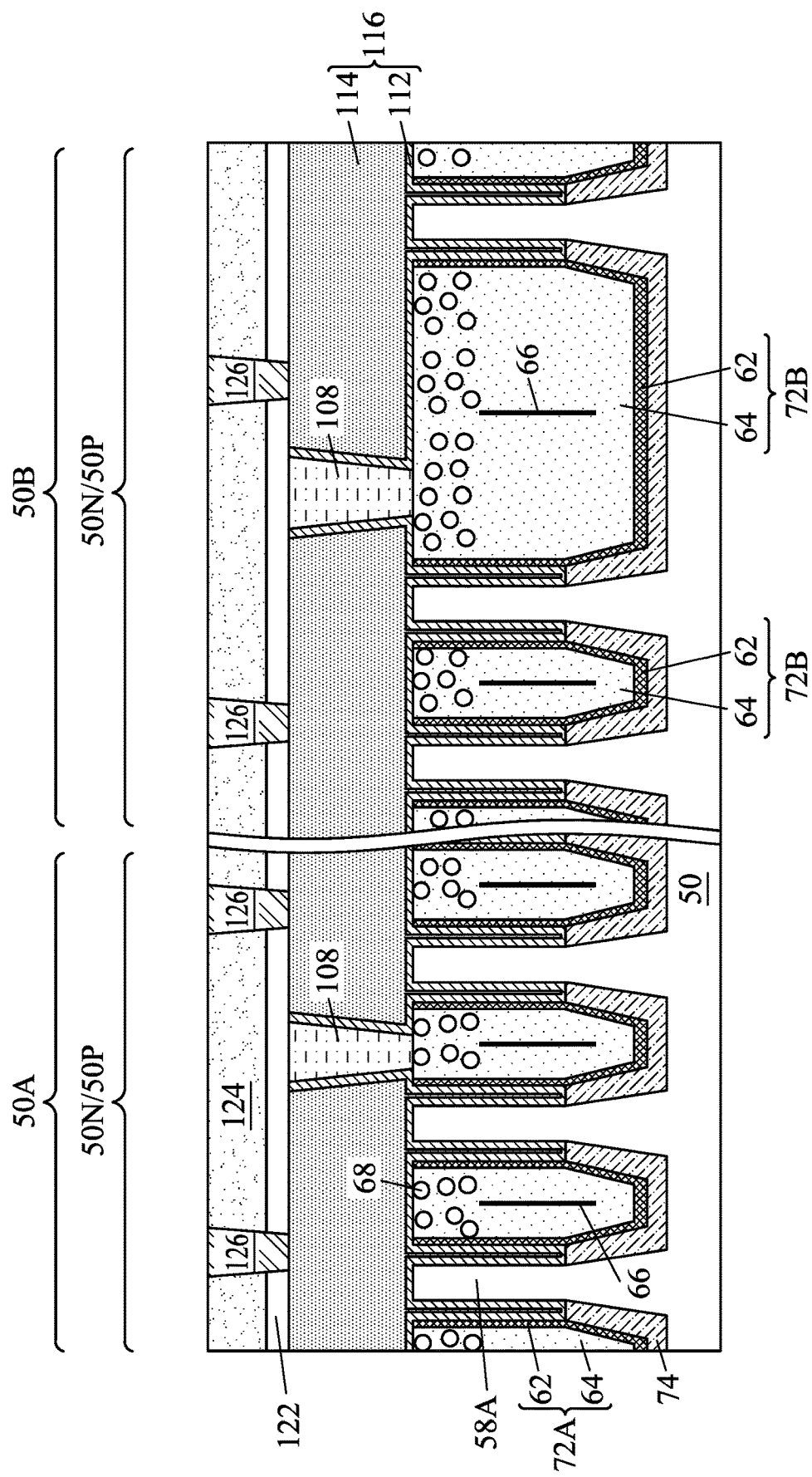
FIGS. 29A-29C are top and cross-sectional views of a FinFET device in accordance with some embodiments.
Figure 29B:
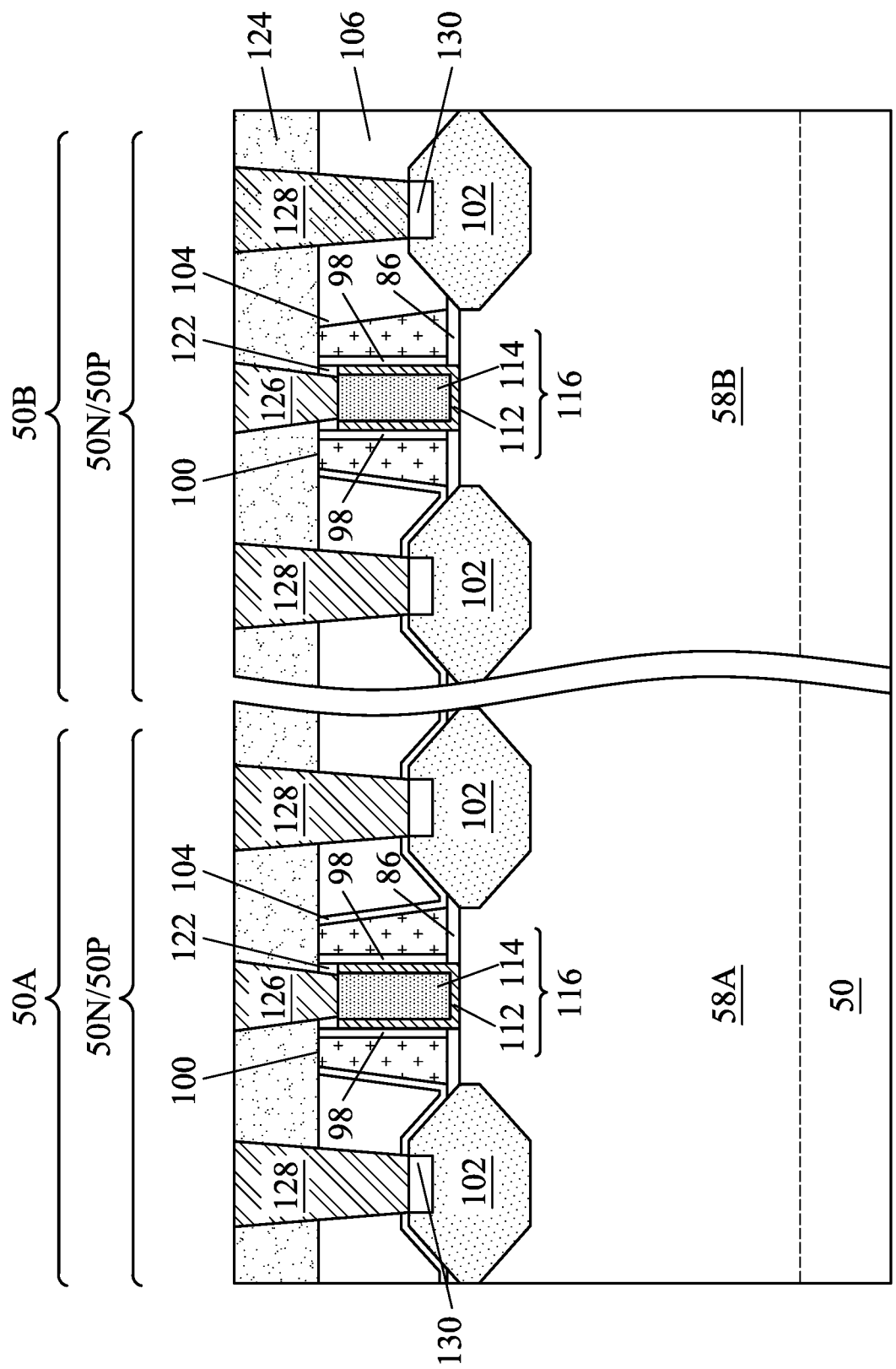
Figure 29C:
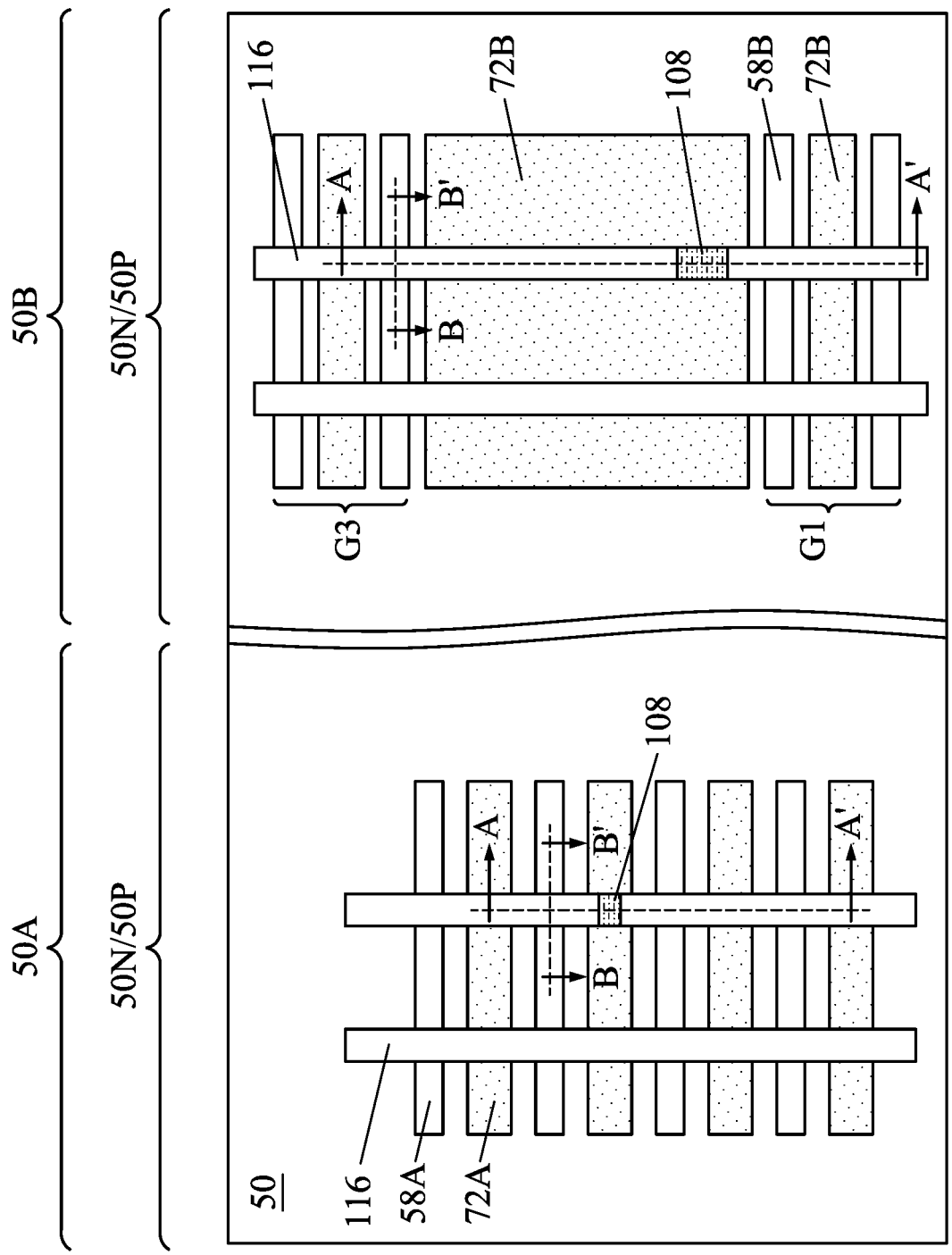

FIGS. 29A-29C illustrates top and cross-sectional views of a FinFET device in accordance with some embodiments. FIG. 29C illustrates a top view showing only the replacement gate stacks 116, the isolation regions 108, the fins 58A and 58B, and the hybrid fins 72A and 72B, with other features being omitted for clarity. FIG. 29A illustrates a cross-section view along a section AA' in FIG. 29C. FIG. 29B illustrates a cross-section view along a section BB' in FIG. 29C. The structure illustrated in FIGS. 29A-29C is similar to the structure illustrated in FIGS. 25A and 25B, with like features being labeled by like numerical references, and descriptions of the like features are not repeated herein. In some embodiments, the structure illustrated in FIGS. 29A-29C may be form using process steps that are similar to the process steps described above with reference to FIGS. 2-15, 16A-16C, 17A, 17B, 18A-18C, 19A, 19B, 20A, 20B, 21A, 21B, 22A, 22B, 23A-23D, 24A, 24B, 25A, and 25B, and the description is not repeated herein. In the embodiment illustrated in FIGS. 29A-29C, the fins 58A and 58B are formed such that the spacing S1 (see FIG. 4) between the fins 58A is same as the spacing S2 (see FIG. 4) between the fins 58B. Accordingly, in such embodiments, the hybrid fins 72B are also formed between adjacent fins 58B in each fin group (such as fin groups G1 and G3).

Figure 30A:
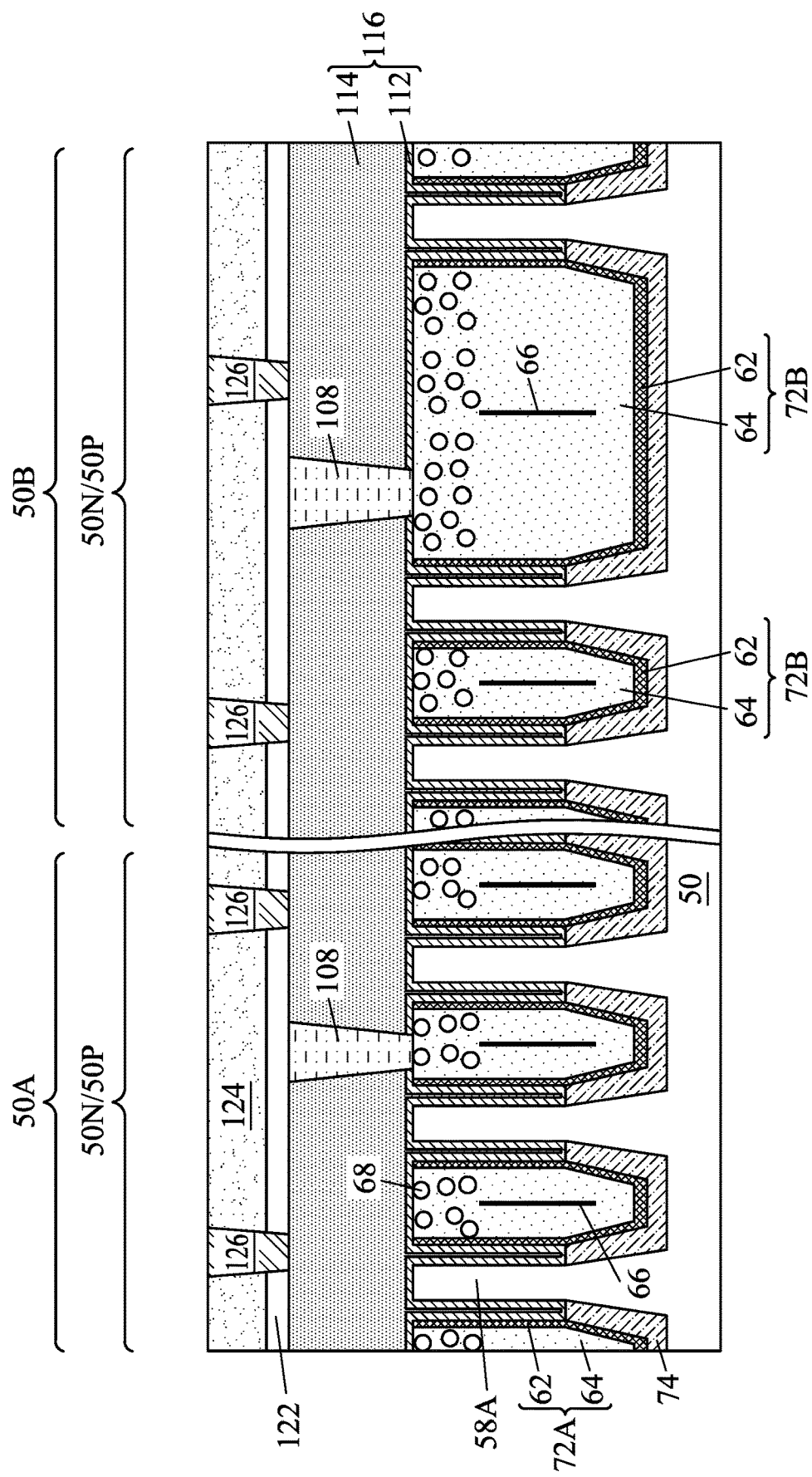
FIGS. 30A and 30B are cross-sectional views of a FinFET device in accordance with some embodiments.
Figure 30B:
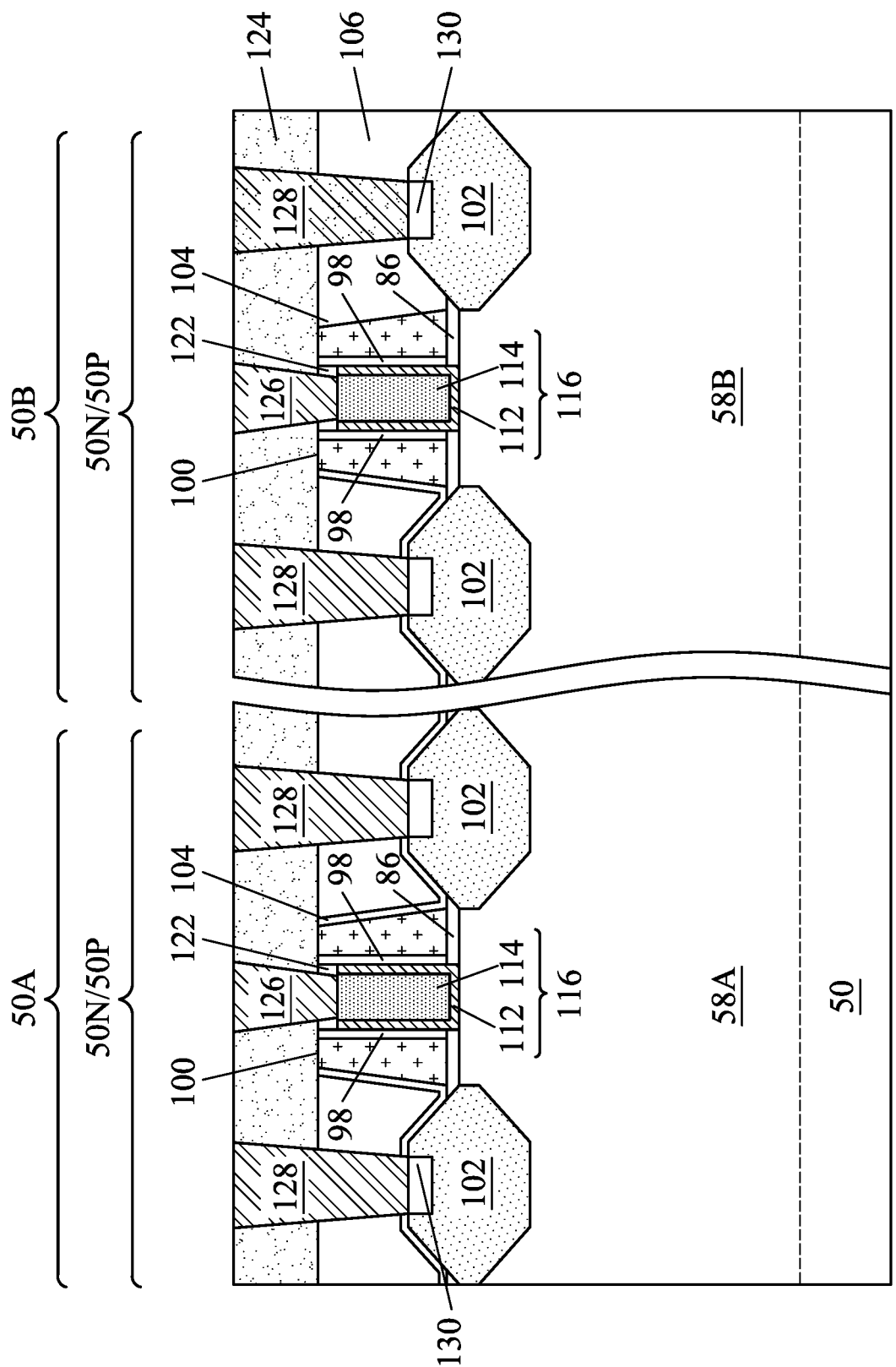

FIGS. 30A and 30B illustrate cross-sectional views of a FinFET device in accordance with some embodiments. FIG. 30A illustrates a cross-sectional view along the reference cross-section A-A illustrated in FIG. 1, except for multiple fins. FIG. 30B illustrates a cross-sectional view along the reference cross-section B-B illustrated in FIG. 1, except for multiple gate structures. The structure illustrated in FIGS. 30A and 30B is similar to the structure illustrated in FIGS. 29A and 29B, with like features being labeled by like numerical references, and descriptions of the like features are not repeated herein. In some embodiments, the structure illustrated in FIGS. 30A and 30B may be formed in a similar manner as the structure illustrated in FIGS. 29A and 29B, with a distinction that while forming the structure illustrated in FIGS. 30A and 30B, the gate cut process (described above with reference to FIGS. 21A and 21B) is performed after replacing the dummy gates 94 (see, for example, FIGS. 16A-16C) with replacement gate stacks 116 (as described above with reference to FIGS. 23A-23D) in both the first region 50A and the second region 50B. Accordingly, in the embodiment illustrated in FIGS. 30A and 30B, the conductive fill layers 114C of the replacement gate stacks 116 extend along and are in physical contact with sidewalls of the isolation regions 108 in both the first region 50A and the second region 50B (see FIG. 26C).

Figure 31A:
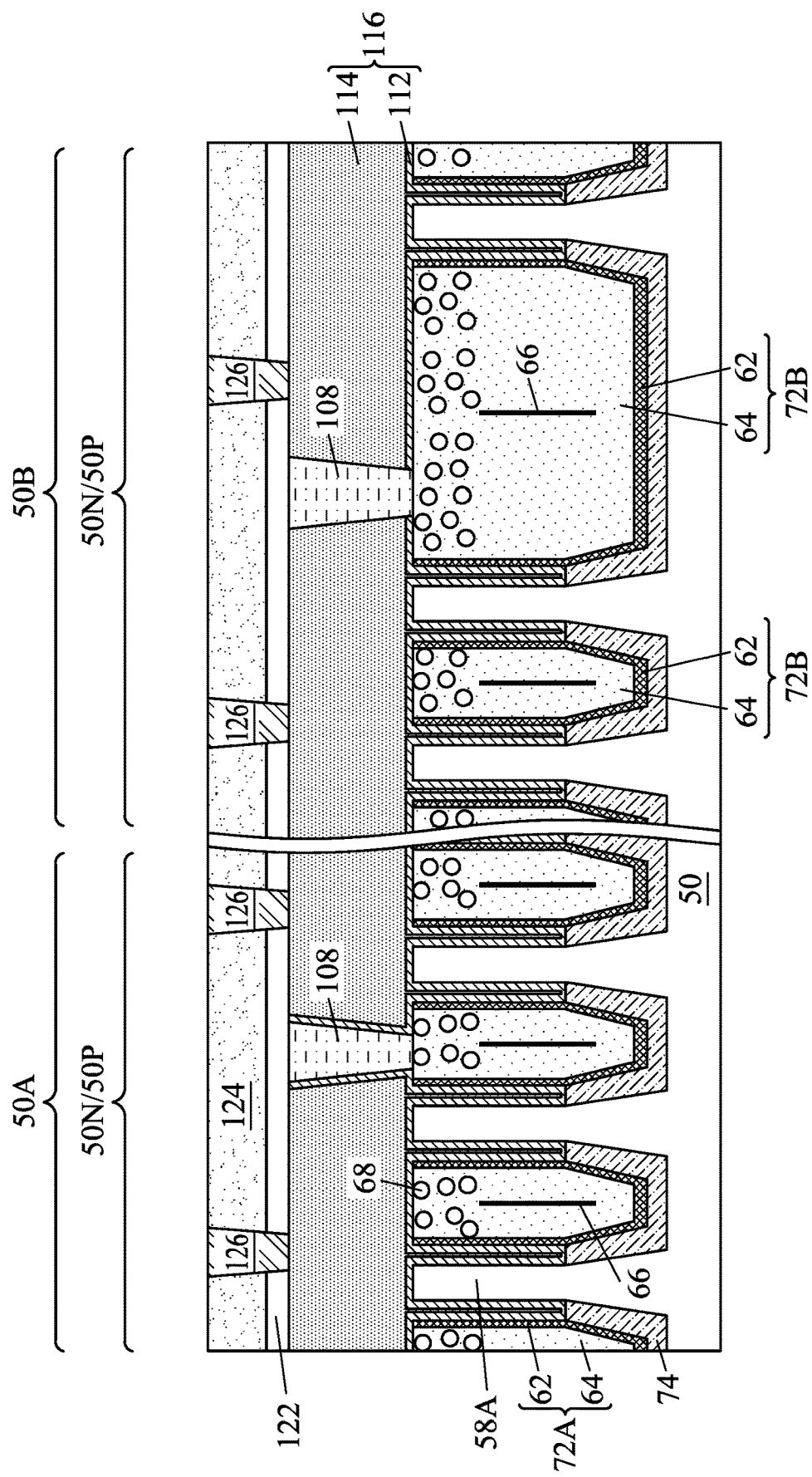
FIGS. 31A and 31B are cross-sectional views of a FinFET device in accordance with some embodiments.
Figure 31B:
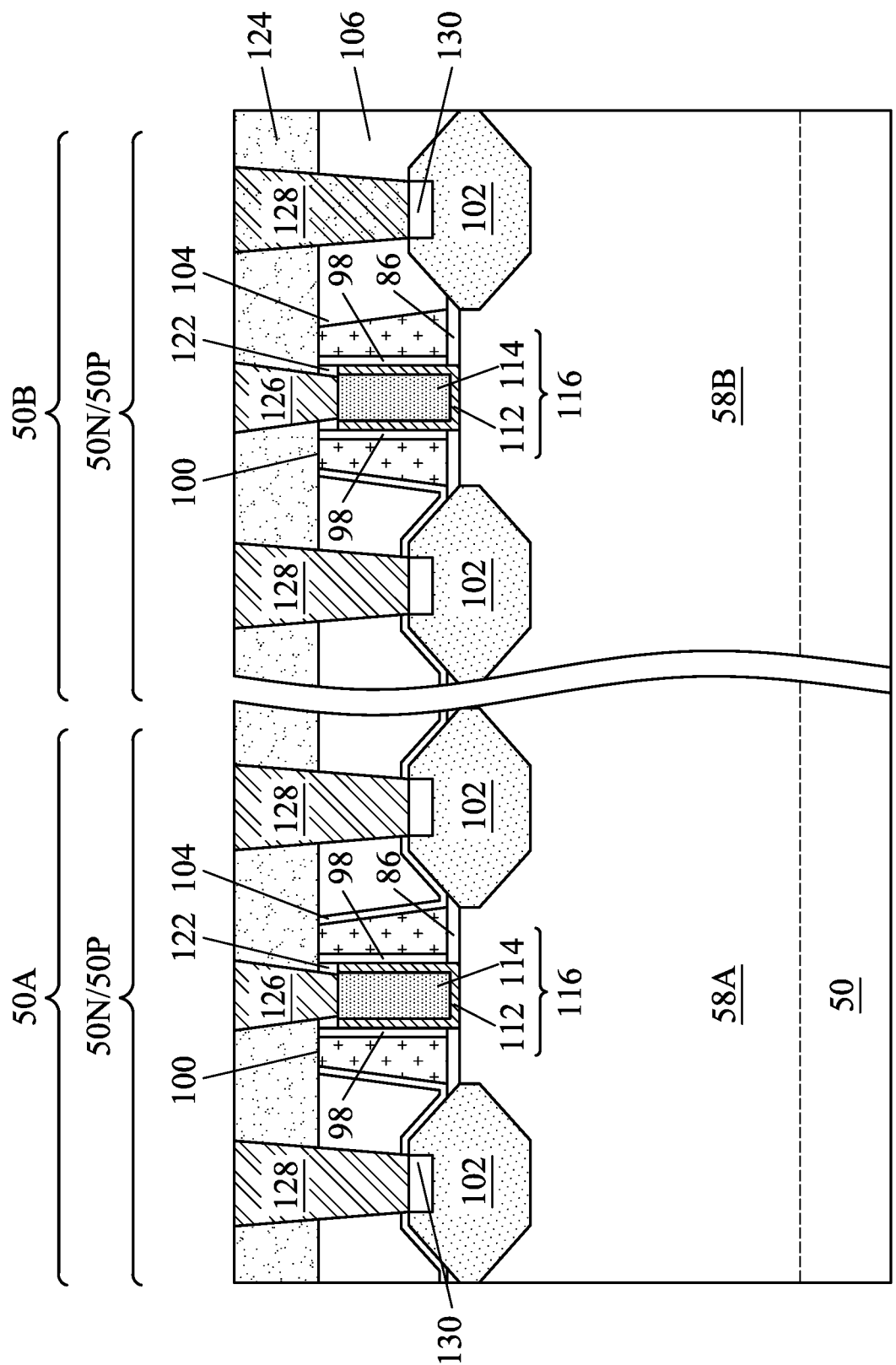

FIGS. 31A and 31B illustrate cross-sectional views of a FinFET device in accordance with some embodiments. FIG. 31A illustrates a cross-sectional view along the reference cross-section A-A illustrated in FIG. 1, except for multiple fins. FIG. 31B illustrates a cross-sectional view along the reference cross-section B-B illustrated in FIG. 1, except for multiple gate structures. The structure illustrated in FIGS. 31A and 31B is similar to the structure illustrated in FIGS. 29A and 29B, with like features being labeled by like numerical references, and descriptions of the like features are not repeated herein. In some embodiments, the structure illustrated in FIGS. 31A and 31B may be formed in a similar manner as the structure illustrated in FIGS. 29A and 29B, with a distinction that while forming the structure illustrated in FIGS. 31A and 31B, the gate cut process (described above with reference to FIGS. 21A and 21B) is performed after replacing the dummy gates 94 (see, for example, FIGS. 16A-16C) with replacement gate stacks 116 (as described above with reference to FIGS. 23A-23D) in the second region 50B. Accordingly, in the embodiment illustrated in FIGS. 31A and 31B, the gate dielectric layers 112, the liner layers 114A, and the work function tuning layers 114B of the replacement gate stacks 116 extend along sidewalls of the isolation regions 108 in the first region 50A (see FIG. 23D), and the conductive fill layers 114C of the replacement gate stacks 116 extend along and are in physical contact with sidewalls of the isolation regions 108 in the second region 50B (see FIG. 26C).

Figure 32A:
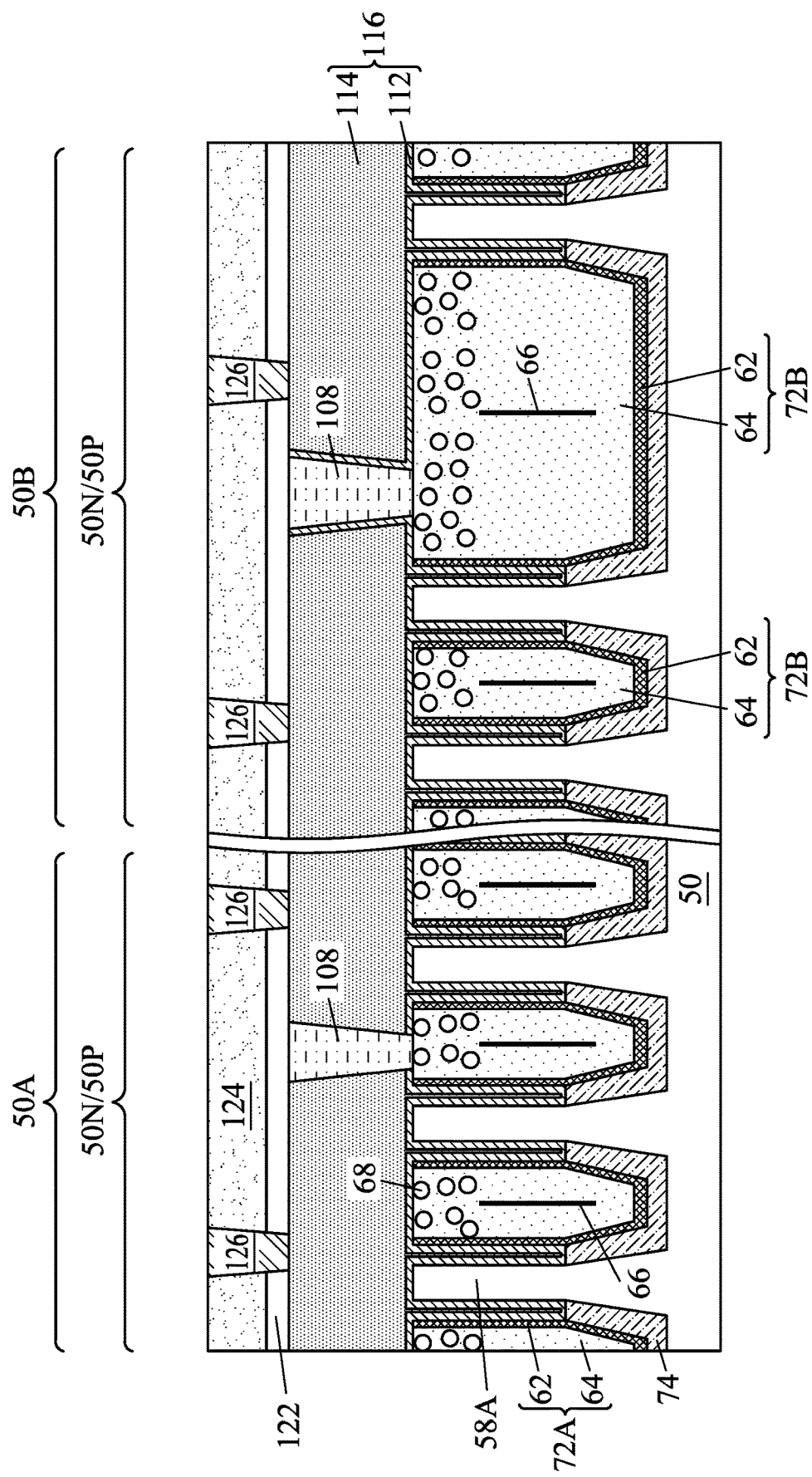
FIGS. 32A and 32B are cross-sectional views of a FinFET device in accordance with some embodiments.
Figure 32B:
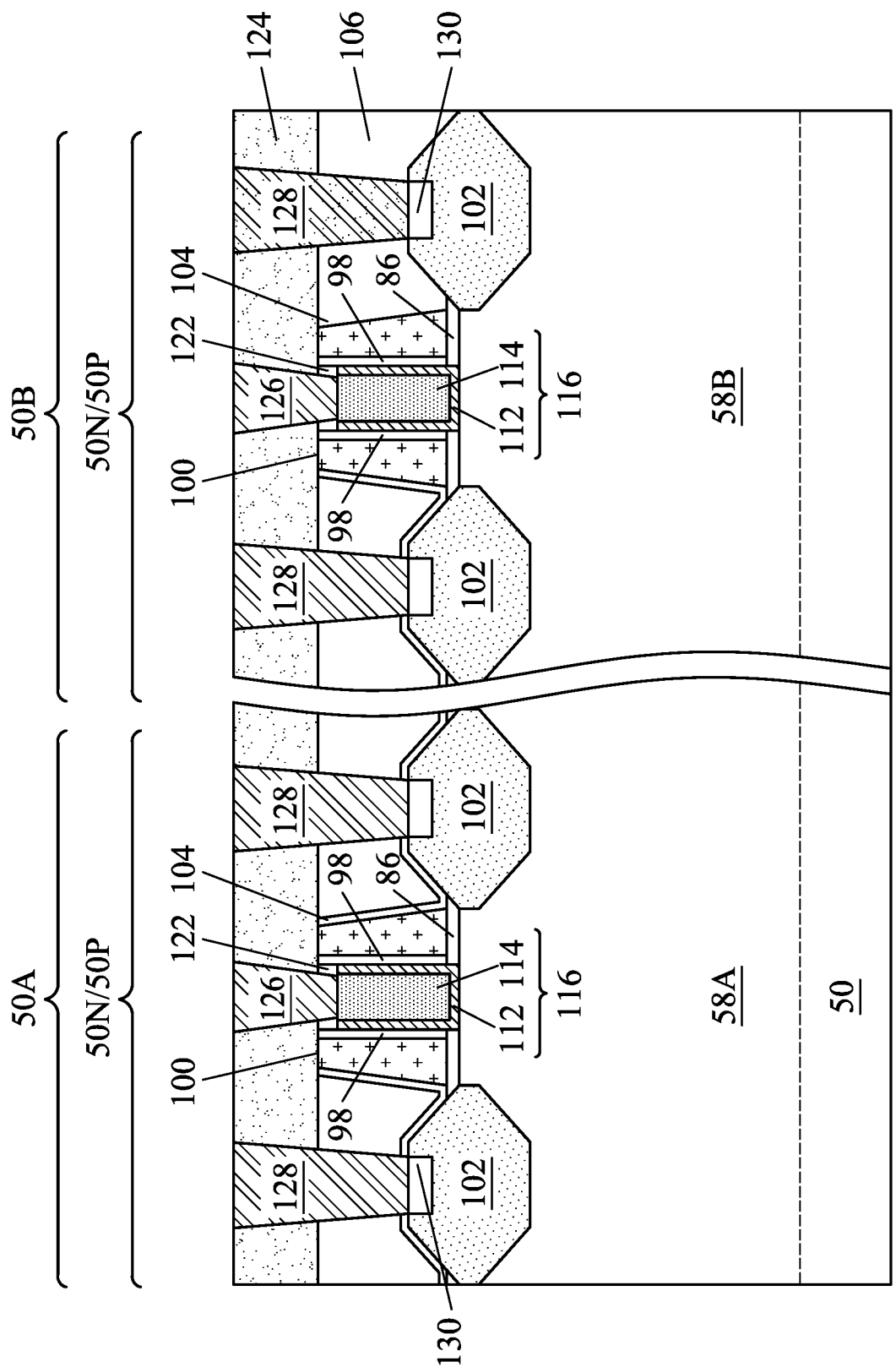

FIGS. 32A and 32B illustrate cross-sectional views of a FinFET device in accordance with some embodiments. FIG. 32A illustrates a cross-sectional view along the reference cross-section A-A illustrated in FIG. 1, except for multiple fins. FIG. 32B illustrates a cross-sectional view along the reference cross-section B-B illustrated in FIG. 1, except for multiple gate structures. The structure illustrated in FIGS. 32A and 32B is similar to the structure illustrated in FIGS. 29A and 29B, with like features being labeled by like numerical references, and descriptions of the like features are not repeated herein. In some embodiments, the structure illustrated in FIGS. 32A and 32B may be formed in a similar manner as the structure illustrated in FIGS. 29A and 29B, with a distinction that while forming the structure illustrated in FIGS. 32A and 32B, the gate cut process (described above with reference to FIGS. 21A and 21B) is performed after replacing the dummy gates 94 (see, for example, FIGS. 16A-16C) with replacement gate stacks 116 (as described above with reference to FIGS. 23A-23D) in the first region 50A. Accordingly, in the embodiment illustrated in FIGS. 32A and 32B, the gate dielectric layers 112, the liner layers 114A, and the work function tuning layers 114B of the replacement gate stacks 116 extend along sidewalls of the isolation regions 108 in the second region 50B (see FIG. 23D), and the conductive fill layers 114C of the replacement gate stacks 116 extend along and are in physical contact with sidewalls of the isolation regions 108 in the first region 50A (see FIG. 26C).

The disclosed FinFET embodiments could also be applied to gate-all-around (GAA) device as such as nanostructure (e.g., nanosheet, nanowire, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety. Such NSFET embodiments are described in a greater detail below.

Figure 33A:
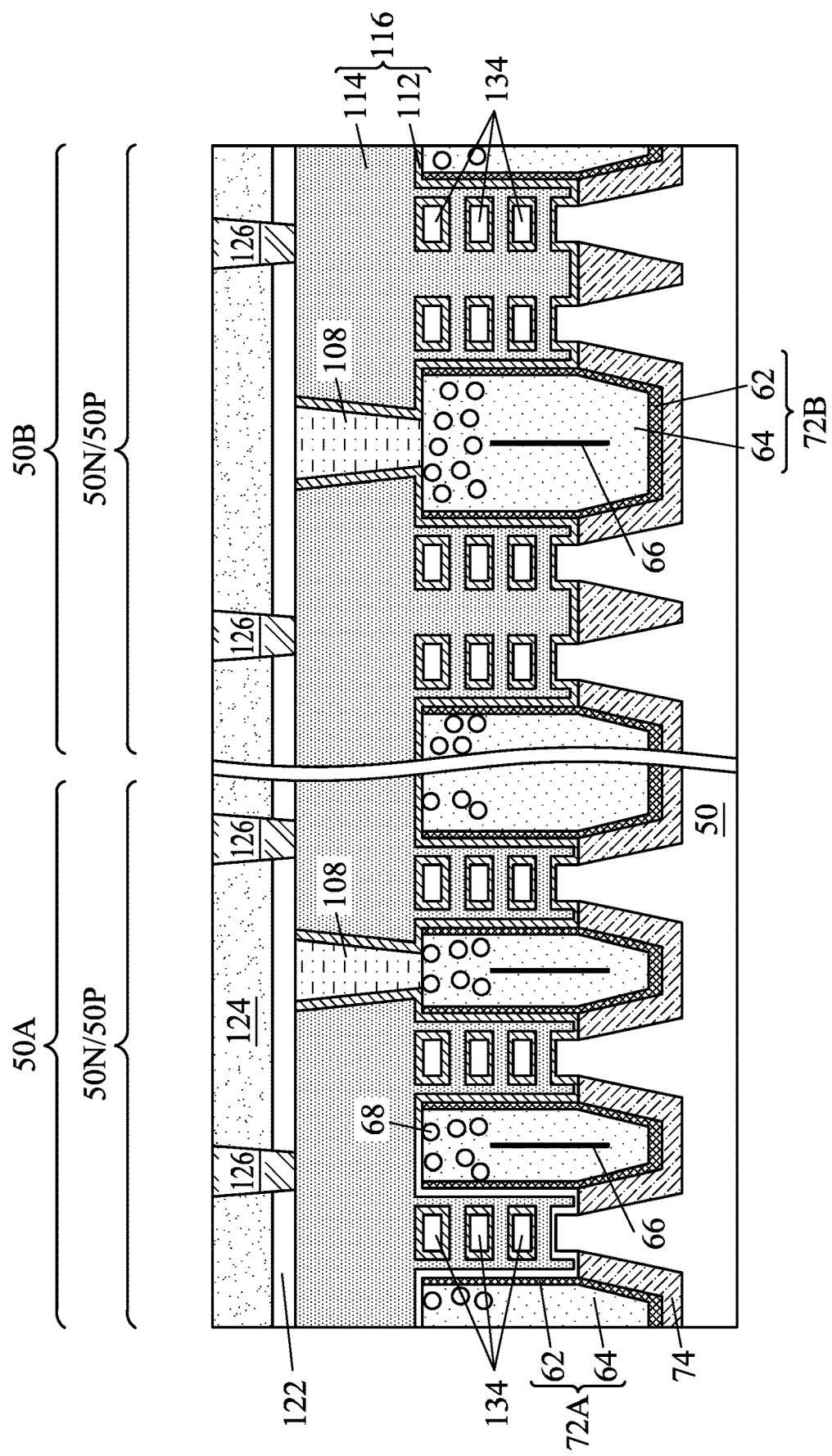
FIGS. 33A and 33B are cross-sectional views of an NSFET device in accordance with some embodiments.
Figure 33B:
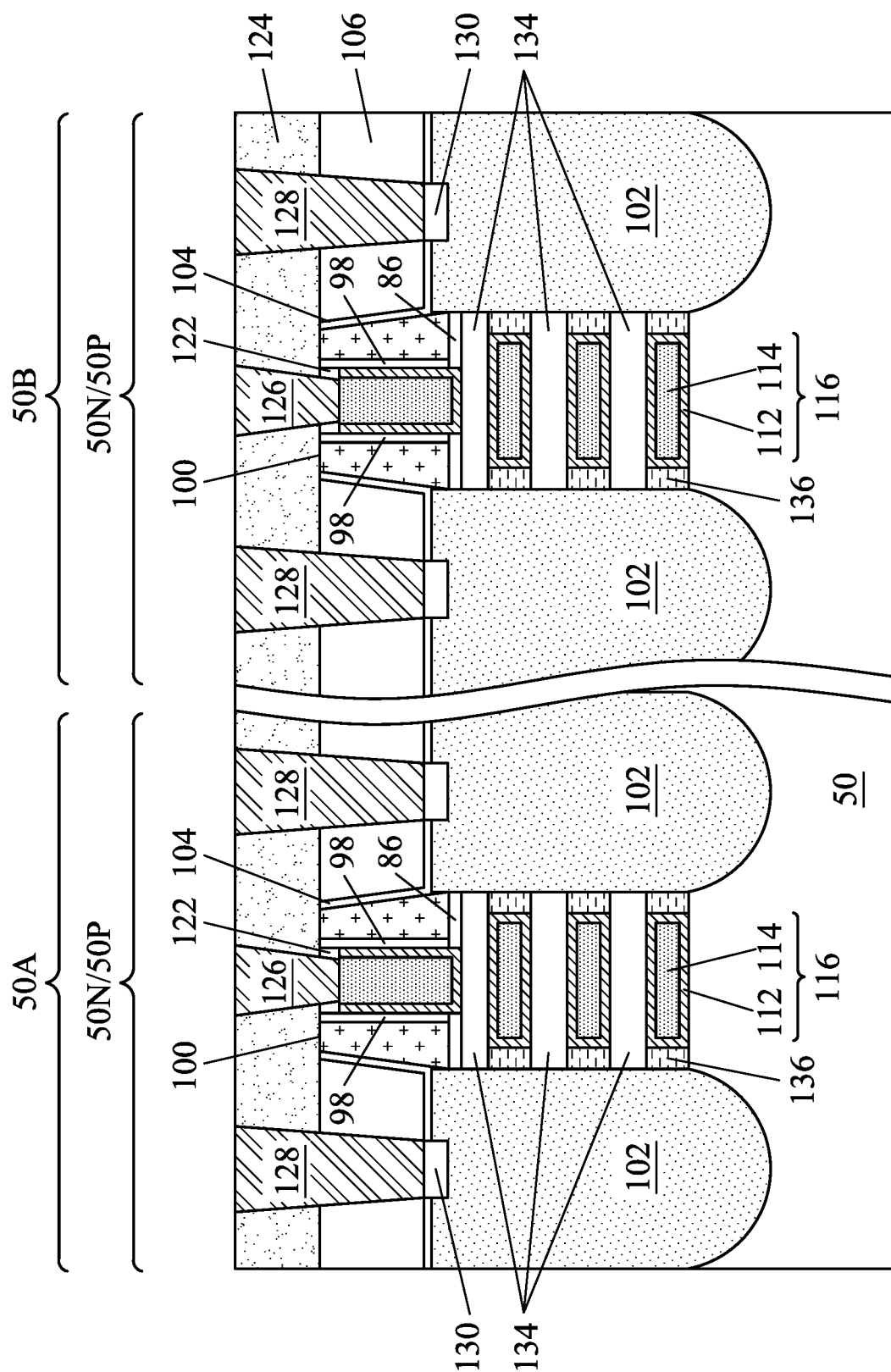

FIGS. 33A and 33B are cross-sectional views of an NSFET device in accordance with some embodiments. FIG. 33A illustrates a cross-sectional view along the reference cross-section A-A illustrated in FIG. 1. FIG. 33B illustrates a cross-sectional view along the reference cross-section B-B illustrated in FIG. 1. The structure illustrated in FIGS. 33A and 33B is similar to the structure illustrated in FIGS. 25A and 25B, with like features being labeled by like numerical references, and descriptions of the like features are not repeated herein. Instead of the fins 58A and 58B (FIGS. 25A and 25B), the structure illustrated in FIGS. 33A and 33B comprises nanostructures 134, such that portions of the replacement gate stacks 116 wrap around the nanostructures 134. In some embodiments, the portions of the replacement gate stacks 116 that wrap around the nanostructures 134 are isolated from adjacent epitaxial source/drain regions 102 by spacers 136. In some embodiments, the nanostructures 134 may be formed using similar materials as the substrate 50 and the description is not repeated herein. In some embodiments, the nanostructures 134 and the substrate 50 comprise a same material. In other embodiments, the nanostructures 134 and the substrate 50 comprise different materials. The spacers 136 may comprise a material such as silicon nitride or silicon oxynitride, although any suitable material, such as low-dielectric constant (low-k) materials having a k-value less than about 3.5, may be utilized.

Figure 34A:
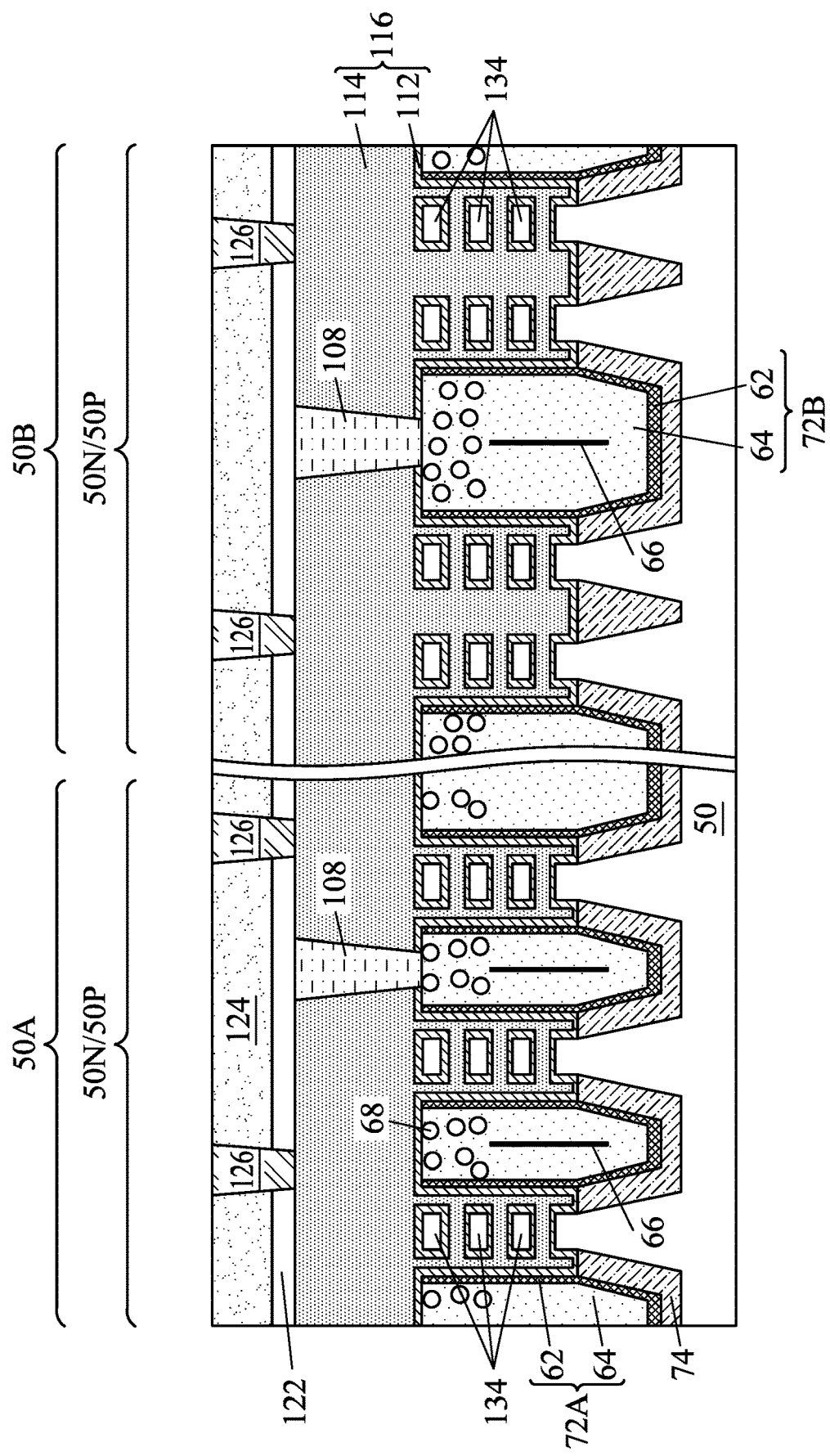
FIGS. 34A and 34B are cross-sectional views of an NSFET device in accordance with some embodiments.
Figure 34B:
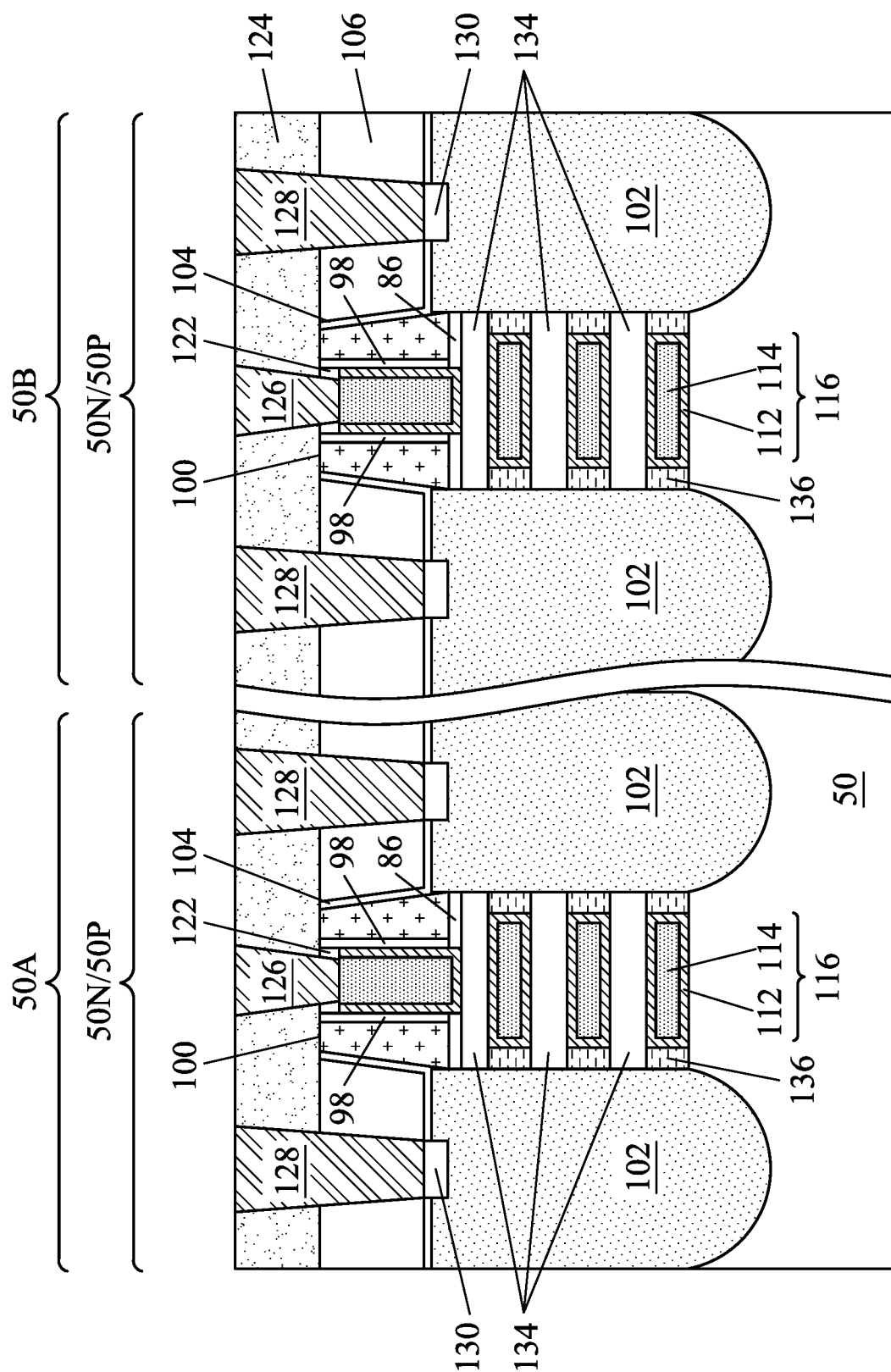

FIGS. 34A and 34B are cross-sectional views of an NSFET device in accordance with some embodiments. FIG. 34A illustrates a cross-sectional view along the reference cross-section A-A illustrated in FIG. 1. FIG. 34B illustrates a cross-sectional view along the reference cross-section B-B illustrated in FIG. 1. The structure illustrated in FIGS. 34A and 34B is similar to the structure illustrated in FIGS. 26A and 26B, with like features being labeled by like numerical references, and descriptions of the like features are not repeated herein. Instead of the fins 58A and 58B (FIGS. 26A and 26B), the structure illustrated in FIGS. 34A and 34B comprises nanostructures 134, such that portions of the replacement gate stacks 116 wrap around the nanostructures 134. In some embodiments, the portions of the replacement gate stacks 116 that wrap around the nanostructures 134 are isolated from adjacent epitaxial source/drain regions 102 by spacers 136. In some embodiments, the nanostructures 134 may be formed using similar materials as the substrate 50 and the description is not repeated herein. In some embodiments, the nanostructures 134 and the substrate 50 comprise a same material. In other embodiments, the nanostructures 134 and the substrate 50 comprise different materials. The spacers 136 may comprise a material such as silicon nitride or silicon oxynitride, although any suitable material, such as low-dielectric constant (low-k) materials having a k-value less than about 3.5, may be utilized.

Figure 35A:
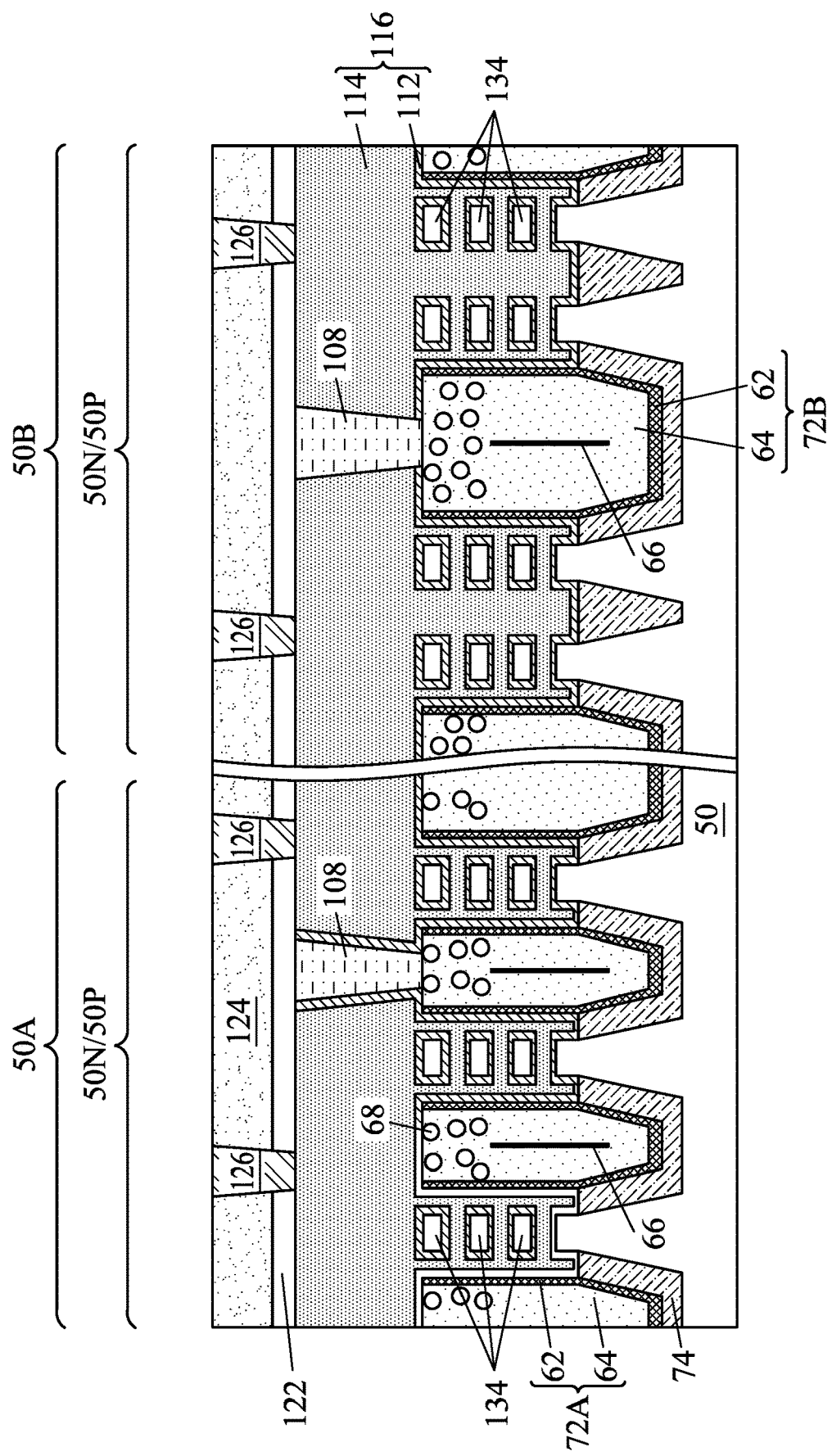
FIGS. 35A and 35B are cross-sectional views of an NSFET device in accordance with some embodiments.
Figure 35B:
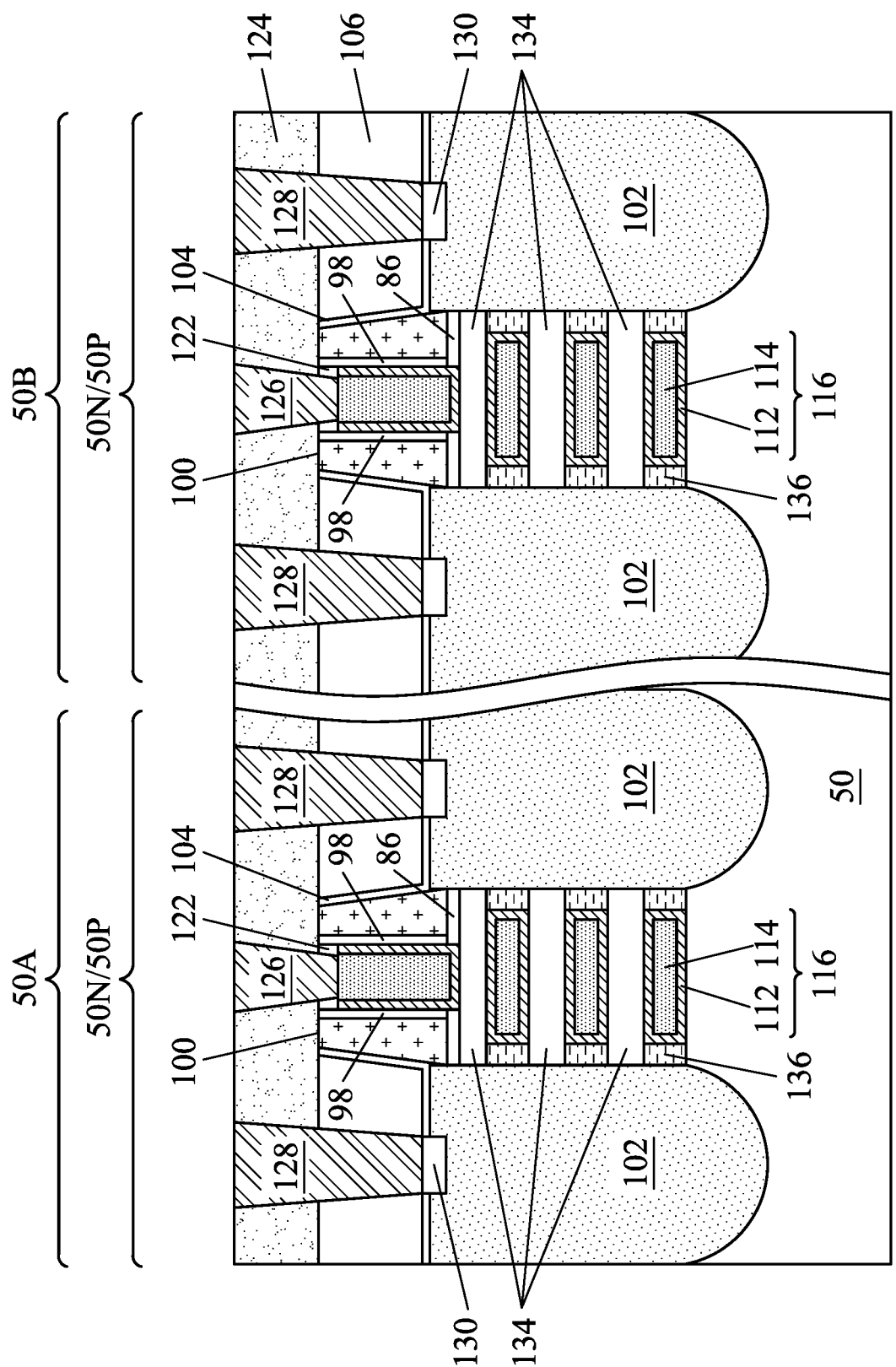

FIGS. 35A and 35B are cross-sectional views of an NSFET device in accordance with some embodiments. FIG. 35A illustrates a cross-sectional view along the reference cross-section A-A illustrated in FIG. 1. FIG. 35B illustrates a cross-sectional view along the reference cross-section B-B illustrated in FIG. 1. The structure illustrated in FIGS. 35A and 35B is similar to the structure illustrated in FIGS. 27A and 27B, with like features being labeled by like numerical references, and descriptions of the like features are not repeated herein. Instead of the fins 58A and 58B (FIGS. 27A and 27B), the structure illustrated in FIGS. 35A and 35B comprises nanostructures 134, such that portions of the replacement gate stacks 116 wrap around the nanostructures 134. In some embodiments, the portions of the replacement gate stacks 116 that wrap around the nanostructures 134 are isolated from adjacent epitaxial source/drain regions 102 by spacers 136. In some embodiments, the nanostructures 134 may be formed using similar materials as the substrate 50 and the description is not repeated herein. In some embodiments, the nanostructures 134 and the substrate 50 comprise a same material. In other embodiments, the nanostructures 134 and the substrate 50 comprise different materials. The spacers 136 may comprise a material such as silicon nitride or silicon oxynitride, although any suitable material, such as low-dielectric constant (low-k) materials having a k-value less than about 3.5, may be utilized.

Figure 36A:
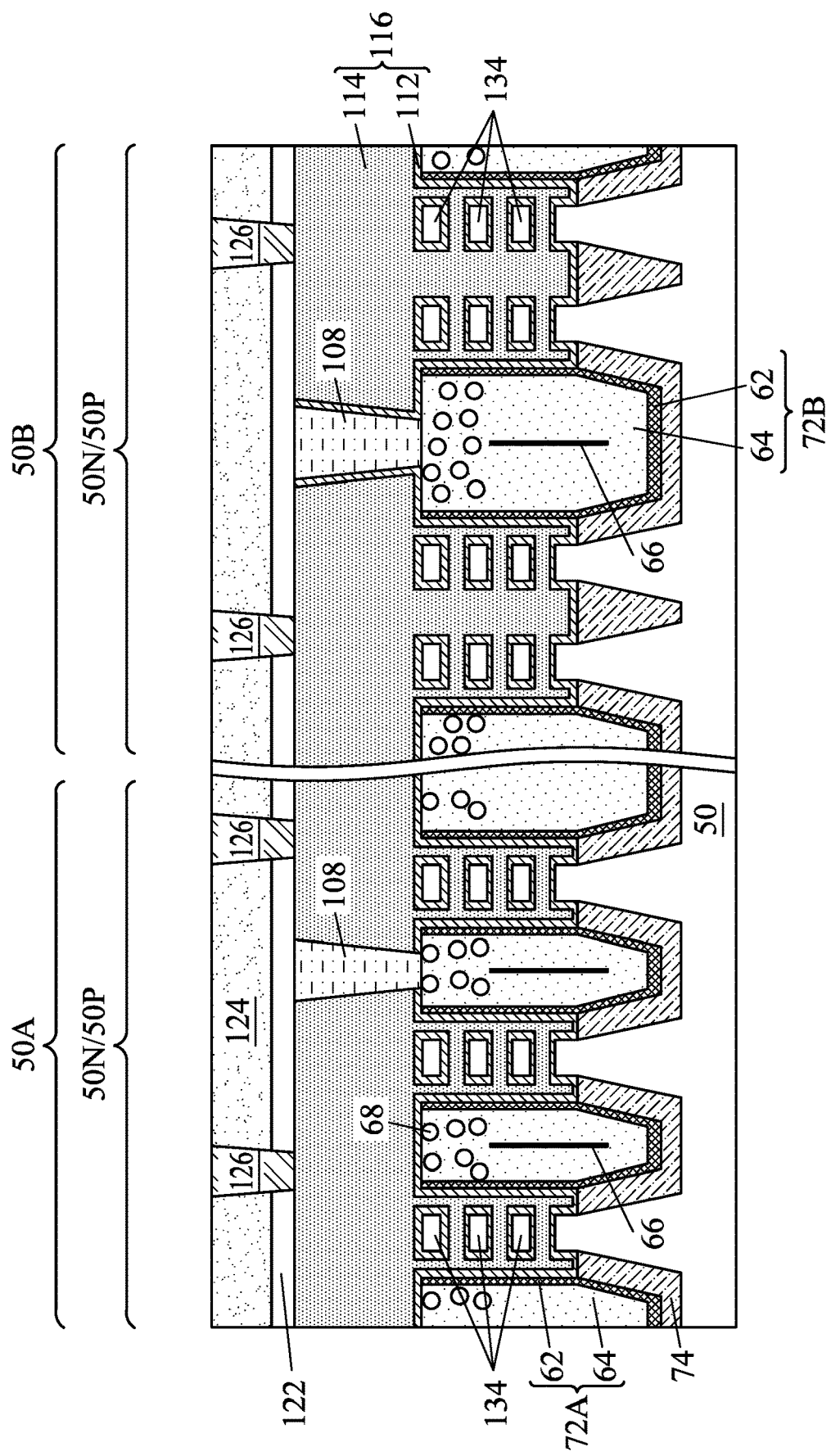
FIGS. 36A and 36B are cross-sectional views of an NSFET device in accordance with some embodiments.
Figure 36B:
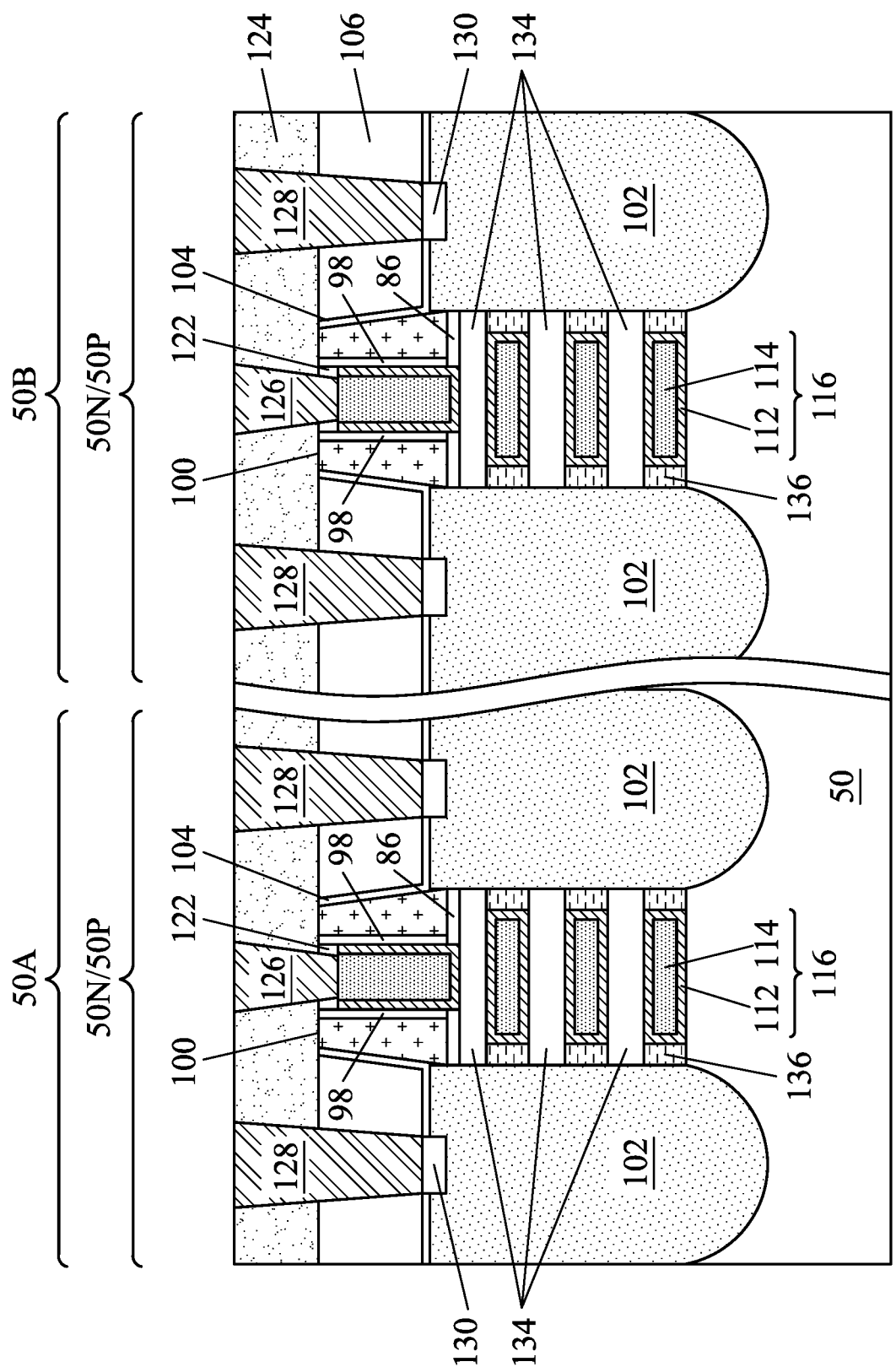

FIGS. 36A and 36B are cross-sectional views of an NSFET device in accordance with some embodiments. FIG. 36A illustrates a cross-sectional view along the reference cross-section A-A illustrated in FIG. 1. FIG. 36B illustrates a cross-sectional view along the reference cross-section B-B illustrated in FIG. 1. The structure illustrated in FIGS. 36A and 36B is similar to the structure illustrated in FIGS. 28A and 28B, with like features being labeled by like numerical references, and descriptions of the like features are not repeated herein. Instead of the fins 58A and 58B (FIGS. 28A and 28B), the structure illustrated in FIGS. 36A and 36B comprises nanostructures 134, such that portions of the replacement gate stacks 116 wrap around the nanostructures 134. In some embodiments, the portions of the replacement gate stacks 116 that wrap around the nanostructures 134 are isolated from adjacent epitaxial source/drain regions 102 by spacers 136. In some embodiments, the nanostructures 134 may be formed using similar materials as the substrate 50 and the description is not repeated herein. In some embodiments, the nanostructures 134 and the substrate 50 comprise a same material. In other embodiments, the nanostructures 134 and the substrate 50 comprise different materials. The spacers 136 may comprise a material such as silicon nitride or silicon oxynitride, although any suitable material, such as low-dielectric constant (low-k) materials having a k-value less than about 3.5, may be utilized.

Figure 37A:
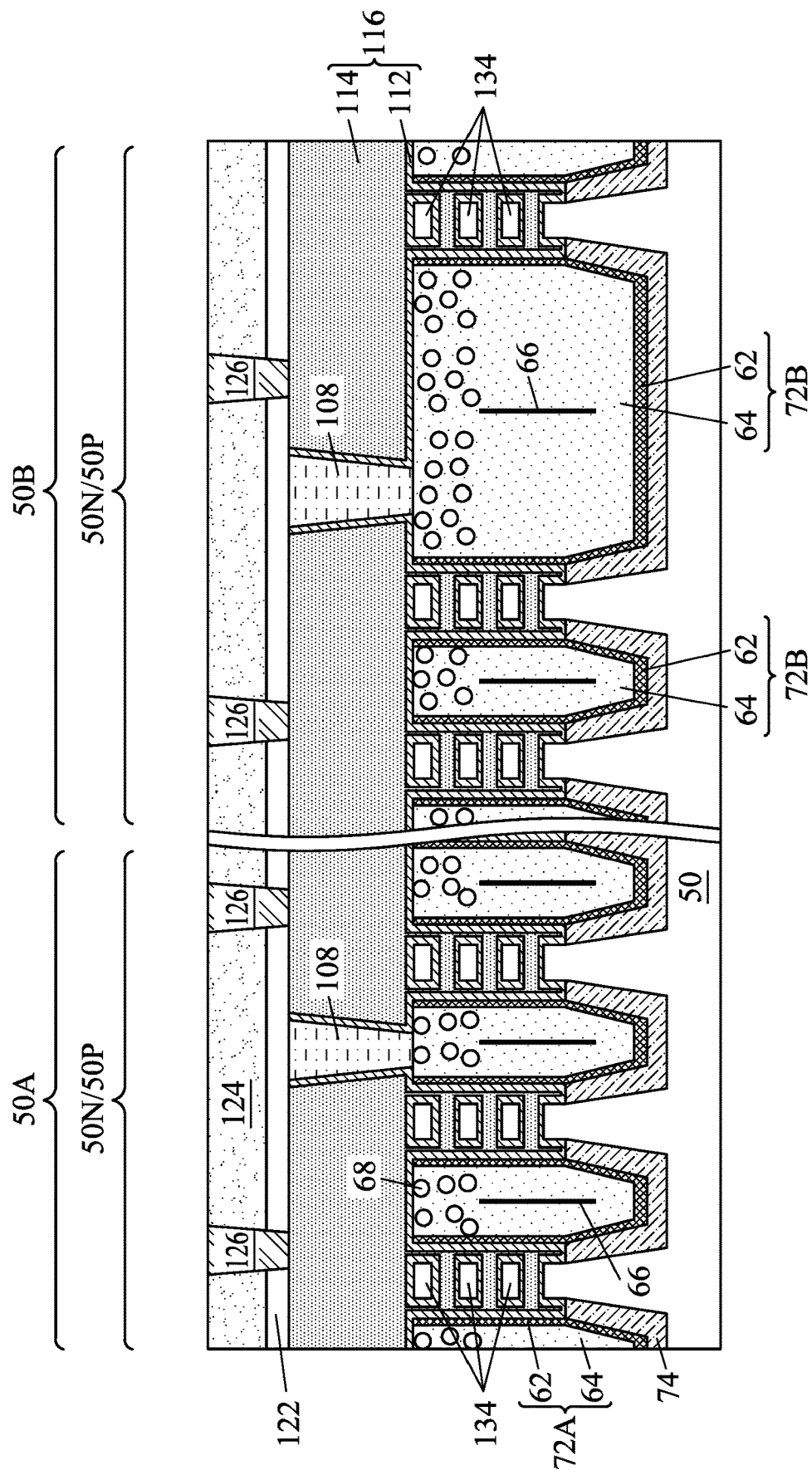
FIGS. 37A and 37B are cross-sectional views of an NSFET device in accordance with some embodiments.
Figure 37B:
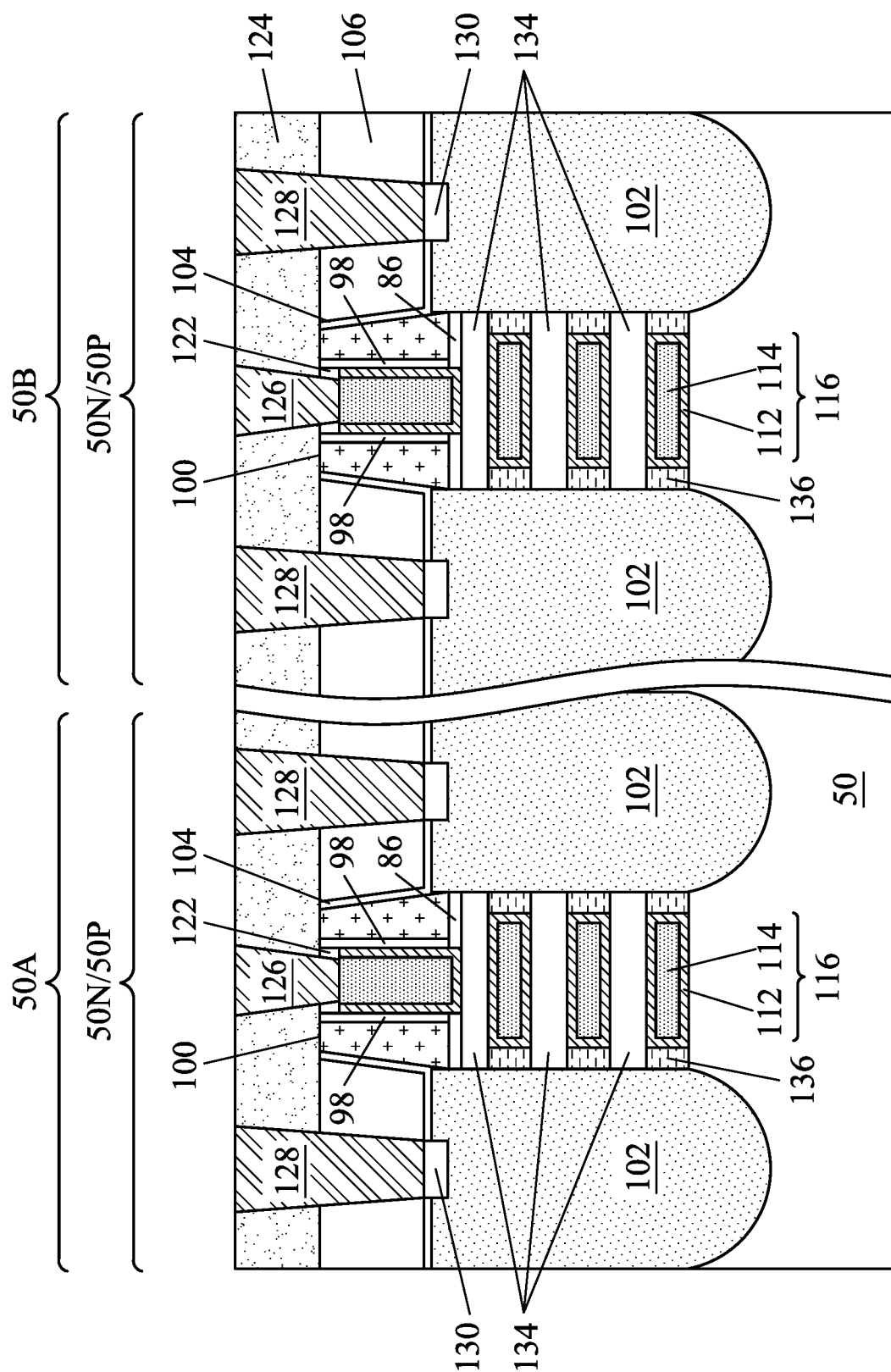

FIGS. 37A and 37B are cross-sectional views of an NSFET device in accordance with some embodiments. FIG. 37A illustrates a cross-sectional view along the reference cross-section A-A illustrated in FIG. 1. FIG. 37B illustrates a cross-sectional view along the reference cross-section B-B illustrated in FIG. 1. The structure illustrated in FIGS. 37A and 37B is similar to the structure illustrated in FIGS. 29A and 29B, with like features being labeled by like numerical references, and descriptions of the like features are not repeated herein. Instead of the fins 58A and 58B (FIGS. 29A and 29B), the structure illustrated in FIGS. 37A and 37B comprises nanostructures 134, such that portions of the replacement gate stacks 116 wrap around the nanostructures 134. In some embodiments, the portions of the replacement gate stacks 116 that wrap around the nanostructures 134 are isolated from adjacent epitaxial source/drain regions 102 by spacers 136. In some embodiments, the nanostructures 134 may be formed using similar materials as the substrate 50 and the description is not repeated herein. In some embodiments, the nanostructures 134 and the substrate 50 comprise a same material. In other embodiments, the nanostructures 134 and the substrate 50 comprise different materials. The spacers 136 may comprise a material such as silicon nitride or silicon oxynitride, although any suitable material, such as low-dielectric constant (low-k) materials having a k-value less than about 3.5, may be utilized.

Figure 38A:
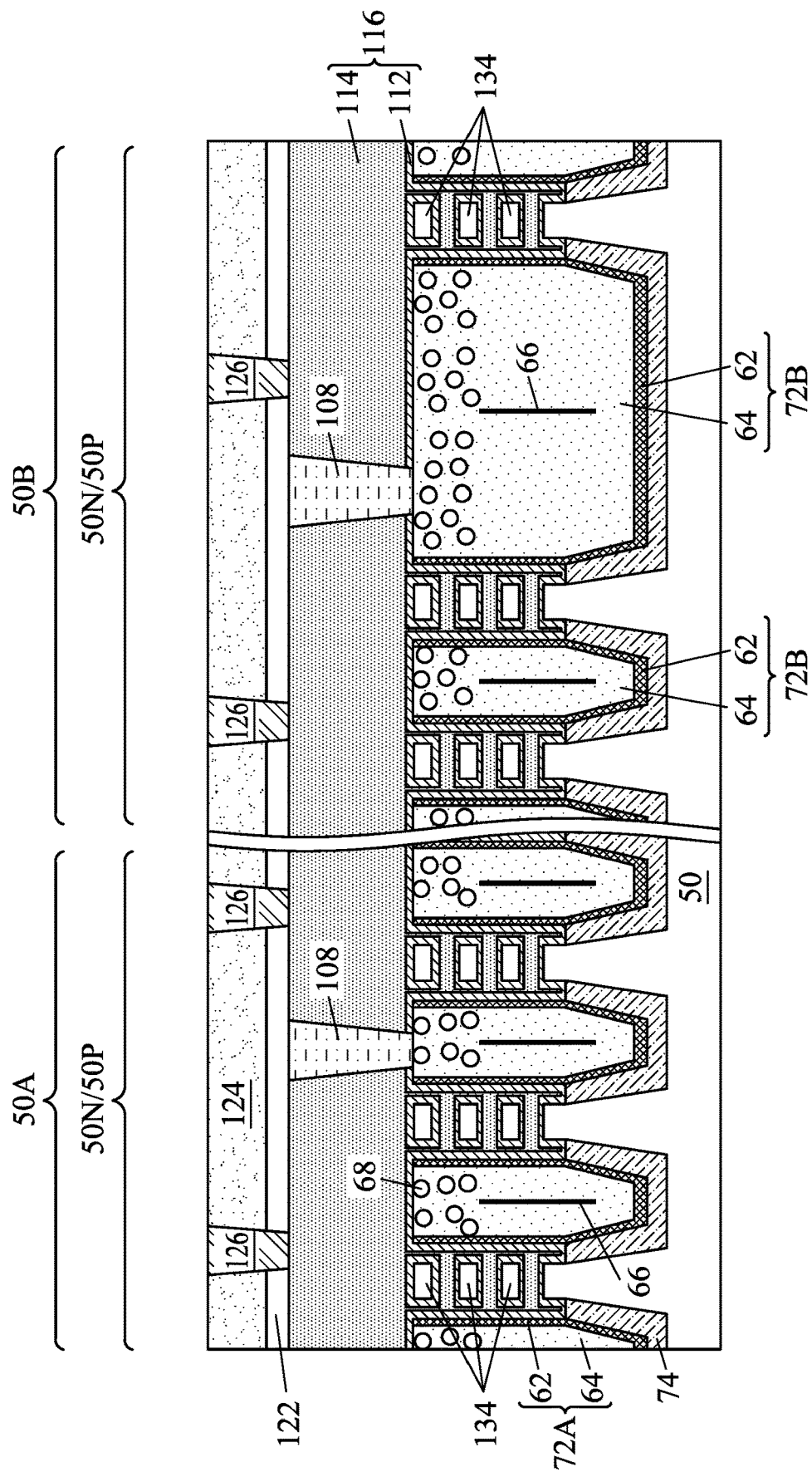
FIGS. 38A and 38B are cross-sectional views of an NSFET device in accordance with some embodiments.
Figure 38B:
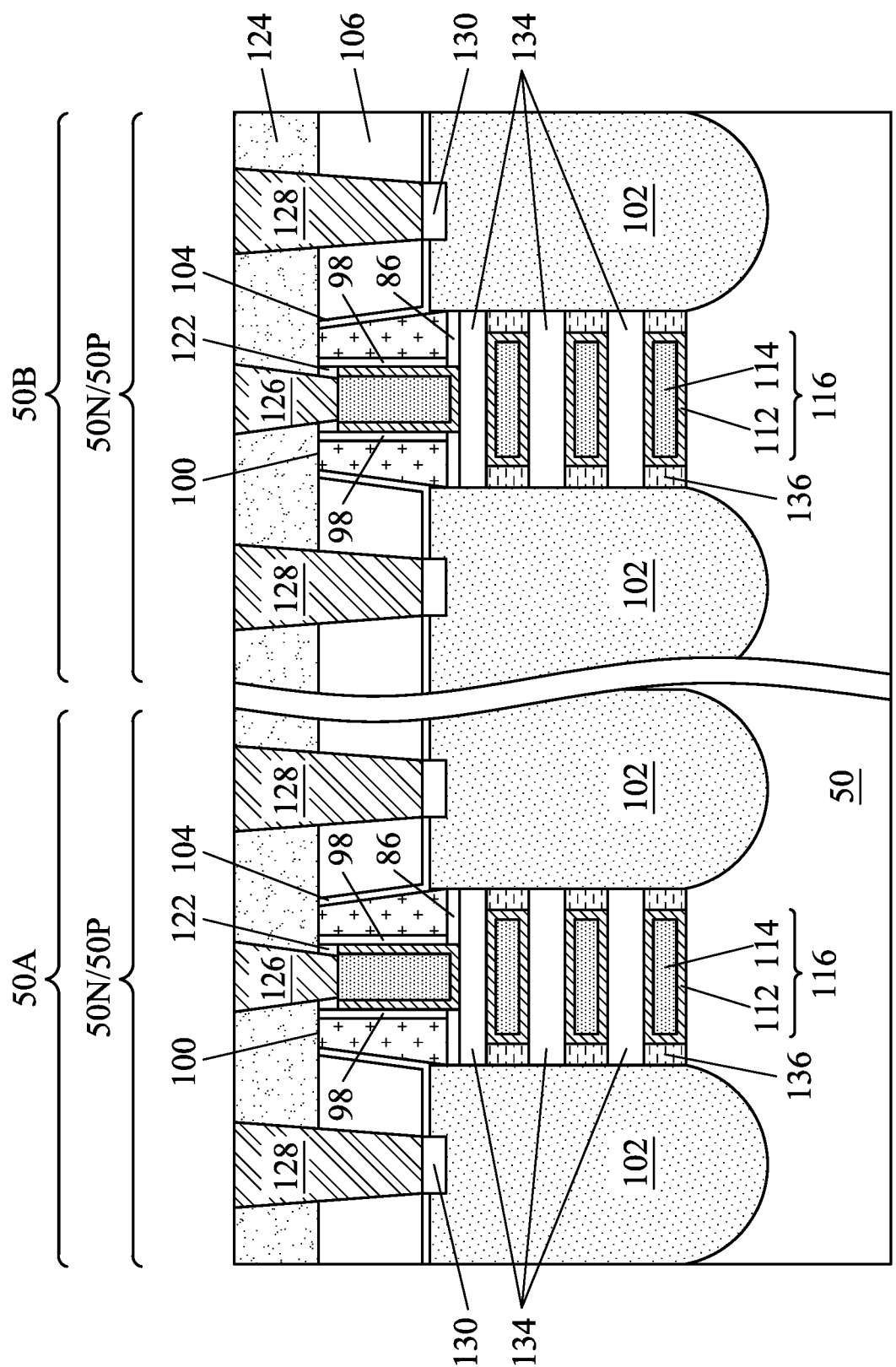

FIGS. 38A and 38B are cross-sectional views of an NSFET device in accordance with some embodiments. FIG. 38A illustrates a cross-sectional view along the reference cross-section A-A illustrated in FIG. 1. FIG. 38B illustrates a cross-sectional view along the reference cross-section B-B illustrated in FIG. 1. The structure illustrated in FIGS. 38A and 38B is similar to the structure illustrated in FIGS. 30A and 30B, with like features being labeled by like numerical references, and descriptions of the like features are not repeated herein. Instead of the fins 58A and 58B (FIGS. 30A and 30B), the structure illustrated in FIGS. 38A and 38B comprises nanostructures 134, such that portions of the replacement gate stacks 116 wrap around the nanostructures 134. In some embodiments, the portions of the replacement gate stacks 116 that wrap around the nanostructures 134 are isolated from adjacent epitaxial source/drain regions 102 by spacers 136. In some embodiments, the nanostructures 134 may be formed using similar materials as the substrate 50 and the description is not repeated herein. In some embodiments, the nanostructures 134 and the substrate 50 comprise a same material. In other embodiments, the nanostructures 134 and the substrate 50 comprise different materials. The spacers 136 may comprise a material such as silicon nitride or silicon oxynitride, although any suitable material, such as low-dielectric constant (low-k) materials having a k-value less than about 3.5, may be utilized.

Figure 39A:
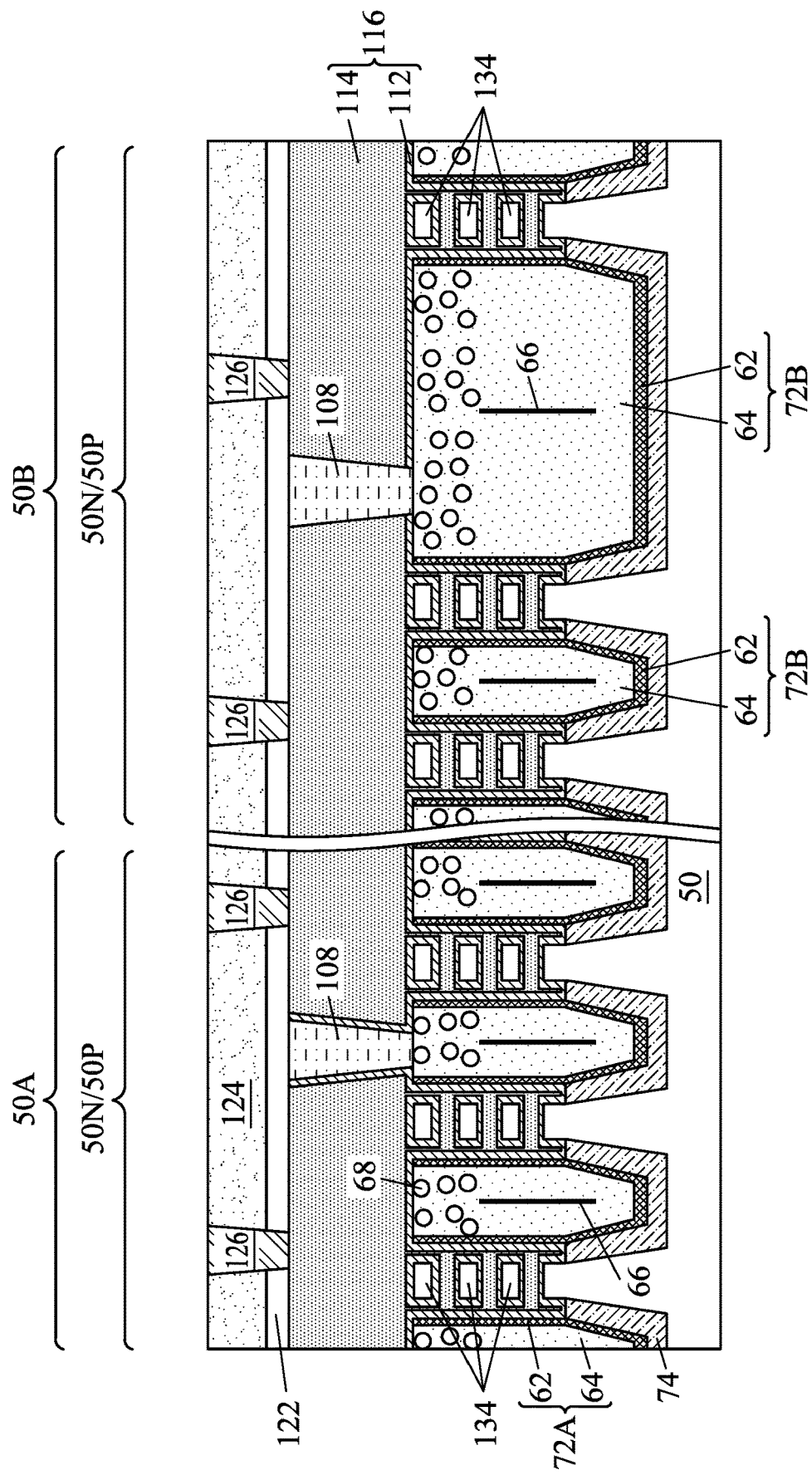
FIGS. 39A and 39B are cross-sectional views of an NSFET device in accordance with some embodiments.
Figure 39B:
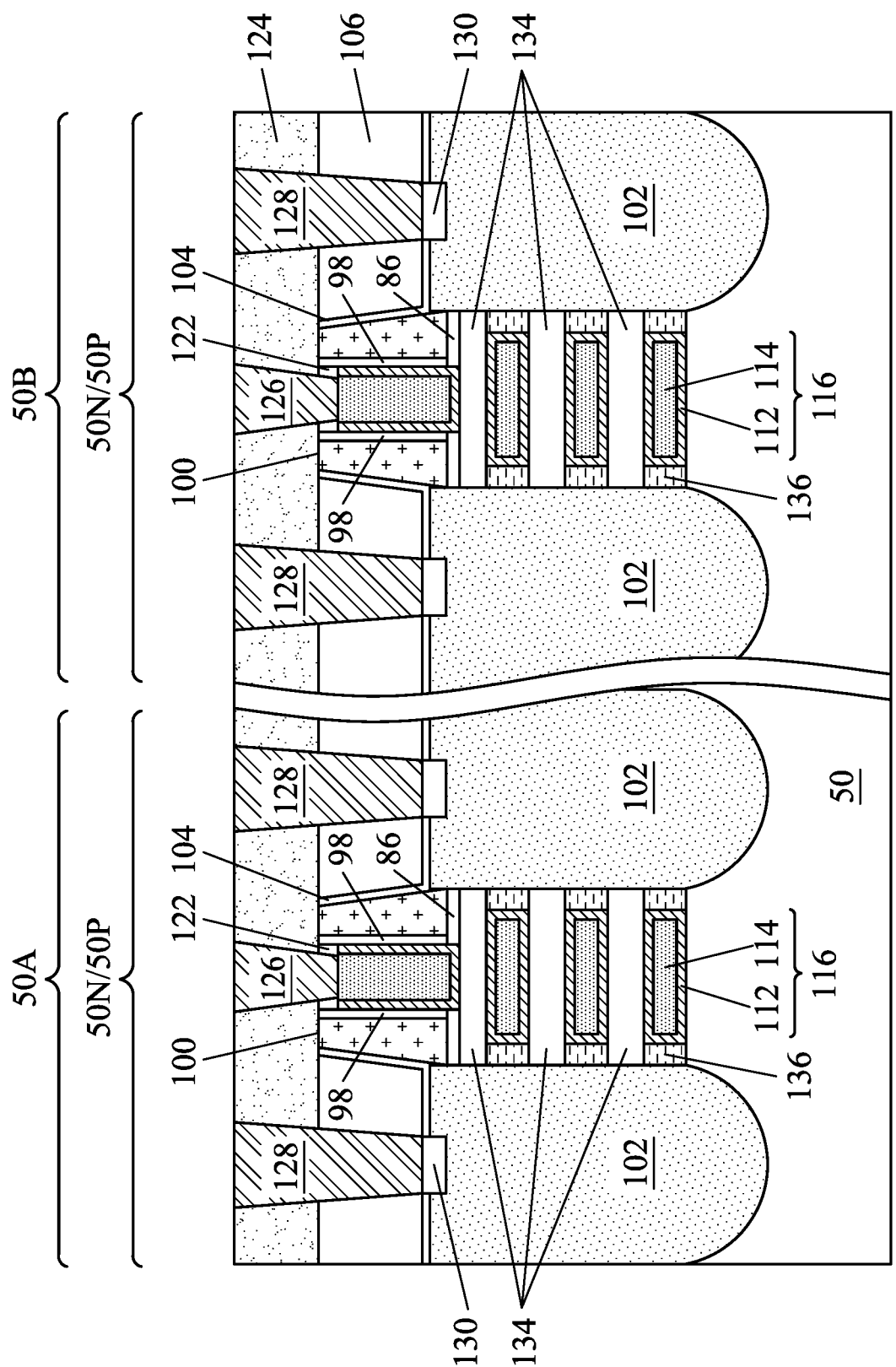

FIGS. 39A and 39B are cross-sectional views of an NSFET device in accordance with some embodiments. FIG. 39A illustrates a cross-sectional view along the reference cross-section A-A illustrated in FIG. 1. FIG. 39B illustrates a cross-sectional view along the reference cross-section B-B illustrated in FIG. 1. The structure illustrated in FIGS. 39A and 39B is similar to the structure illustrated in FIGS. 31A and 31B, with like features being labeled by like numerical references, and descriptions of the like features are not repeated herein. Instead of the fins 58A and 58B (FIGS. 31A and 31B), the structure illustrated in FIGS. 39A and 39B comprises nanostructures 134, such that portions of the replacement gate stacks 116 wrap around the nanostructures 134. In some embodiments, the portions of the replacement gate stacks 116 that wrap around the nanostructures 134 are isolated from adjacent epitaxial source/drain regions 102 by spacers 136. In some embodiments, the nanostructures 134 may be formed using similar materials as the substrate 50 and the description is not repeated herein. In some embodiments, the nanostructures 134 and the substrate 50 comprise a same material. In other embodiments, the nanostructures 134 and the substrate 50 comprise different materials. The spacers 136 may comprise a material such as silicon nitride or silicon oxynitride, although any suitable material, such as low-dielectric constant (low-k) materials having a k-value less than about 3.5, may be utilized.

Figure 40A:
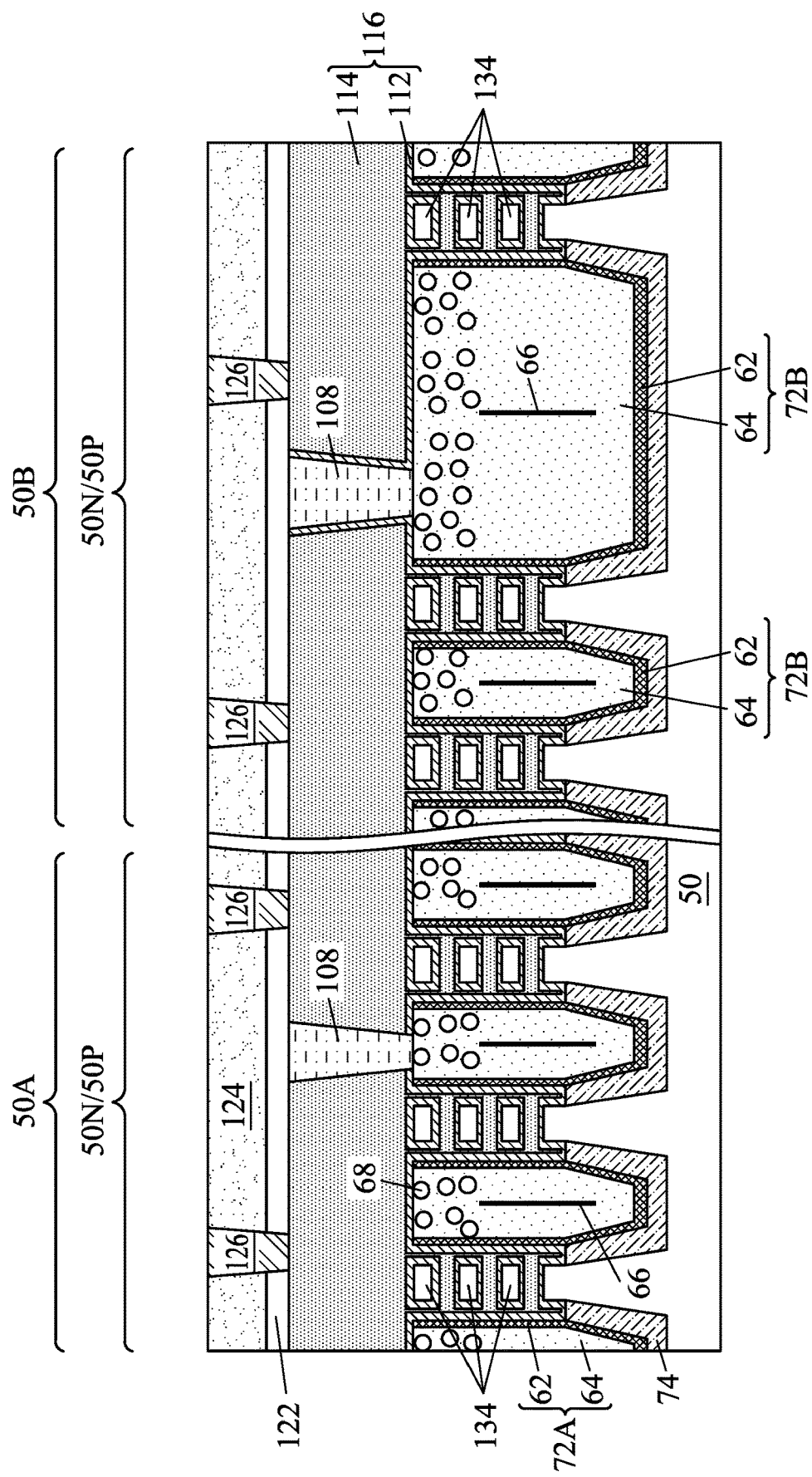
FIGS. 40A and 40B are cross-sectional views of an NSFET device in accordance with some embodiments.
Figure 40B:
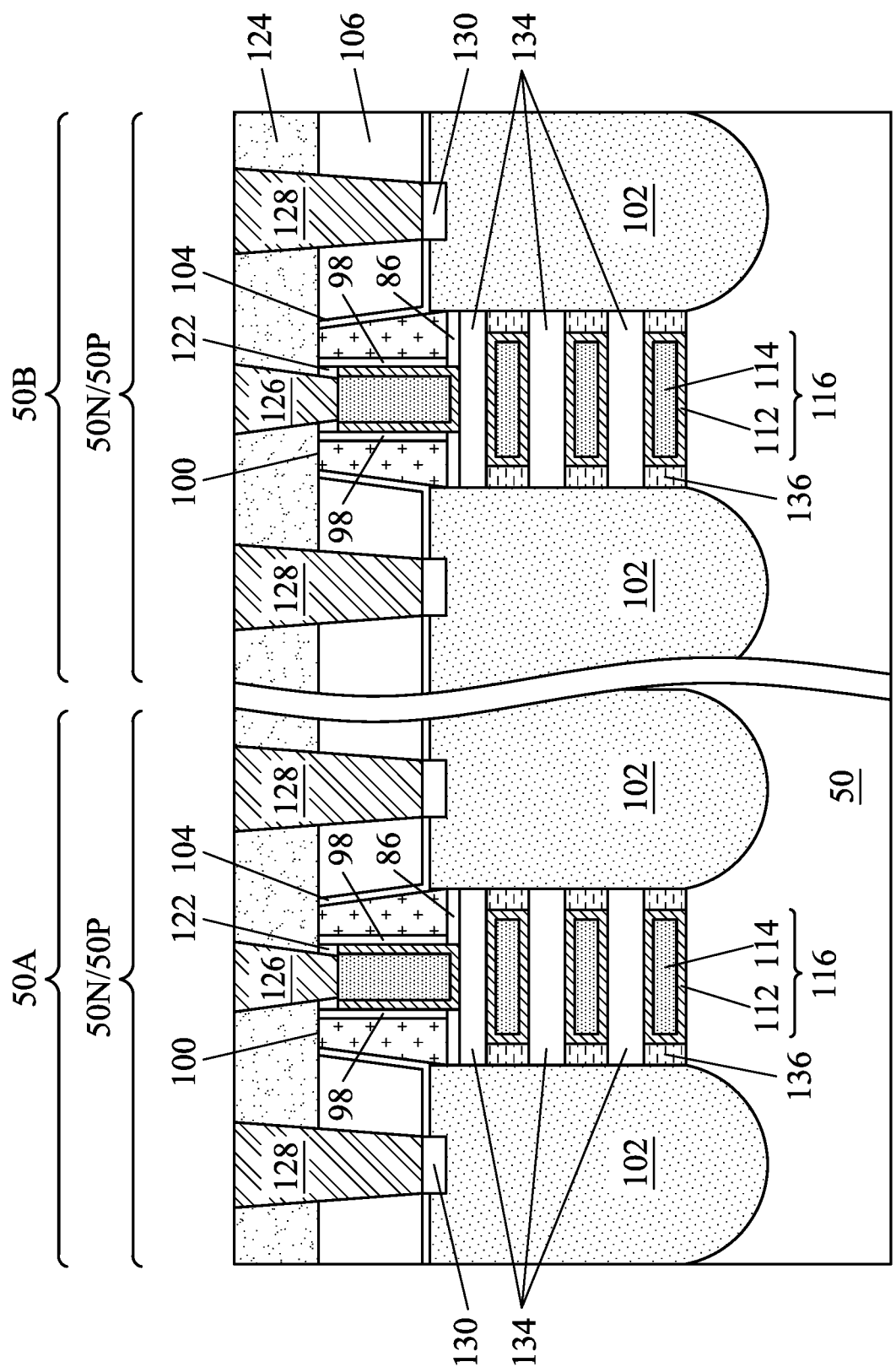

FIGS. 40A and 40B are cross-sectional views of an NSFET device in accordance with some embodiments. FIG. 40A illustrates a cross-sectional view along the reference cross-section A-A illustrated in FIG. 1. FIG. 40B illustrates a cross-sectional view along the reference cross-section B-B illustrated in FIG. 1. The structure illustrated in FIGS. 40A and 40B is similar to the structure illustrated in FIGS. 32A and 32B, with like features being labeled by like numerical references, and descriptions of the like features are not repeated herein. Instead of the fins 58A and 58B (FIGS. 32A and 32B), the structure illustrated in FIGS. 40A and 40B comprises nanostructures 134, such that portions of the replacement gate stacks 116 wrap around the nanostructures 134. In some embodiments, the portions of the replacement gate stacks 116 that wrap around the nanostructures 134 are isolated from adjacent epitaxial source/drain regions 102 by spacers 136. In some embodiments, the nanostructures 134 may be formed using similar materials as the substrate 50 and the description is not repeated herein. In some embodiments, the nanostructures 134 and the substrate 50 comprise a same material. In other embodiments, the nanostructures 134 and the substrate 50 comprise different materials. The spacers 136 may comprise a material such as silicon nitride or silicon oxynitride, although any suitable material, such as low-dielectric constant (low-k) materials having a k-value less than about 3.5, may be utilized.

Embodiments may achieve advantages. By using an implantation process as described above to form hybrid fins (such as hybrid fins 72A and 72B illustrated in FIG. 12) having the seam-free top regions, nucleation sites for forming large particles during a sacrificial gate (such as the dummy gate illustrated in FIGS. 16A-16C) formation are reduced or eliminated, and formation of resulting voids are reduced or eliminated.

In accordance with an embodiment, a device includes a substrate, a first isolation structure over the substrate, a first fin and a second fin over the substrate and extending through the first isolation structure, and a hybrid fin extending into the first isolation structure and interposed between the first fin and the second fin. A top surface of the first fin and a top surface of the second fin are above a top surface of the first isolation structure. A top surface of the hybrid fin is above the top surface of the first isolation structure. The hybrid fin includes an upper region, and a lower region under the upper region. The lower region includes a seam. A topmost portion of the seam is below the top surface of the first fin and the top surface of the second fin. In an embodiment, the upper region of the hybrid fin has a non-uniform nitrogen concentration and the lower region of the hybrid fin has a uniform nitrogen concentration. In an embodiment, a maximum nitrogen concentration within the upper region of the hybrid fin is greater than the uniform nitrogen concentration. In an embodiment, the upper region of the hybrid fin is a seam-free region. In an embodiment, the device further includes a gate stack extending along sidewalls and the top surface of the first fin, sidewalls and the top surface of the second fin, and sidewalls and the top surface of the hybrid fin, where the gate stack includes: a gate dielectric layer extending along the sidewalls and the top surface of the first fin, the sidewalls and the top surface of the second fin, and the sidewalls and the top surface of the hybrid fin; and a gate electrode layer over the gate dielectric layer. In an embodiment, the device further includes a second isolation structure extending through the gate stack and physically contacting the hybrid fin, where the gate dielectric layer extends along and physical contacts a sidewall of the second isolation structure. In an embodiment, the device further includes a second isolation structure extending through the gate stack and physically contacting the hybrid fin, where the gate electrode layer extends along and physical contacts a sidewall of the second isolation structure.

In accordance with another embodiment, a device includes a first isolation structure over a substrate, a first fin over the substrate and extending through the first isolation structure, a first epitaxial source/drain region extending into the first fin, and a hybrid fin extending into the first isolation structure adjacent the first fin and the first epitaxial source/drain region. A top surface of the first fin is above a top surface of the first isolation structure. A top surface of the hybrid fin is above the top surface of the first isolation structure. The hybrid fin includes an upper seam-free region, and a lower region under the upper seam-free region. The upper seam-free region has a non-uniform concentration of a first chemical element. A bottom surface of the upper seam-free region is below the top surface of the first fin. The lower region includes a seam. The lower region has a uniform concentration of the first chemical element. In an embodiment, the first chemical element is nitrogen, argon, carbon, or silicon. In an embodiment, the non-uniform concentration of the first chemical element has a Gaussian-like profile. In an embodiment, the top surface of the hybrid fin is level with the top surface of the first fin. In an embodiment, a topmost portion of the first epitaxial source/drain region is above a topmost portion of the seam. In an embodiment, the hybrid fin includes a first layer, the first layer having a first carbon concentration; and a second layer over the first layer, the second layer having a second carbon concentration greater than the first carbon concentration. In an embodiment, a bottom surface of the hybrid fin is above a bottom surface of the first fin.

In accordance with yet another embodiment, a method includes forming a first fin and a second fin extending from an upper surface of a substrate, and forming an isolation region and a hybrid fin over the substrate between the first fin and the second fin. Forming the isolation region and the hybrid fin includes blanket depositing a first insulation layer over the first fin, the second fin, and the substrate, blanket depositing a second insulation layer over the first insulation layer, and blanket depositing a third insulation layer over the second insulation layer. The first insulation layer includes a first insulation material. The second insulation layer includes a second insulation material different from the first insulation material. The third insulation layer overfills a trench between the first fin and the second fin. The third insulation layer includes a seam in the trench. The seam extending above a top surface of the first fin and a top surface of the second fin. The third insulation layer includes a third insulation material different from the first insulation material. Forming the isolation region and the hybrid fin further includes performing an implantation process to implant first implants into the third insulation layer to form an implanted region in the third insulation layer, removing portions of the first insulation layer, the second insulation layer, and third insulation layer above the top surface of the first fin and the top surface of the second fin to expose the top surface of the first fin and the top surface of the second fin, and recessing the first insulation layer below the top surface of the first fin and the top surface of the second fin. The implanted region extends below the top surface of the first fin and the top surface of the second fin. The implantation process removes a portion of the seam within the implanted region. Remaining portions of the second insulation layer and the third insulation layer form the hybrid fin. A remaining portion of the first insulation layer forms the isolation region. In an embodiment, the method further includes, before performing the implantation process, etching back the third insulation layer. In an embodiment, the first implants are nitrogen atoms, argon atoms, carbon atoms, silicon atoms, or a combination thereof. In an embodiment, the method further includes, before removing the portions of the first insulation layer, the second insulation layer, and the third insulation layer above the top surface of the first fin and the top surface of the second fin, forming a fourth insulation layer over the third insulation layer. In an embodiment, the first insulation material is an oxide material. In an embodiment, the second insulation material is silicon carbonitride having a first carbon concentration and the second insulation material is silicon carbonitride having a second carbon concentration greater than the first carbon concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin and a second fin extending from an upper surface of a substrate; and
    forming an isolation region and a hybrid fin over the substrate between the first fin and the second fin, wherein forming the isolation region and the hybrid fin comprises:
        blanket depositing a first insulation layer over the first fin, the second fin, and the substrate, wherein the first insulation layer comprises a first insulation material;
        blanket depositing a second insulation layer over the first insulation layer, wherein the second insulation layer comprises a second insulation material different from the first insulation material;
        blanket depositing a third insulation layer over the second insulation layer, the third insulation layer overfilling a trench between the first fin and the second fin, the third insulation layer comprising a seam in the trench, the seam extending above a top surface of the first fin and a top surface of the second fin, wherein the third insulation layer comprises a third insulation material different from the first insulation material;
        performing an implantation process to implant first implants into the third insulation layer to form an implanted region in the third insulation layer, the implanted region extending below the top surface of the first fin and the top surface of the second fin, the implantation process removing a portion of the seam within the implanted region;
        removing portions of the first insulation layer, the second insulation layer, and third insulation layer above the top surface of the first fin and the top surface of the second fin to expose the top surface of the first fin and the top surface of the second fin, remaining portions of the second insulation layer and the third insulation layer forming the hybrid fin; and
        recessing the first insulation layer below the top surface of the first fin and the top surface of the second fin, a remaining portion of the first insulation layer forming the isolation region.

2. The method of claim 1, further comprising, before performing the implantation process, etching back the third insulation layer.

3. The method of claim 1, wherein the first implants are nitrogen atoms, argon atoms, carbon atoms, silicon atoms, or a combination thereof.

4. The method of claim 1, further comprising, before removing the portions of the first insulation layer, the second insulation layer, and the third insulation layer above the top surface of the first fin and the top surface of the second fin, forming a fourth insulation layer over the third insulation layer.

5. The method of claim 1, wherein the first insulation material is an oxide material.

6. The method of claim 1, wherein the second insulation material is silicon carbonitride having a first carbon concentration and the second insulation material is silicon carbonitride having a second carbon concentration greater than the first carbon concentration.

7. A method comprising:
    forming a first fin and a second fin extending from a substrate, the first fin and the second fin being separated by a trench; and
    forming an isolation structure in the trench between the first fin and the second fin, the isolation structure comprising an isolation region and a dielectric fin over the isolation region, wherein forming the isolation region and the dielectric fin comprises:
        depositing a first insulation layer over along sidewalls of the first fin and the second fin, wherein the first insulation layer comprises a first insulation material;
        depositing a second insulation layer over the first insulation layer, the second insulation layer comprising a seam in the trench;
        performing an implantation process to implant first implants into the second insulation layer to form an implanted region in the second insulation layer, the implantation process removing a portion of the seam within the implanted region;
        removing portions of the second insulation layer, remaining portions of the second insulation layer forming the dielectric fin, wherein removing portions of the second insulating layer does not expose remaining portions of the seam; and
        recessing the first insulation layer below a top surface of the first fin and a top surface of the second fin, a remaining portion of the first insulation layer forming the isolation region, remaining portions of the second insulation layer forming the dielectric fin.

8. The method of claim 7, wherein forming the isolation structure further comprises:
    depositing a third insulation layer over the first insulation layer, wherein the second insulation layer is deposited over the third insulation layer.

9. The method of claim 8, wherein recessing the first insulation layer recesses the first insulation layer below a top surface of the second insulation layer, wherein the second insulation layer forms part of the dielectric fin.

10. The method of claim 7, wherein the first implants comprise nitrogen.

11. The method of claim 10, wherein a peak concentration of nitrogen is below an upper surface of the dielectric fin after removing portions of the second insulation layer.

12. The method of claim 7, wherein the seam extends above the top surface of the first fin prior to performing the implantation process, wherein the second insulation layer is seam-free above the top surface of the first fin after performing the implantation process.

13. The method of claim 7, wherein after recessing the first insulation layer, remaining portions of the second insulation layer extend below the top surface of the first insulation layer.

14. A method comprising:
forming a first fin and a second fin protruding from a substrate;
forming a first isolation layer on a sidewall of the first fin, a sidewall of the second fin, and on the substrate between the first fin and the second fin, the first fin and the second fin extending above an upper surface of the first isolation layer;
forming a hybrid fin over the first isolation layer, a top surface of the hybrid fin being above the top surface of the first isolation layer, wherein the hybrid fin comprises:
an upper seam-free region; and
a lower region under the upper seam-free region, the lower region comprising a seam, wherein the upper seam-free region has a higher concentration of a first chemical element, wherein an upper extent of the seam is below an upper surface of the first fin.

15. The method of claim 14, wherein the first chemical element is nitrogen, argon, carbon, or silicon.

16. The method of claim 14, wherein the upper seam-free region has a non-uniform concentration of the first chemical element.

17. The method of claim 14, wherein the top surface of the hybrid fin is level with the top surface of the first fin.

18. The method of claim 14, further comprising:
forming a first source/drain region on the first fin; and
forming a second source/drain region on the second fin, wherein the hybrid fin extends between the first source/drain region and the second source/drain region.

19. The method of claim 14, wherein the lower region has a uniform concentration of the first chemical element.

20. The method of claim 14, wherein a bottom surface of the hybrid fin is above a bottom surface of the first fin.

* * * * *